United States Patent
Kawamura

(10) Patent No.: US 8,947,180 B2
(45) Date of Patent: Feb. 3, 2015

(54) SIGNAL TRANSMISSION DEVICE, ELECTRONIC DEVICE, AND SIGNAL TRANSMISSION METHOD

(75) Inventor: Hirofumi Kawamura, Chiba (JP)

(73) Assignee: Sony Corporation, Tokyo (JP)

( * ) Notice: Subject to any disclaimer, the term of this patent is extended or adjusted under 35 U.S.C. 154(b) by 370 days.

(21) Appl. No.: 13/339,654

(22) Filed: Dec. 29, 2011

(65) Prior Publication Data

US 2012/0182094 A1 Jul. 19, 2012

(30) Foreign Application Priority Data

Jan. 14, 2011 (JP) ................................. 2011-005632

(51) Int. Cl.
*H01P 3/16* (2006.01)
*H01Q 9/04* (2006.01)
*H01Q 1/24* (2006.01)

(52) U.S. Cl.
CPC ............... *H01Q 9/0407* (2013.01); *H01Q 1/24* (2013.01); *H01L 2924/0002* (2013.01)
USPC ........................................................ 333/239

(58) Field of Classification Search
USPC ........................................................ 333/239
See application file for complete search history.

(56) References Cited

U.S. PATENT DOCUMENTS

| 2011/0158344 A1* | 6/2011 | Kawamura et al. ............ 375/295 |
| 2011/0165839 A1* | 7/2011 | Kawamura et al. ............ 455/41.1 |
| 2011/0309893 A1* | 12/2011 | Kawamura et al. ............ 333/104 |

FOREIGN PATENT DOCUMENTS

| JP | 03-232207 A | 10/1991 |
| JP | 2007-201576 A | 8/2007 |
| JP | 2011-022640 A | 2/2011 |

OTHER PUBLICATIONS

Translation of JP2010078430. Translation date: Apr. 30, 2014.*
Office Action issued Jul. 1, 2014 in Japanese Patent Application No. 2011-005632.

* cited by examiner

*Primary Examiner* — Stephen Jones
*Assistant Examiner* — Scott S Outten
(74) *Attorney, Agent, or Firm* — Oblon, Spivak, McClelland, Maier & Neustadt, L.L.P.

(57) ABSTRACT

A signal transmission device includes: a transmitting device that transmits a transmission subject signal through a first waveguide as a wireless signal; and a receiving device that receives the wireless signal of the transmission subject signal transmitted from the transmitting device through a second waveguide, wherein the wireless signal is transmitted between the transmitting device and the receiving device in a state where the first waveguide faces the second waveguide.

14 Claims, 15 Drawing Sheets

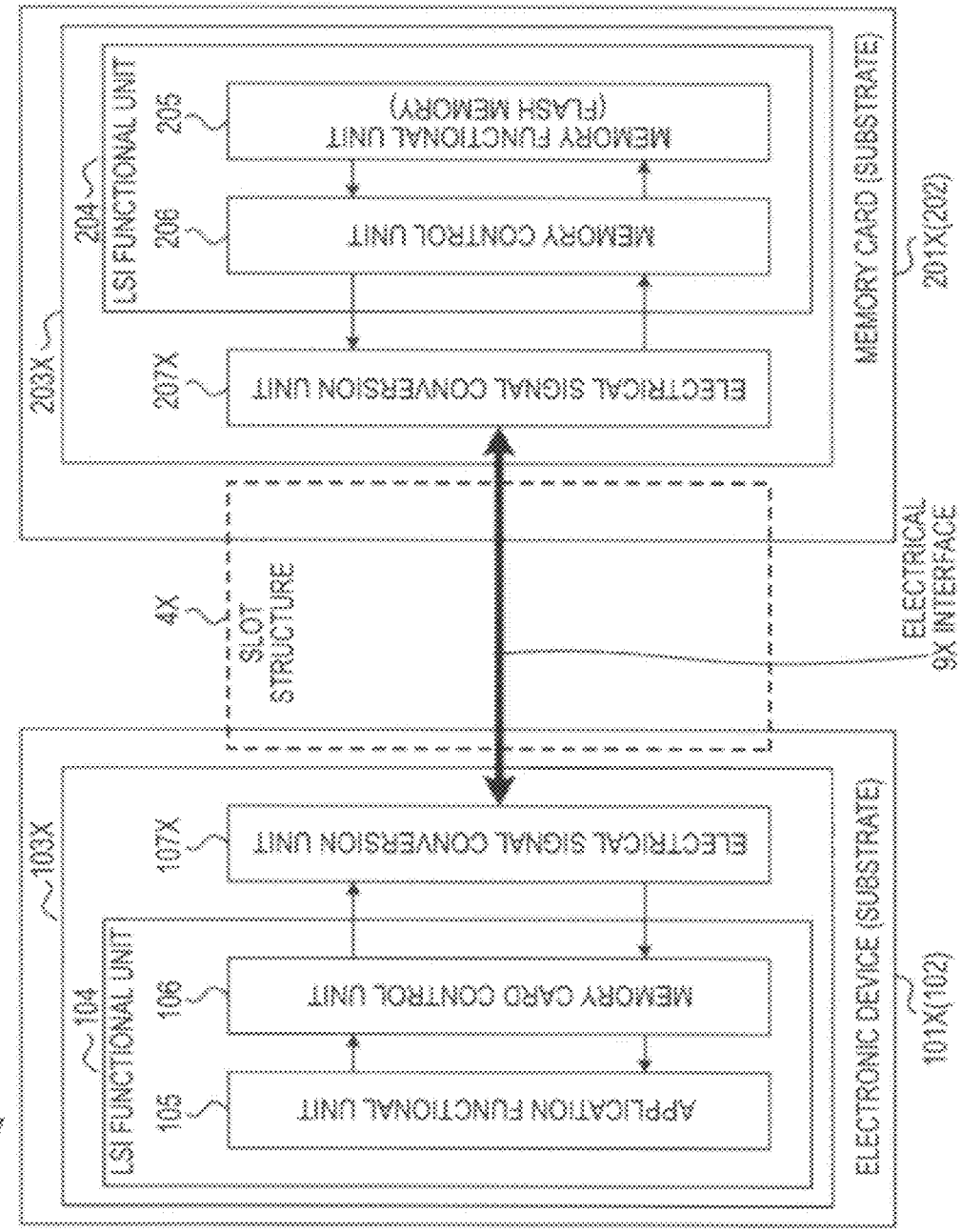

<ELECTRONIC DEVICE (FIRST COMPARATIVE EXAMPLE)>
FIG.4A MEMORY CARD
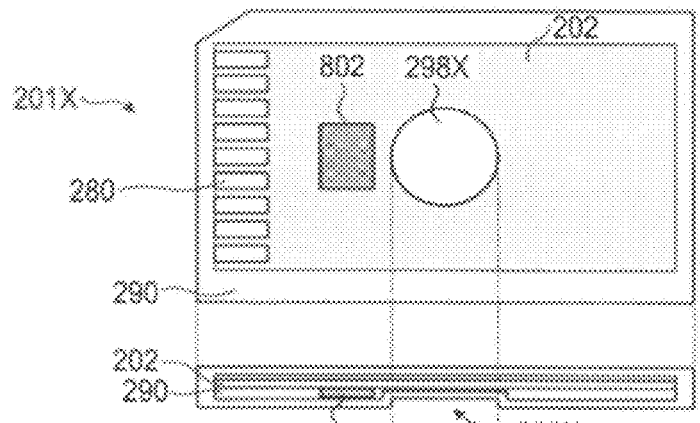
FIG.4B ELECTRONIC DEVICE (SLOT STRUCTURE)
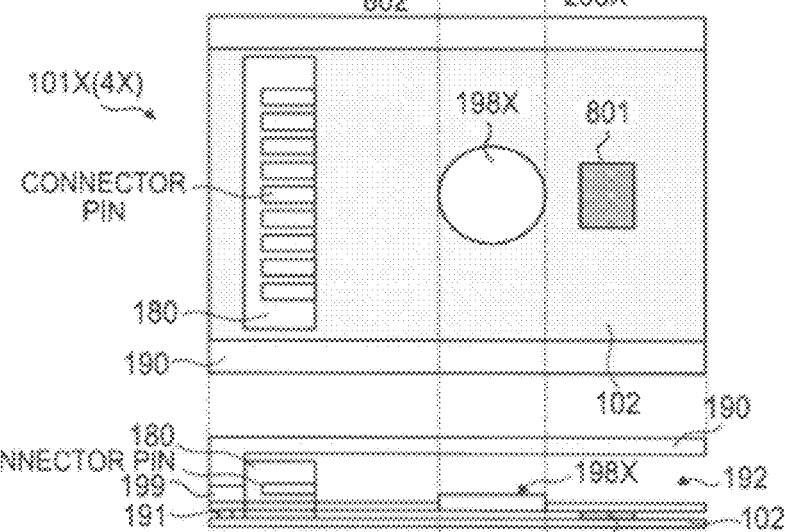
FIG.4C ATTACHMENT STATE
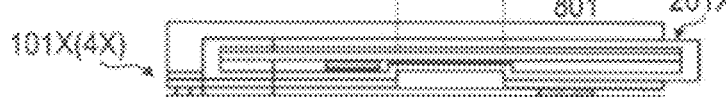

<ELECTRONIC DEVICE (SECOND COMPARATIVE EXAMPLE)>
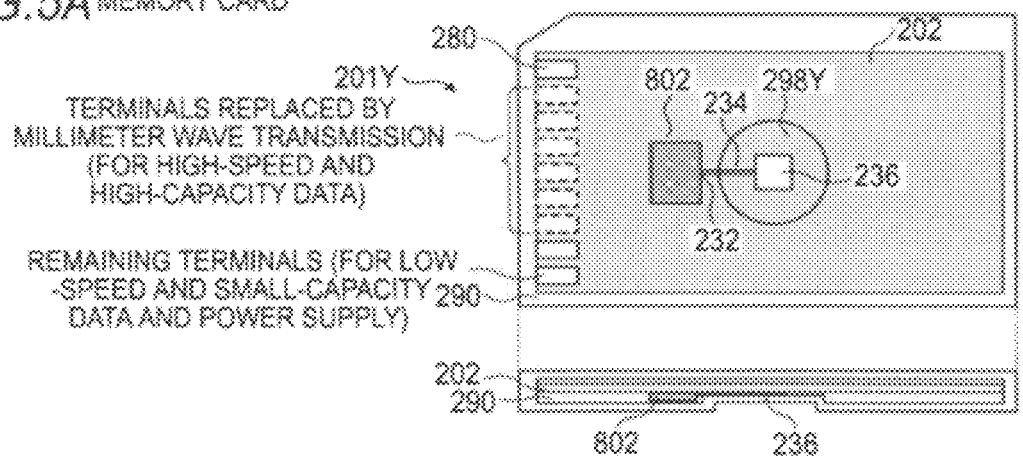
FIG. 5A MEMORY CARD
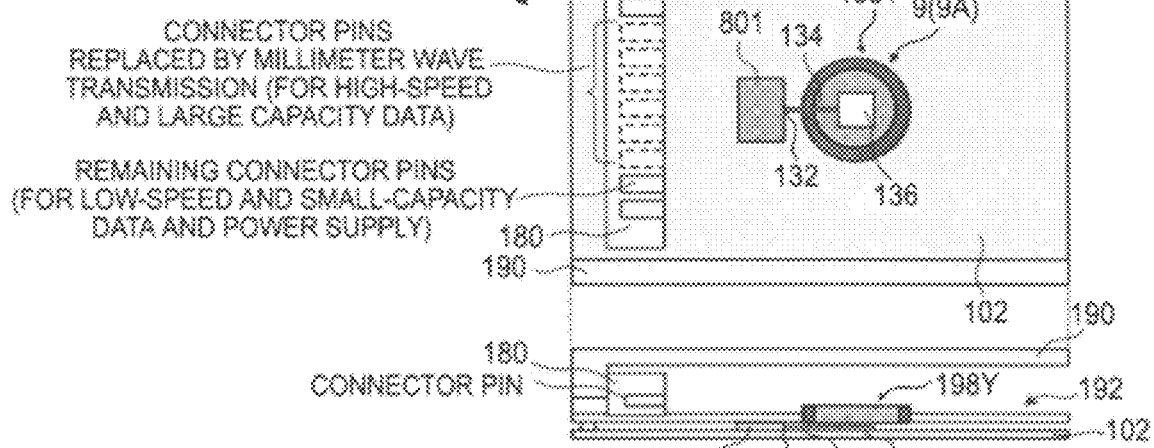
FIG. 5B ELECTRONIC DEVICE (SLOT STRUCTURE)
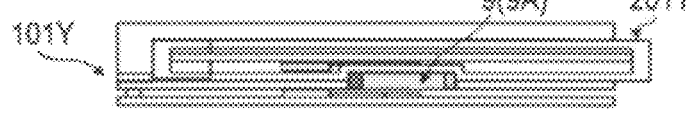
FIG. 5C ATTACHMENT STATE

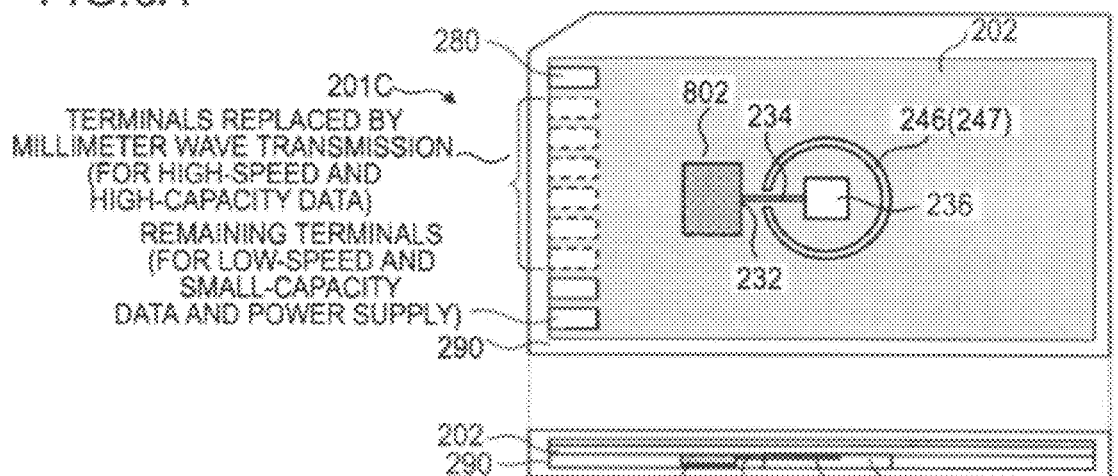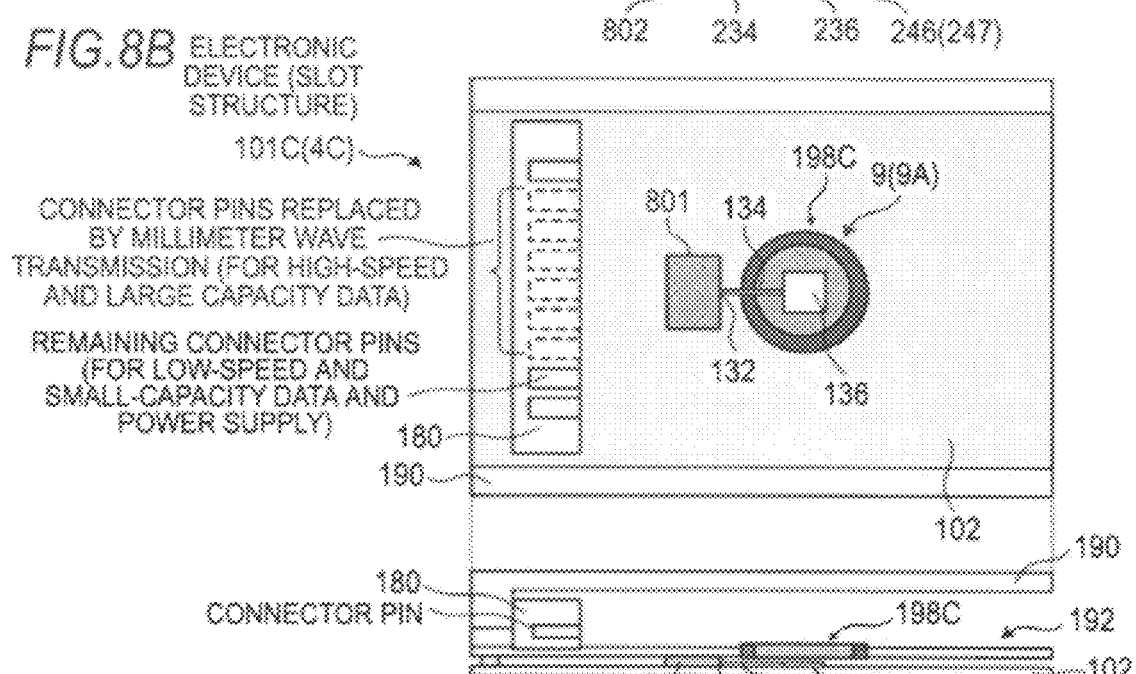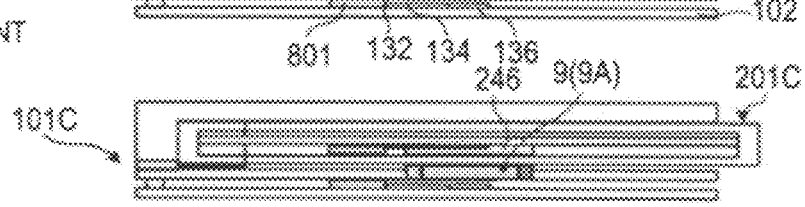

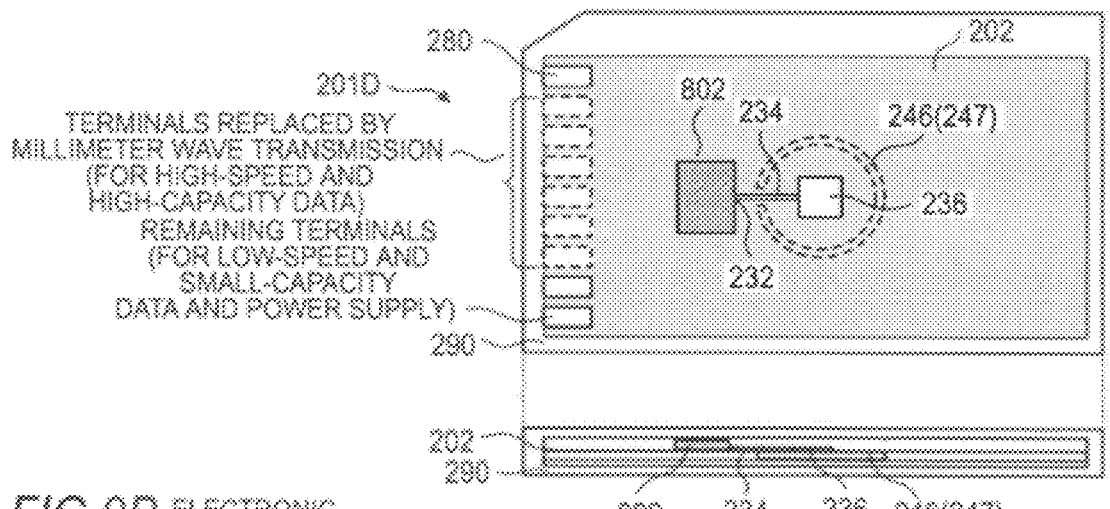
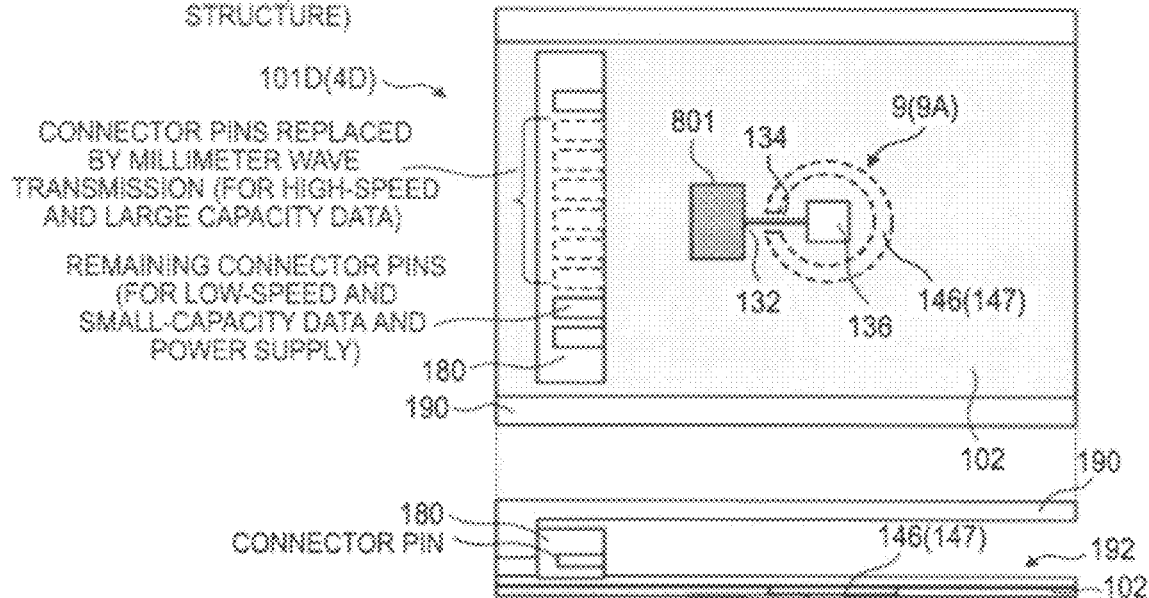
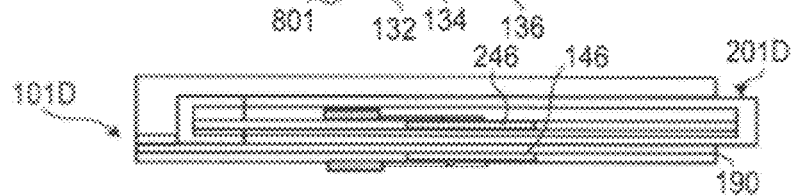

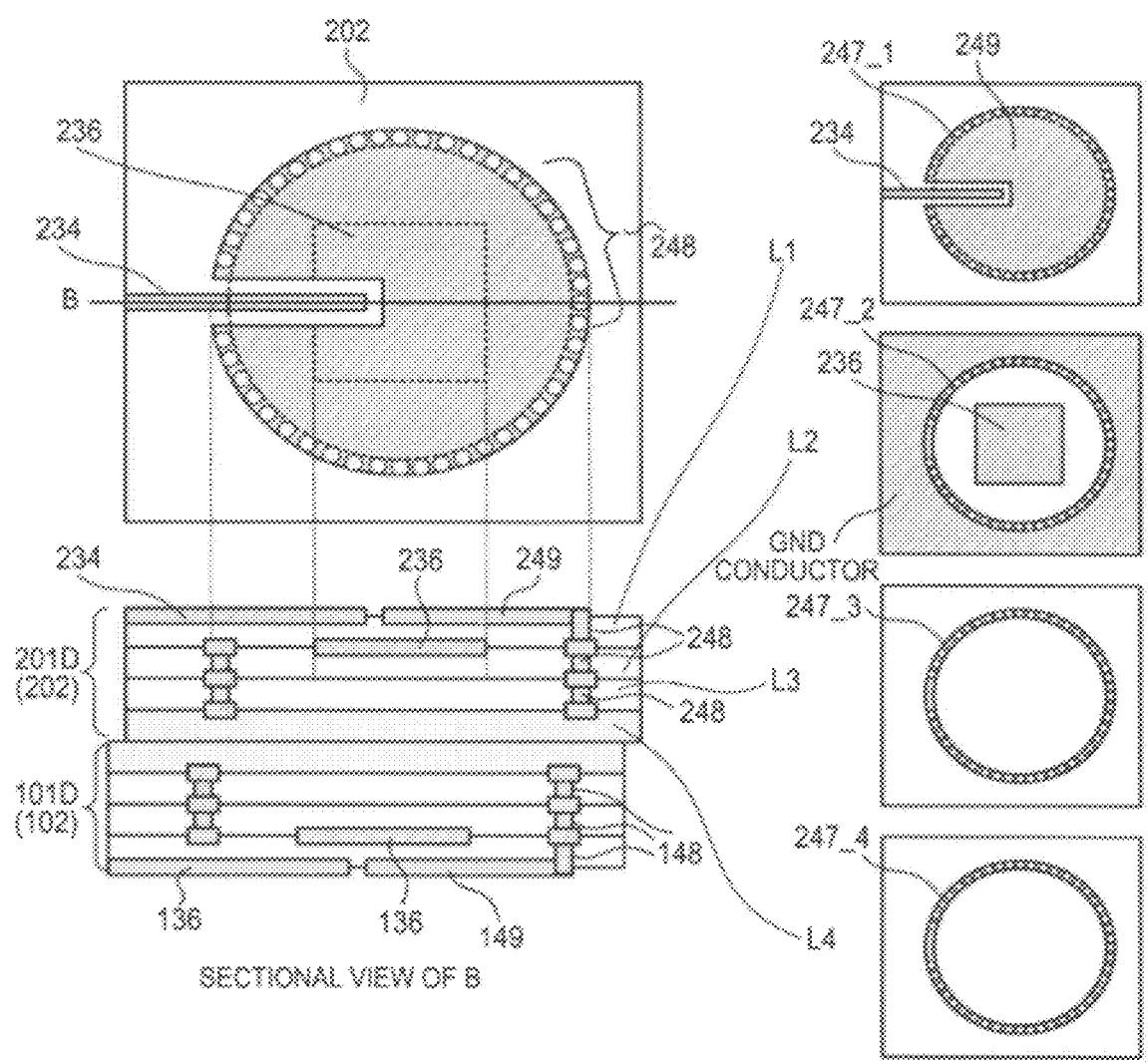

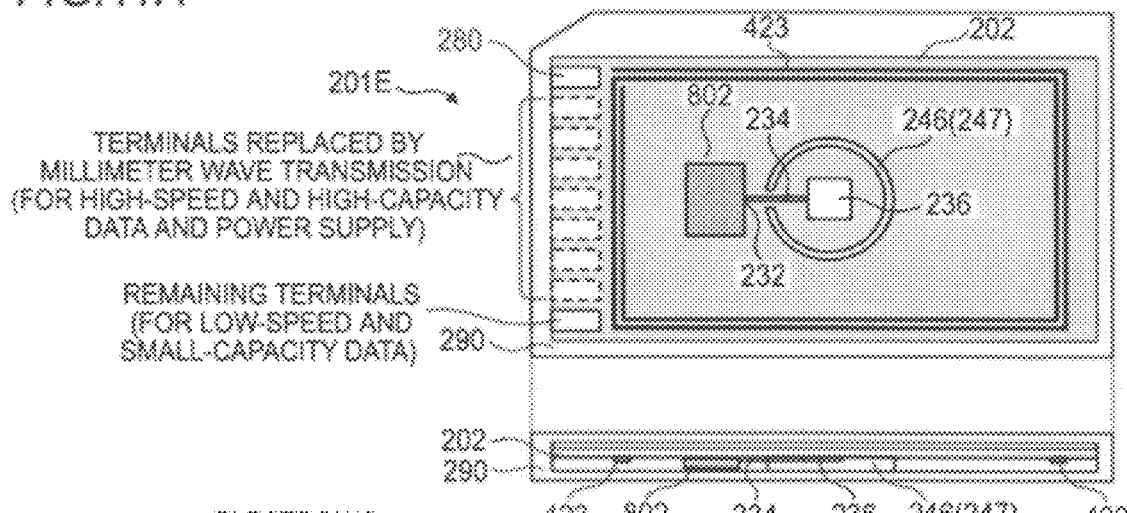
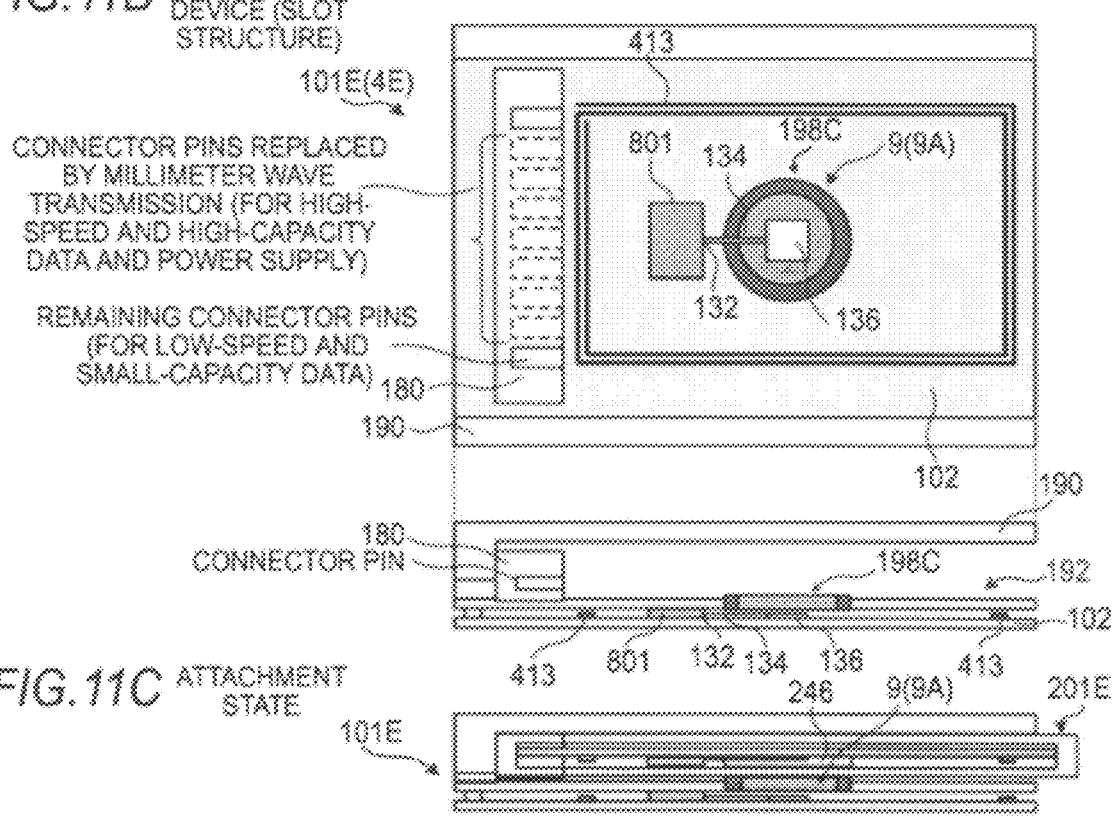
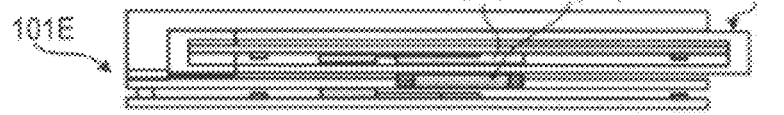

<ELECTRONIC DEVICE (FOURTH EXEMPLARY EMBODIMENT)>

MEMORY CARD 201H

ELECTRONIC DEVICE 101H

MOUNTED STATE

<ELECTRONIC DEVICE (FIFTH EXEMPLARY EMBODIMENT)>

IMAGE REPRODUCTION DEVICE 201K

IMAGE ACQUISITION DEVICE 101K

MOUNTED STATE

<RADIO-WAVE TRANSMISSION STRUCTURE: FIRST MODIFIED EXAMPLE>

SIGNAL TRANSMISSION DEVICE, ELECTRONIC DEVICE, AND SIGNAL TRANSMISSION METHOD

FIELD

The present disclosure relates to a signal transmission device, an electronic device, and a signal transmission method. More specifically, the present disclosure relates to signal transmission between electronic devices when one electronic device is attached to the other electronic device (on a main side, for example).

BACKGROUND

For example, signal transmission may be made in a state where one electronic device is attached to another electronic device. For example, a card-type information processing device typified by a so-called IC card or memory card including a central processing unit (CPU), a nonvolatile storage device (for example a flash memory) and the like can be attached to (removed from) an electronic device on a main side (see JP-A-2001-195553 and JP-A-2007-299338). The card-type information processing device as an example of one (first) electronic device will hereinafter be referred to also as a "card-type device." The other (second) electronic device on the main side will hereinafter be also referred to simply as an electronic device. Mounting the card-type device in the electronic device on the main side provides advantages of taking out data, increasing storage capacity, and realizing expanded functionality, for example.

In the related art, when an electric connection is established between the electronic device and the card-type device, the electric connection is achieved by attaching the card-type device to the electronic device via a connector (electric connecting means). For example, in order to establish an electric interface connection to a memory card, a terminal portion is provided to the memory card, and the electronic device is provided with a slot structure (an example of an attachment structure). The memory card is inserted into the slot structure of the electronic device to bring the terminal portions into contact with each other. This is an idea of providing a signal interface by electric wirings. In general, there are standards for housing shapes and the signal interface including the terminal portion and the slot structure, and an electrical and mechanical interface between the terminal portion and the slot structure is defined according to the standards.

For example, JP-A-2001-195553 (paragraph 19, FIGS. 2 to 5) shows that a card interface 21f is provided inside a controller LSI 21, and that the card interface 21f is connected to an electronic device via a plurality of signal pins (corresponding to the terminal portion). In addition, JP-A-2007-299338 (paragraph 42, FIGS. 1, 3, 5 and the like) shows that an external connection terminal 24 (corresponding to the terminal portion) connected through a conductive via to a wiring pattern for connection to an external device (corresponding to the electronic device) at a determined position of a standardized housing 19 is provided.

SUMMARY

However, signal transmission between the electronic device and the card-type device by electric contact (that is, electric wirings) via the terminal portion of the slot structure has the following problems.

1) The transmission speed and transmission capacity of signal transmission by electric wirings have reached its limit. For example, LVDS (Low Voltage Differential Signaling) is known as a method for achieving high-speed signal transmission by electric wirings, and applying the mechanism of LVDS is considered. However, recent further increases in capacity and speed of transmission data involve problems such as an increase in power consumption, an increase in effect of signal distortion due to reflection and the like, and an increase in spurious radiation. For example, LVDS is reaching a limit in a case of high-speed (real-time) transmission of video signals (including imaging signals) and signals of computer images and the like within a device.

2) In order to deal with the problem of increasing the speed of transmission data, transmission speed per signal line may be decreased by increasing the number of pieces of wirings and thus achieving signal parallelization. However, this measure leads to an increase of input and output terminals, which results in drawbacks such as complication of a printed substrate and cable wirings, and an increase in semiconductor chip size.

3) When electric wirings are used, the wirings become an antenna, and cause a problem of electromagnetic field interference. In order to take measures against the problem, the configuration of the electronic device and the card-type device becomes more complicated. When wirings are routed for high-speed and high-capacity data, electromagnetic field interference becomes a noticeable problem. In addition, when terminals are made bare in the card-type device, there is a problem of electrostatic breakdown.

As above, the transmission of signals of the electronic device and the card-type device by electric wirings has difficulties yet to be solved.

While problems in signal transmission using electric wirings between the card-type device and the electronic device on the main side have been described above, these problems are not limited to relation to the card-type device. The same is true for cases where signal transmission is made using electric wirings between two electronic devices when one electronic device is attached to the other electronic device.

Therefore, it is desirable to provide a technique capable of transmitting signals such as video signals or computer images which require high speed and high capacity without using electric wirings while solving at least one of the above-described problems 1) to 3) when signal transmission is performed in a state where one electronic device is attached to the other electronic device.

A signal transmission device according to a first embodiment of the present disclosure includes a transmitting device that transmits a transmission subject signal through a first waveguide as a wireless signal; and a receiving device that receives the wireless signal of the transmission subject signal transmitted from the transmitting device through a second waveguide, wherein wireless signals are transmitted between the transmitting device and the receiving device in a state where the first waveguide faces the second waveguide. The respective signal transmission devices disclosed in the dependent claims of the signal transmission device according to the first embodiment of the present disclosure define new advantageous specific examples of the signal transmission device according to the first embodiment of the present disclosure.

An electronic device according to a second embodiment of the present disclosure includes a first electronic device having a first waveguide; and a second electronic device having a second waveguide and configured to be attached to the first electronic device, whereby an entire electronic device is formed. In the electronic device, wireless signals are transmitted between the first and second electronic devices in a state where the first waveguide faces the second waveguide.

An electronic device according to a third embodiment of the present disclosure includes a first waveguide. The electronic device is attached to another electronic device having a second waveguide, whereby wireless signals are transmitted in a state where the first waveguide faces the second waveguide. The respective electronic devices disclosed in the dependent claims of the electronic devices according to the second and third embodiments of the present disclosure define new advantageous specific examples of the electronic devices according to the second and third embodiments of the present disclosure.

A signal transmission method according to a fourth embodiment of the present disclosure is a signal transmission method in which a first electronic device and a second electronic device are attached to each other, and signal transmission is performed between both electronic devices by wireless, the method including providing a first waveguide in the first electronic device; and providing a second waveguide in the second electronic device. Wireless signals are transmitted between the first and second electronic devices in a state where the first waveguide faces the second waveguide Specifically, when the electronic devices are attached at predetermined positions, a coupling unit is disposed in which the end surfaces in the longitudinal direction of the two waveguides face each other to couple wireless signals with each other. Between the first and second electronic devices, transmission subject signals are converted into radio waves, and thereafter, radio waves are transmitted through the coupling unit.

That is, by interfacing the end surfaces of the waveguides with radio waves, transmission coupling units that transmit the radio waves to each other are formed. When radio waves propagate through the end surfaces of waveguides, since radio waves are coupled in the same mode (for example, TE or TM mode) in the portions where the end surfaces of the waveguides face each other, it is possible to prevent the occurrence of coupling in a "unstable mode" even when there is a misalignment. Thus, radio waves can easily propagate. Even when non-contacting portions are misaligned, signals can be transmitted stably.

When signals are transmitted between attached electronic devices, since signal transmission is performed by wireless (specifically, via radio waves), it is possible to realize a signal interface which provides favorable transmission speed and capacity which is difficult to obtain when signal transmission is performed through electric wirings. In this case, since such a signal interface does not require a large number of wirings as required when connection is realized by electric wirings, the housing shape or structure is not complicated. Thus, it is possible to establish a one-directional or bidirectional signal interface between electronic devices with radio waves with a simple and non-expensive configuration without relying on connectors with many terminals and signal wirings. Moreover, in this case, since radio waves are coupled through the end surfaces of the waveguides, it is possible to alleviate the influence of misalignment during attachment and to realize stable signal transmission.

BRIEF DESCRIPTION OF THE DRAWINGS

FIG. 3 is a diagram of a radio-wave transmission structure according to the present embodiment, illustrating a functional configuration of a signal interface of a signal transmission device according to a first comparative example.

FIGS. 4A to 4C are diagrams illustrating an electronic device according to the first comparative example.

FIGS. 5A to 5C are diagrams illustrating an electronic device according to a second comparative example.

FIGS. 8A to 8C are diagrams illustrating an electronic device according to a first exemplary embodiment.

FIGS. 9A to 9C are diagrams illustrating an electronic device according to a second exemplary embodiment.

FIG. 10 is a diagram illustrating the electronic device according to the second exemplary embodiment.

FIGS. 11A to 11C are diagrams illustrating an electronic device according to a third exemplary embodiment.

DETAILED DESCRIPTION

Figure 1:
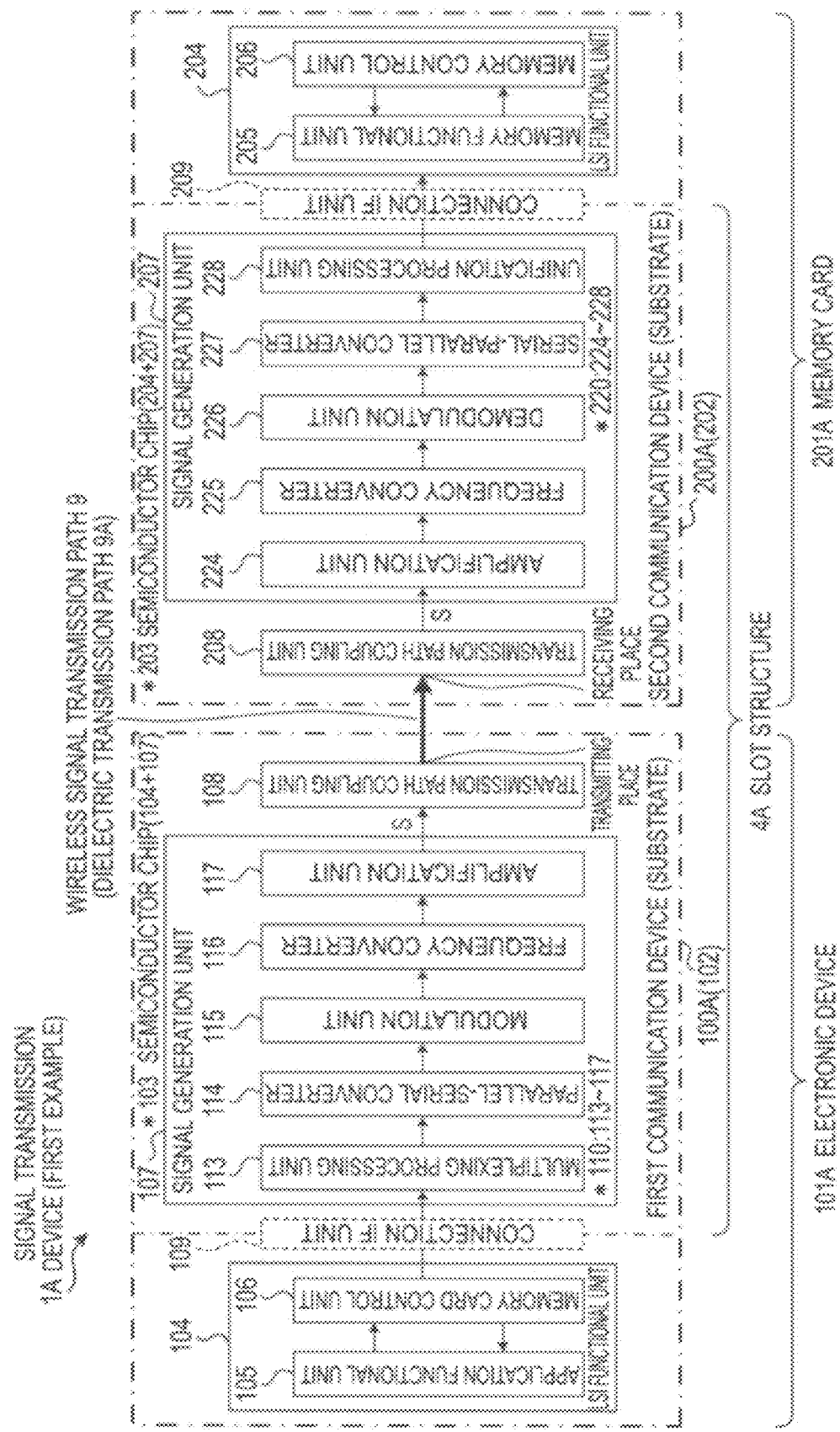
FIG. 1 is a diagram illustrating a signal transmission device of a first example.

The exemplary embodiments of the present disclosure will be described below with reference to the accompanying drawings. When distinction is made between respective functional elements, such elements will be denoted by reference numerals such as alphabetic characters or "_@" (where @ is a number), or these combinations. Where no particular distinction is made therebetween for description, such reference numerals will be omitted. The same holds true for the drawings.

The description will be given in the following order.
1. Overview
2. Communication processing system: First example (without wireless transmission of power)
3. Communication processing system: Second example (with wireless transmission of power)
4. Radio-wave transmission structure: Basic
5. Specific application example
  First exemplary embodiment: Application to card medium where waveguide is formed on substrate
  Second exemplary embodiment: Application to card medium where waveguide is formed within substrate
  Third exemplary embodiment: Application to card medium where waveguide is formed on substrate and (power is wirelessly transmitted)
  Fourth exemplary embodiment: Application to card medium and "mounting" forms
  Fifth exemplary embodiment: Application to imaging device and "mounting" forms Overview In exemplary embodiments of the present disclosure, when a first electronic device and a second electronic device are disposed at predetermined positions, a signal transmission device transmits a transmission subject signal by wavelength wirelessly (via radio waves) between both electronic devices.

For example, in a state where the first electronic device is attached to an attachment structure of the second electronic device (that is, both electronic devices are disposed at a relatively short distance), the transmission subject signal is transmitted through a wireless signal transmission path as radio waves between both electronic devices. In the exemplary embodiments of the present disclosure, the term "wireless transmission" means transmission of the transmission subject signal via radio wave rather than through electric wirings or light. Basic matters will be described below.

[Signal Transmission Device, Electronic Device, and Signal Transmission Method]

In the present embodiment, the signal transmission device includes a transmitting device that transmits a transmission subject signal through a first waveguide as a wireless signal and a receiving device that receives the wireless signal of the transmission subject signal transmitted from the transmitting device through a second waveguide. The wireless signal is transmitted between the transmitting device and the receiving device in a state where an end surface of the first waveguide faces an end surface of the second waveguide. Specifically, when the transmitting device and the receiving device are disposed at predetermined positions, a coupling unit in which the end surfaces (hereinafter sometimes referred to as "cross-sectional surfaces" for the sake of convenience) in the longitudinal direction of the first and second waveguides (hereinafter sometimes collectively referred to as "two waveguides") face each other to couple radio waves with each other is disposed between the transmitting device and the receiving device. By doing so, between the transmitting device and the receiving device, the transmission subject signal is converted into radio waves, and thereafter, the radio waves can be transmitted through the coupling unit. The transmitting device (transmitting-side communication device) that transmits the transmission subject signal as a wireless signal and the receiving device (receiving-side communication device) that receives the wireless signal transmitted from the transmitting device to reproduce the transmission subject signal form the signal transmission device for the transmission subject signal.

The transmitting device and the receiving device are provided in an electronic device. When the transmitting device and the receiving device are provided in the respective electronic devices, it is possible to perform bidirectional communication. When electronic devices are attached at predetermined positions, and signal transmission is performed between both electronic devices via radio waves, a coupling unit in which the cross-sectional surfaces in the longitudinal direction of two waveguides face each other to couple radio waves with each other is disposed. Between the electronic devices, the transmission subject signal is converted into radio waves, and thereafter, the radio waves can be transmitted through the coupling unit.

The signal transmission device may convert only signals which require high speed and high capacity among various kinds of transmission subject signals into radio waves but may not convert the other signals which do not require high speed and high capacity and which such as power, can be considered to be direct current into radio waves. The signal transmission device may also convert the other signals which do not require high speed and high capacity into radio waves. As will be described later, more preferably, the power may also be transmitted wirelessly by a power supply device and a power receiving device. That is, the other signals which do not require high speed and high capacity as well as the signals which require high speed and high capacity may be transmitted via radio wave, and more preferably, all signals also including power (electricity) may be transmitted wirelessly.

Signals which are not subject to wireless transmission are transmitted by connector connections as usual. Original transmission subject electrical signals before conversion into radio waves will be collectively referred to as a baseband signal. When power (electricity) is also transmitted wirelessly, power transmission and signal transmission may be performed with different signals, and in this case, the frequency of the power transmission signal may be different from or the same as the frequency of the carrier signal for the signal transmission. However, from the perspective of preventing the influence of noise due to the power transmission signal, preferably, the frequency of the power transmission signal is different from the frequency of the carrier signal for the signal transmission. Various frequencies may be used as the frequency of the power transmission signal as long as the frequency does not overlap the frequency band used for wireless transmission of information. Although there is limitation in the applicable modulation method, when a decrease in power transmission efficiency is allowed, the same carrier waves may be used for signal transmission and power transmission (in this case, the frequency of the power transmission signal is the same as the frequency of the carrier signal for signal transmission).

When radio waves are used for signal transmission, the problems of the use of electric wirings or light do not occur. That is, when signal transmission is performed using radio waves rather than electric wirings or light, it is possible to apply wireless communication technique and to solve the drawbacks associated with the use of electric wirings. Moreover, it is possible to establish a signal interface with a simple and non-expensive configuration more than the case of using light. It is also advantageous over light in terms of size and cost. Preferably, in the exemplary embodiments of the present disclosure, a millimeter-band carrier frequency (having a wavelength of 1 to 10 millimeters) is mainly used. However, the present disclosure is not limited to the millimeter band but can be applied when using a carrier frequency near the millimeter band such as a submillimeter band (having a wavelength of 0.1 to 1 millimeters) having shorter wavelength or a centimeter band (having a wavelength of 1 to 10 centimeters) having longer wavelength. For example, a frequency band between the submillimeter band and the millimeter band, between the millimeter band and the centimeter band, or among the submillimeter band, the millimeter band and the centimeter band may be used. When signals are transmitted using the millimeter band or a frequency band in its vicinity, the signals will not disturb other electric wirings, and it is possible to reduce the necessity of EMC measures as needed when electric wirings (for example, flexible printed substrates) are used for signal transmission. Since the use of the millimeter band or a frequency band in its vicinity provides a higher data rate than that obtained when electric wirings (for example, flexible printed substrates) are used, it is possible to easily deal with high-speed, high-data rate transmission such as high-speed transmission of image signals caused by an increase in resolution and frame rate.

In the present embodiment, preferably, a dielectric material having a property of capable of transmitting radio waves is filled in at least one of the first and second waveguides. For example, an alignment structure is provided so as to perform alignment of both electronic devices when both electronic devices are attached to each other. Moreover, a coupling unit is disposed at the position of the alignment structure. The alignment structure is used as a guide for causing antennas to face each other. Preferably, the alignment structure has a structure that defines an attachment state between both electronic devices using an attachment structure. Moreover, the alignment structure has a structure that causes radio waves to be transmitted while confining radio waves in a transmission path. To realize this, a dielectric material having a property capable of transmitting radio waves may be filled in the alignment structure. The waveguide is provided using the alignment structure, and the waveguide has a structure which is surrounded by a shielding material such as a conductor so that radio waves are confined therein. Although a hollow waveguide of which the interior is hollow may be used, more preferably, a dielectric transmission path in which a dielectric material is filled may be used. When a dielectric material is filled in the waveguide, it is possible to suppress multiple reflections and to decrease the cross-sectional size (for example, a tube diameter) of the waveguide.

In the present embodiment, preferably, one of the first and second waveguides includes an antenna which is disposed on a side opposite to the other waveguide and which is electromagnetically coupled with a high-frequency signal transmission path through which high-frequency signals are transmitted. In each of the transmitting and receiving sides, a small variation or slip within an allowable range may occur in the relative positional relationship between the antenna and the waveguide. However, preferably, at least the antenna and one of the waveguides are integrated with each other, and more preferably, the high-frequency signal transmission path, the antenna, and one of the waveguides are integrated with each other. The other waveguide may include an antenna which is disposed on a side opposite to one waveguide and which is electromagnetically coupled with a high-frequency signal transmission path through which high-frequency signals are transmitted. That is, another waveguide is disposed at both ends of one waveguide, and each of the waveguides at both ends includes an antenna which is electromagnetically coupled with a high-frequency signal transmission path through which high-frequency signals are transmitted. Alternatively, in this case, a waveguide disposed at the center may be removed to obtain a transmitting device (one electronic device) in which the antenna and the waveguide are integrated and a receiving device (the other electronic device) in which the antenna and the waveguide are integrated, and a coupling unit in which the end surfaces in the longitudinal direction of the two waveguides face each other to couple radio waves with each other may be disposed between the transmitting device and the receiving device. When integrating the antenna and the waveguide with each other, and when integrating the high-frequency signal transmission path, the antenna, and the waveguide with each other, from the perspective of manufacturing efficiency, it is preferable to form these elements on the same circuit substrate. As the antenna, a probe antenna (dipole or the like), a loop antenna, or a small aperture coupling element (slot antenna or the like) in addition to a patch antenna may be used. In particular, it is preferable to use a patch antenna.

For example, a conductor that forms the waveguide may be fixed, by an adhesive agent or other fixing member, to a surface of the circuit substrate close to the other waveguide of the two waveguides. The conductor that forms the waveguide is disposed so as to extend in the thickness direction of the circuit substrate. Alternatively, the waveguide may be formed in the circuit substrate so as to extend in the thickness direction thereof. Although the waveguide may be disposed in a gap between the circuit substrate and the housing of the electronic device, in this case, since the housing of the electronic device is interposed between the other waveguide and the circuit substrate, it is preferable that a portion of the housing facing the two waveguides is formed of a dielectric material.

In regard to an antenna, when the transmitting device and the receiving device are disposed at predetermined positions, that is, when the electronic devices are attached at predetermined positions and signal transmission is performed between both electronic devices via radio waves, a transmitting-side antenna and a receiving-side antenna may be disposed at positions where they face each other with the waveguide disposed therebetween. For example, in the case of using a patch antenna, a patch antenna of the transmission path coupling unit of a first electronic device and a patch antenna of the transmission path coupling unit of a second electronic device are disposed so that the two patch antennas face each other and the centers of the respective patch antennas are identical to the centers of the respective waveguides that form a wireless signal transmission path.

The configuration of each signal coupling unit and the high-frequency signal transmission path is preferably applied to the attachment structure for electronic devices. For example, depending on the standard, the shape, position, and the like of the attachment structure are standardized. In this case, the configuration of each signal coupling unit and the high-frequency signal transmission path is applied to the part of the attachment structure, whereby compatibility with an existing electronic device (for example a card-type device) is secured (ensured).

[Electronic Device]

In the electronic device of the present embodiment corresponding to the second and third embodiments of the present disclosure, a plurality of devices (electronic devices) may be combined to form one whole electronic device. The signal transmission device of the present embodiment is used, for example, in an electronic device such as a digital recording and reproducing device, a terrestrial television receiver, a mobile phone, a game machine, or a computer.

When configuring a communication device, there may be a case where the communication device includes only a transmitting-side communication device, a case where the communication device includes only a receiving-side communication device, and a case where the communication device includes both the transmitting-side communication device and the receiving-side communication device. The communication devices on the transmitting and receiving sides are coupled by a wireless signal transmission path (for example, a millimeter-wave signal transmission path) so that signal transmission is performed using the millimeter band. The transmission subject signal is frequency-converted into a signal of the millimeter band which is ideal for wide-band transmission. However, in any case, the transmitting-side communication device and the receiving-side communication device are paired with each other to form the signal transmission device.

Moreover, between the transmitting-side communication device and the receiving-side communication device which are disposed at a relatively short distance, the transmission subject signal is first converted into a millimeter-wave signal, and then, the millimeter-wave signal is transmitted through the wireless signal transmission path. The term "wireless transmission" in the present embodiment means transmission of the transmission subject signals wirelessly (through millimeter waves; in this example, millimeter waves) rather than through general electric wirings (simple wire lines).

The term "relatively short distance" means a distance shorter than the distance between communication devices in a field or outdoors used for broadcasting or general wireless communication, and may be a distance in which the transmission range can be substantially specified as a closed space.

The term "closed space" means a space in which leakage of radio waves to the outside from the interior of the space is small, and conversely, entrance (penetration) of radio waves into the interior of the space from the outside is small. Typically, the term "closed space" is in a state where the entire space is surrounded by a housing (casing) having a shielding effect against radio waves. For example, the wireless transmission may be inter-device communication in a state where a plurality of electronic devices are integrated as in a case where one electronic device is attached to the other electronic device. While the term "integrated" typically means a state wherein both electronic devices are completely in contact with each other by attachment, it may be a state where a transmission range between both electronic devices can be substantially specified as a closed space. Moreover, the integrated state may also include a case where both electronic devices are disposed at determined positions in a state of being separated from each other at a relatively short distance such as, for example, within several centimeters or between 10 and 20 centimeters, and thus, the electronic devices can be considered to be "substantially" integrated with each other. That is, the integrated state may be a state where leakage of radio waves to the outside from the interior of the space which is formed by both electronic devices and in which radio waves can propagate is small, and conversely, entrance (penetration) of radio waves into the interior of the space from the outside is small.

In the following description, signal transmission in a state where a plurality of electronic devices are integrated (including "substantially integrated" in the following description) is referred to as inter-device signal transmission. In the case of the inter-device signal transmission, a transmitting-side communication device (communication unit or transmitting unit) and a receiving-side communication device (communication unit or receiving unit) are included in the housings of different electronic devices, and when both electronic devices are disposed at determined positions and are integrated with each other, a wireless signal transmission path is formed between the communication units (the transmitting unit and the receiving unit) in both electronic devices, whereby a signal transmission device is constructed.

In regard to signal transmission, the following may be taken into consideration. For example, in a state where one electronic device is attached to an attachment structure of the other electronic device (that is, both electronic devices are arranged at a relatively short distance), transmission subject signals are converted into high-frequency signals (for example, millimeter-band signals), and thereafter, the high-frequency signals are transmitted between both electronic devices through a wireless signal transmission path. Each of the electronic devices is disposed in a state where a transmitting unit and a receiving unit are paired with each other with the wireless signal transmission path disposed therebetween. The signal transmission between both electronic devices may be unidirectional (that is, in one direction) or bidirectional.

In the respective communication devices arranged with the wireless signal transmission path disposed therebetween, a transmitting system and a receiving system are disposed in a paired and coupled manner with each other. By providing both the transmitting system and the receiving system in the respective communication devices, bidirectional communication can be realized. When both the transmitting system and the receiving system are provided in the respective communication devices, signal transmission between one communication device and the other communication device may be unidirectional (that is, in one direction) or bidirectional. For example, when the first communication device serves as a transmitting side and the second communication device serves as a receiving side, a first communication unit that performs the transmitting function is disposed in the first communication device, and a second communication unit that performs the receiving function is disposed in the second communication device. When the second communication device serves as a transmitting side and the first communication device serves as a receiving side, a first communication unit that performs the transmitting function is disposed in the second communication device, and a second communication unit that performs the receiving function is disposed in the first communication device.

The transmitting unit of the first communication unit that performs the transmitting function includes, for example, a transmitting-side signal generation unit (a signal conversion unit that converts a transmission subject electrical signal into a millimeter-wave electrical signal) that processes the transmission subject signal to generate a millimeter-wave electrical signal and a transmitting-side signal coupling unit that couples the millimeter-wave electrical signal generated by the transmitting-side signal generation unit to the wireless signal transmission path for transmitting the millimeter-wave wireless signal. Preferably, the transmitting-side signal generation unit may be integrated with a function that generates the transmission subject signal.

As the transmission path coupling unit, for example, an antenna structure that includes an antenna coupling unit, an antenna terminal, a micro-strip line, an antenna, and the like is used. The portion in which the transmission path coupling unit and the wireless signal transmission path couple with each other is a portion where signals are transmitted or received. For example, the antenna coupling unit constitutes the transmission path coupling unit or a part thereof. The antenna coupling unit in a narrow sense refers to a portion that couples an electronic circuit within a semiconductor chip with an antenna disposed within or outside the chip, and in a broad sense, refers to a portion that couples signals between the semiconductor chips to the wireless signal transmission path. For example, the antenna coupling unit includes at least an antenna structure. The antenna structure refers to a structure of a portion coupled with the wireless signal transmission path and only needs to convert a millimeter-wave electrical signal into electromagnetic waves (radio waves) and couples the radio waves to the wireless signal transmission path, and the antenna structure does not mean only an antenna itself.

The wireless signal transmission path may be configured as a free space transmission path so that millimeter-wave signals propagate the internal space of a housing, for example. Moreover, the wireless signal transmission path is preferably formed by a waveguide, a transmission line, a dielectric line, or a waveguide structure within a dielectric material or the like, and has a structure that confines millimeter-band electromagnetic waves in the transmission path and has a property of efficiently transmitting the millimeter-band electromagnetic waves. For example, the wireless signal transmission path may be a dielectric transmission path including a dielectric material having a relative dielectric constant in a certain range and a dielectric loss tangent in a certain range. For example, a dielectric material is filled in the entire housing whereby the dielectric transmission path rather than a free space transmission path is disposed between the transmitting-side transmission path coupling unit and the receiving-side transmission path coupling unit. Moreover, the dielectric transmission path may be formed by connecting the antenna of the transmitting-side transmission path coupling unit and the antenna of the receiving-side transmission path coupling unit using a dielectric line which is a linear member formed of a dielectric material and having a certain line diameter. As the wireless signal transmission path that confines radio waves (for example, millimeter-wave signals) in a transmission path, a hollow waveguide in which the transmission path is surrounded by a shielding material, and the inside is hollow may be used in addition to the dielectric transmission path.

For example, the transmitting-side signal generation unit has a modulation circuit (modulation unit), and the modulation circuit modulates the transmission subject signal (baseband signal). The transmitting-side signal generation unit generates a millimeter-wave electrical signal by frequency-converting a modulated signal modulated by the modulation circuit. In principle, the transmission subject signal may be directly converted into the millimeter-wave electrical signal. The transmitting-side transmission path coupling unit converts the millimeter-wave electrical signal generated by the transmitting-side signal generation unit into a wireless signal (electromagnetic waves or radio waves) and supplies the wireless signal to the wireless signal transmission path serving as the wireless signal transmission path.

Basically, the modulation processing may only need to modulate at least one of amplitude, frequency, and phase with the transmission subject signal, and a modulation method which uses an arbitrary combination thereof may be adopted. Examples of analog modulation methods include amplitude modulation (AM) and vector modulation. Examples of vector modulation include frequency modulation (FM) and phase modulation (PM). Examples of a digital modulation method include amplitude shift keying (ASK), frequency shift keying (FSK), phase shift keying (PSK), and amplitude phase shift keying (APSK). Quadrature amplitude modulation (QAM) is a typical example of amplitude phase shift keying.

The receiving unit of the second communication unit that performs the receiving function includes, for example, a receiving-side transmission path coupling unit that receives the millimeter-wave wireless signal transmitted through the wireless signal transmission path serving as the wireless signal transmission path and converts the wireless signal into an electrical signal and a receiving-side signal generation unit (a signal conversion unit that converts the millimeter-wave signal into a transmission subject electrical signal) that processes the millimeter-wave electrical signal (input signal) received by the receiving-side transmission path coupling unit and converted into the electrical signal to generate (recover or reproduce) a general electrical signal (transmission subject signal or baseband signal). Preferably, the receiving-side signal generation unit may be integrated with a functional unit that receives the transmission subject signal. For example, the receiving-side signal generation unit has a demodulation circuit (demodulation unit) and generates an output signal by frequency-converting the millimeter-wave electrical signal. Then, the demodulation circuit demodulates the output signal to thereby generate the transmission subject signal. In principle, the millimeter-wave electrical signal may be directly converted into the transmission subject signal.

Signal transmission by wireless may be realized by multiplex communication of signals based on time division multiplexing or frequency division multiplexing. A method of realizing multiplex communication of signals includes a method of transmitting a plurality of signals in the same direction and a method of performing bidirectional communication. For example, half-duplex bidirectional communication may be performed by switching transmission and reception based on time division multiplexing. In this case, the signal processing units on the transmitting and receiving sides include a switching unit that switches the transmitting and receiving timings on a time division basis, and half-duplex bidirectional communication is performed using a wireless signal transmission path of one system. Full-duplex bidirectional communication which performs simultaneous transmission and reception based on frequency division multiplexing may also be used. In this case, the transmitting and receiving sides use different frequencies for transmitting and receiving wireless signals and perform full-duplex bidirectional transmission using a wireless signal transmission path of one system. Signals may be transmitted by changing signals of a plurality of system based on time division multiplexing. In this case, a multiplexing processing unit for integrating a plurality of transmission subject signals into a signal of one system by time division processing and transmitting the integrated signal is provided on the transmitting side, and a unification processing unit for separating the wireless signal of one system received through the wireless signal transmission path into signals of the respective system is provided on the receiving side. Signals of a plurality of systems may be simultaneously transmitted by frequency division multiplexing. In this case, a multiplexing processing unit for transmitting a plurality of transmission subject signals through a wireless signal transmission path of one system using different frequencies for the wireless signal is provided on the transmitting side, and a unification processing unit that separates the wireless signal of one system received through the wireless signal transmission path into signals of the respective system is provided in the receiving-side signal processing unit. Preferably, a signal processing unit corresponding to the transmitting unit or the receiving unit is disposed on the same substrate and disposed in the corresponding housing.

Preferably, the transmission characteristics of the wireless signal transmission path between a transmitting unit and a receiving unit are known. Moreover, at least one of the transmitting-side signal processing unit on the preceding stage of the transmitting unit and the receiving-side signal processing unit on the subsequent stage of the receiving unit may include a setting value processing unit that inputs setting values for the predetermined signal processing to the signal processing unit. For example, when the arrangement positions of the transmitting unit and the receiving unit within one housing are not changed (in the case of intra-device communication), or when the arrangement positions of the transmitting unit and the receiving unit under the using state are in the predetermined state even if the transmitting unit (and the transmitting-side signal processing unit) and the receiving unit (and the receiving-side signal processing unit) are disposed in different housings (in the case of inter-device wireless transmission at a relatively short distance), the transmission conditions between a transmitting device and a receiving device are not substantially changed (that is, the conditions are fixed). In this case, it is possible to understand the transmission characteristic between the transmitting device and the receiving device.

In an environment where the transmission conditions between a transmitting device and a receiving device are not substantially changed (that is, the conditions are fixed), even when the setting value for defining the operation of the signal processing unit is treated as a fixed value, that is, the parameter settings are fixed, it is possible to operate the signal processing unit without any problem. By using a predetermined value (that is, a fixed value) as the setting value for the signal processing, since it is not necessary to dynamically change the parameter settings, it is possible to decrease the number of parameter calculation circuits and to reduce power consumption. Since the communication environment in the intra-device wireless transmission or the inter-device wireless transmission at a relatively short distance is fixed, it is possible to determine various circuit parameters which depend on the communication environment in advance. In an environment where the transmission conditions are fixed, even when the setting value for defining the operation of the signal processing unit is treated as a fixed value, that is, the parameter settings are fixed, it is possible to operate the signal processing unit without any problem. For example, by calculating the optimal parameters during factory shipment and storing the parameters in the device, it is possible to decrease the number of parameter calculation circuits and to reduce power consumption. There are various signal processing parameter settings. For example, the gain (signal amplitude), the phase adjustment amount, and the frequency characteristics of a signal amplification circuit (amplitude adjustment unit) are set. The gain setting is used for setting the transmission power, the reception signal level input to the demodulation functional unit, automatic gain control (AGC), and the like. The setting of the phase adjustment amount is used for adjusting the phase so as to correspond to the delay amount of a transmission signal between the systems that transmit the carrier signal and the clock signal separately. The frequency characteristic setting is used when enhancing the amplitude of low-frequency components or high-frequency components in advance on the transmitting side.

That is, in the present embodiment, when providing a signal interface, the transmission subject signal is transmitted as a wireless signal in a contactless or cableless manner (that is, the transmission subject signal is not transmitted through electric wirings). Preferably, at least signals (particularly, video signals which require high-speed, large-volume transmission, and high-speed clock signals) are transmitted via a millimeter-wave wireless signal or the like (preferably via radio waves rather than light). That is, in the present embodiment, signal transmission which was performed through electric wirings is performed through a wireless signal (radio waves). By transmitting signals through the millimeter-wave wireless signal or the like, it is possible to realize high-speed signal transmission with a data rate of the order of gigabits per second (Gbps), making it possible to easily restrict the area the millimeter-wave signal can cover. Moreover, the effects arising from the property thereof can be obtained.

[Comparison Between Signal Transmission Through Electric Wirings and Wireless Transmission]

Signal transmission through electric wirings has the following problems.

i) In spite of need for data transmission in a larger volume and at a higher speed, electric wirings have their limitations in transmission speed and volume.

ii) A possible approach to increasing the data transmission speed would be to provide parallel signals by increasing the number of wirings and reduce the transmission speed of each signal line. However, this approach leads to an increase in the number of input and output terminals. As a result, more complicated printed circuit substrates and cabling are required. Moreover, the physical size of the connectors and electrical interface must be increased. This leads to more complicated geometries of the connectors and electrical interface, resulting in degraded reliability and increased cost.

iii) As a result of enormous expansion in the amount of information including movie pictures and computer graphics, the baseband signal bandwidth expands, causing the EMC (electromagnetic compatibility) problem to manifest itself. For example, when electric wirings are used, the wirings act as an antenna, interfering with the signals corresponding to the tuning frequency of the antenna. Moreover, reflection and resonance resulting from unmatched wirings impedance may cause spurious radiation. In order to address these problems, the electronic device becomes more complex in configuration.

iv) In addition to EMC, reflection may cause transmission errors due to interference between symbols at the receiving side and intrusion of jamming wave.

In contrast, when signal transmission is performed wirelessly (for example, using the millimeter band) rather than through electric wirings, since there is no need to be concerned about wiring geometry or connector positions, there are not many restrictions in layout. Since the wirings and terminals can be omitted for those signals that are transmitted with a millimeter-wave signal, the EMC problems are solved. In general, since there are no other functional units which use frequencies in the millimeter band in the communication device, countermeasures against the EMC problems are easily realized. The wireless transmission takes place between the transmitting-side communication device and the receiving-side communication device in proximity to each other, and signals are transmitted between fixed positions or in a known positional relationship. As a result, the following advantages are obtained.

1) It is easy to properly design a propagation channel (waveguide structure) between the transmitting side and the receiving side.

2) Excellent transmission with higher reliability than free space transmission can be realized by designing the dielectric structure of a transmission path coupling unit that seals the transmitting side and the receiving side and the propagation channel (waveguide structure of the wireless signal transmission path) in conjunction with each other.

3) Since the control of a controller that controls wireless transmission does not need to be performed dynamically, adaptively, and frequently unlike general wireless communication, control overhead can be reduced as compared to general wireless communication. As a result, the setting values (so-called parameters) used by control circuits and calculation circuits can be set to constant values (so-called fixed values), and thus, size reductions, reduction in power consumption and faster transmission can be realized. For example, when wireless transmission characteristics are calibrated at the time of manufacturing or designing to understand individual fluctuations or the like, since the data can be referenced, the setting values for defining the operation of the signal processing unit can be easily realized through presetting or static control. Since the setting values generally define the operation of the signal processing unit properly, high-quality communication can be performed with a simple configuration and at a low power consumption.

In addition, millimeter wave communication using short wavelength provides the following advantages.

a) Since millimeter wave communication provides a wide communication band, a high data rate can be achieved easily.

b) Since the transmission frequency can be separated from the frequencies used for processing other baseband signals, interference rarely occurs between the millimeter wave and baseband signals.

c) Since the millimeter band has a short wavelength, it is possible to decrease the size of the antenna and the waveguide structure, which are determined by the wavelength. In addition, electromagnetic shielding is easy to achieve due to large distance attenuation and small diffraction.

d) The carrier stability is strictly regulated to prevent interference in the ordinary wireless communication in a field. In order to achieve such a highly stable carrier, highly stable external frequency reference components, frequency multiplier circuits, and PLL (phase locked loop circuit) are used, which increases the circuit size. However, millimeter waves can be easily shielded to prevent external leaks (particularly when used in combination with signal transmission between fixed positions or in a known positional relationship). Injection locking is preferred to demodulate a signal transmitted on a less stable carrier with a small circuit at the receiving side.

For example, LVDS (Low Voltage Differential Signaling) is known as a method for achieving high-speed signal transmission between electronic devices disposed at a relatively short distance (for example, between 10 to 20 centimeters) or within an electronic device. However, a recent further increase in volume and speed of transmission data incurs problems such as an increase in power consumption, an increase in effect of signal distortion due to reflection or the like, and an increase in spurious radiation (so-called EMI problems). For example, LVDS has reached its limit in high-speed (real-time) transmission of video signals (including image signals) and signals of computer images and the like within a device or between devices.

A possible approach to increasing the data transmission speed would be to provide parallel signals by increasing the number of wirings and reduce the transmission speed of each signal line. However, this approach leads to an increase in the number of input and output terminals. As a result, more complicated printed circuit substrates and cabling are required. Moreover, the size of the semiconductor chips must be increased. Furthermore, transmitting large-volume data through wirings at high speed may cause a so-called electromagnetic field interference problem.

All problems involved in the LVDS or the technique of increasing the number of wirings are caused by signal transmission through electric wirings. Therefore, as a method for solving the problem caused by signal transmission through electric wirings, a method of eliminating the electric wirings for signal transmission (particularly, a method of transmitting signals through radio waves) may be adopted. Examples of the method of eliminating electric wirings for signal transmission include a method (first method) of wirelessly transmitting signals within a housing and applying the UWB (Ultra-wideband) communication method and a method (second method) of using a millimeter-band carrier frequency having a short wavelength (1 to 10 millimeters). However, the UWB communication method according to the first method uses a low carrier frequency and is not ideal for high-speed communication, for example, for transmission of video signals, and therefore, incurs problems associated with an antenna size or the like. Furthermore, since the transmission frequency is close to the frequency used for processing other baseband signals, interference is likely to occur between the wireless signal and the baseband signal. In addition, when the carrier frequency is low, it is likely to be affected by noise generated in the driving system in a device, and countermeasures against the noise are required. In contrast, as in the case of the second method, when a millimeter-band carrier frequency having a shorter wavelength is used, it is possible to solve the problems associated with an antenna size and interference.

In the present disclosure, although wireless communication is performed using the millimeter band, the application range thereof is not limited to performing communication using the millimeter band. Communication in a frequency band (centimeter band) lower than the millimeter band and communication in a frequency band (submillimeter band) higher than the millimeter band may be applied. However, in regard to intra-device signal transmission and inter-device signal transmission, it is ideal to use mainly the millimeter band in which the wavelength is not excessively long or short.

[Noncontact Power Transmission]

Preferably, electricity (power) is also transmitted by wireless (preferably, using a millimeter-band carrier signal). More preferably, a reference signal for a power receiving-side communication device is generated from the power transmission signal. That is, a reference signal generation unit may be provided so as to generate a reference signal serving as the reference of a carrier signal used for signal transmission by one communication device which operates by receiving electricity generated by a power receiving device based on the power transmission signal received by the power receiving device. In this case, the power supply device and the communication device may perform the respective processing based on the same reference signal. By doing so, modulation processing (or demodulation processing) in a power feeding-side communication device and demodulation processing (or modulation processing) in the power feeding-side communication device can be performed synchronously. This is ideal when demodulation processing uses a synchronous detection method. In this case, preferably, the receiving-side communication device may include a timing signal generation unit that generates a carrier signal for performing demodulation processing based on a synchronous detection method based on the reference signal generated by the reference signal generation unit.

Various methods of transmitting power from a power supply device (also referred to as a power feeding device or a power transmitting terminal) to a power receiving device (also referred to as a power receiving device or a power receiving terminal) in a wireless (noncontact) manner have been proposed. The method of transmitting power in a noncontact manner is referred to as "noncontact feeding" "wireless feeding," "wireless power transmission," and the like. In principle, the noncontact power transmission uses electromagnetic energy and is mainly classified into a radiation type (radio wave receiving type and radio wave harvesting type) and a non-radiation type. The radiation type is further classified into a microwave type and a laser type, and the non-radiation type is further classified into an electromagnetic induction type and a resonance type (also referred to as an electromagnetic resonance type). Another classification method is a method of classifying depending on whether an electromagnetic coil is used or not. In this case, the radio wave receiving type corresponds to a method which does not use an electromagnetic coil, and the electromagnetic induction type and the resonance type correspond to a method which uses an electromagnetic coil. The use of these methods can completely eliminate the need for an interface which uses electric wirings or terminals, and a cableless device configuration can be obtained. All signals including power can be transmitted by wireless.

In any method, a power supplying unit is provided on the power transmitting side (also referred to as a primary side), and a power receiving unit is provided on the power receiving side (also referred to as a secondary side), whereby power is transmitted by wireless by electromagnetic coupling between a power transmitting element and a power receiving element. The power supplying unit includes a power transmitting element and a power feeding source unit serving as a power transmitting element driving circuit that drives the power transmitting element. The power receiving unit includes a power receiving element and a power receiving source unit such as a rectifier circuit that rectifies the power received by the power receiving element into a form (difference in DC and AC, voltage, or the like) suitable to be used by the subsequent-stage circuits.

For example, the radio wave receiving type uses the energy of radio waves, and converts an alternating-current waveform obtained by receiving radio waves into a direct-current voltage using a rectifier circuit. The radio wave receiving type has an advantage in that it is possible to transmit power irrespective of the frequency band (for example, millimeter waves may be used). Though not shown in the figure, the power supplying unit for supplying power by wireless is provided with a transmitting circuit for transmitting radio waves in a certain frequency band from a power transmitting element (for example, an antenna). The power receiving unit for receiving the power from the power supplying unit by wireless is provided with a rectifier circuit for rectifying the radio waves received by the power receiving element (for example, an antenna). Though depending on transmission power, the received voltage is low, and a rectifier diode with as low a forward voltage as possible (for example a Schottky diode) is desirably used for the rectifier circuit. Moreover, a resonant circuit may be formed in a stage preceding the rectifier circuit to increase the voltage and then perform rectification. In the radio wave receiving type in ordinary outdoor use, much of the transmission power is spread as radio waves, and thus power transmission efficiency decreases. However, this problem can be solved by combining a configuration capable of limiting a range of transmission (for example a wireless signal transmission path having a confining structure).

The electromagnetic induction type uses electromagnetic coupling of coils and induced electromotive force. Though not shown in the figure, a primary coil is provided on the power transmitting side as a power transmitting element, and the power supplying unit that supplies power by wireless drives the primary coil at a relatively high frequency. A secondary coil is provided on the power receiving side as a power receiving element at such a position as to face the primary coil, and a rectifier diode, capacitors for resonance and smoothing, and the like are provided in a power receiving unit that receives power from the power supplying unit by wireless. For example, the rectifier diode and the smoothing capacitor form a rectifier circuit. When the primary coil is driven at a high frequency, an induced electromotive force is generated in the secondary coil electromagnetically coupled to the primary coil. The rectifier circuit generates a direct-current voltage on the basis of the induced electromotive force. At this time, power reception efficiency is enhanced by using a resonance effect. When the electromagnetic induction type is adopted, the power supplying unit and the power receiving unit are brought into proximity to each other, other members (metal in particular) are prevented from being interposed between the power supplying unit and the power receiving unit (specifically between the primary coil and the secondary coil), and electromagnetic shielding is provided for the coils. The former is to prevent heating of the metal (according to principles of electromagnetic induction heating), and the latter is to take a measure against electromagnetic interference with other electronic circuits. The electromagnetic induction type can transmit high power, but needs to bring the transmitter and the receiver into proximity to each other (for example a distance of 1 cm or less), as described above.

The resonance type is a method of transmitting power using coupling based on resonance (oscillation) of an electric field or a magnetic field between a transmitting resonator (transmitting resonance element) serving as a power transmitting element provided in the power supply device for supplying power and a receiving resonator (receiving resonance element) serving as a power receiving element provided in the power receiving device for receiving power supplied from the power receiving device using a resonance phenomenon between two resonators (resonance elements) on the transmitting and receiving sides. That is, the resonance type applies the same principle as a phenomenon in which two vibrators (pendulums or tuning forks) resonate, and uses a resonance phenomenon in a near field in one of an electric field and a magnetic field rather than electromagnetic waves. The resonance type uses a phenomenon in which when one (corresponding to the power supplying unit) of the two vibrators having the same natural frequency is oscillated, and only a small vibration is transmitted to the other vibrator (corresponding to the power receiving unit), the other vibrator starts vibrating greatly due to the resonance phenomenon.

The method which uses resonance of an electric field will be referred to as an electric field resonance type, and the method which uses resonance of a magnetic field will be referred to as a magnetic field resonance type. In recent years, "resonance-type methods" using resonance of an electric field or a magnetic field which is advantages in efficiency, transmission distance, positional error, angular error, and the like are gathering attention. Among these methods, a method called a magnetic field resonance type or a magnetic resonance type which uses resonance of a magnetic field which has a small influence (small dielectric loss) of energy absorption in a living body is gathering attention.

In the case of a method using a resonance phenomenon in an electric field, a dielectric material is disposed in both of the power supplying unit (power transmitting side) for supplying power by wireless and the power receiving unit (power receiving side) for receiving the power from the power supplying unit by wireless so that an electric field resonance phenomenon occurs between the power supplying unit and the power receiving unit. It is important to use a dielectric material having a dielectric constant of a few tens to over one hundred (much higher than an ordinary one) and having as small a dielectric loss as possible as antennas, and excite a specific vibration mode in the antennas. For example, when a disk antenna is used, coupling is strongest when the oscillation mode around the disk is m=2 or 3.

The electric field resonance type has a shorter power transmission distance than a magnetic field and generates a small amount of heat, but causes a great loss due to electromagnetic waves when there is an obstacle. The magnetic field resonance type is not affected by the electrostatic capacitance of a dielectric body such as a human, causes a small loss due to electromagnetic waves, and has a long power transmission distance than an electric field. In the case of the electric field resonance type, interference (EMI) with signals used on a circuit substrate side needs to be considered when lower frequencies than the millimeter band are used, and when the millimeter band is used, interference with millimeter-wave signal transmission in relation to signals needs to be considered. In the case of the magnetic field resonance type, there is basically little outflow of energy due to electromagnetic waves, and wavelength can be made different from those of the millimeter band, so that the problems of interference with the circuit substrate side and the millimeter-wave signal transmission are solved.

In the case of a system using a resonance phenomenon in a magnetic field, an LC resonator is disposed in both of the power supplying unit (power transmitting side) for supplying power by wireless and the power receiving unit (power receiving side) for receiving the power from the power supplying unit by wireless so that a magnetic field resonance phenomenon occurs between the power supplying unit and the power receiving unit. For example, a part of a loop-type antenna is formed into the shape of a capacitor, which is combined with the inductance of the loop itself to form an LC resonator. The Q-value (strength of resonance) can be increased, and a rate at which power is absorbed by other than the antenna for resonance is low. Thus, the system using the resonance phenomenon in a magnetic field is similar to the electromagnetic induction type in that a magnetic field is used, but is a totally different system in that transmission of a few kW is possible in a state where the power supplying unit and the power receiving unit are more distant from each other than in the electromagnetic induction type.

In the case of the resonance type, regardless of whether the resonance phenomenon in an electric field is used or whether the resonance phenomenon in a magnetic field is used, wavelength $\lambda$ in an electromagnetic field, dimensions of a part forming an antenna (the radius of the disk of a dielectric in an electric field or the radius of a loop in a magnetic field), and a maximum distance for which power transmission is possible (distance D between antennas) are substantially proportional. In other words, it is important to maintain a ratio between the wavelength $\lambda$ of an electromagnetic wave of the same frequency as a frequency at which oscillation is effected, the distance D between the antennas, and the antenna radius r at a substantially constant value. In addition, because of the resonance phenomenon in a near field, it is important to make the wavelength $\lambda$ sufficiently greater than the distance D between the antennas, and make the antenna radius r not too much smaller than the distance D between the antennas.

In the present embodiment, any of the electromagnetic induction type, the radio wave receiving type, and the resonance type can be used as a method of realizing wireless power transmission. However, it is preferable to use a method which uses electromagnetic coils, and in particular, it is preferable to transmit power in a noncontact manner using the resonance phenomenon. Most preferably, a resonance type is used. For example, the power supply efficiency of the electromagnetic induction type is maximized when the central axis of the primary coil and the central axis of the secondary coil are identical to each other, and is decreased when there is an axial displacement. In other words, accuracy of alignment of the primary coil and the secondary coil greatly affects power transmission efficiency. Though depending on the type of electronic device, in a type in which a variation in the relative position between the power transmitting side and the power receiving side can occur, the adoption of the electromagnetic induction type involves difficulties. In the radio wave receiving type and the electric field resonance type, EMI (interference) needs to be taken into consideration. In that respect, the magnetic field resonance type is free from these problems.

Hereinafter, a signal transmission device and an electronic device according to the present embodiment will be described in detail. Although an example in which a large number of functional units are formed on a semiconductor integrated circuit (chip, for example, the CMOS IC) will be described as the most preferred embodiment, the present disclosure is not limited thereto.

Communication Processing System

First Example

FIG. 1 is a diagram illustrating a signal transmission device of the first example, and in particular, illustrates the functional configuration of a signal interface of the signal transmission device of the first example.

[Functional Configuration]

As shown in FIG. 1, a signal transmission device 1A of the first example has a configuration in which an electronic device 101A and a memory card 201A which is an example of a card-type information processing device are coupled by a wireless signal transmission path 9, and signal transmission is performed using the millimeter band. Specifically, a first communication device 100A which is an example of a first wireless device is provided in the electronic device 101A, and a second communication device 200A which is an example of a second wireless device is provided in the memory card 201A. The first and second communication devices 100A and 200A are coupled by the wireless signal transmission path 9, and signal transmission is performed using wireless signals mainly in the millimeter band. In the drawing, a case in which a transmission system is provided on the first communication device 100A side, and a reception system is provided on the second communication device 200A side is illustrated. A semiconductor chip 103 adapted for millimeter-band transmission is provided in the first communication device 100A, and a semiconductor chip 203 adapted for millimeter-band reception is provided in the second communication device 200A. Transmission subject signals are transmitted by frequency-converting into the millimeter band ideal for wideband transmission.

The electronic device 101A is an example of a second electronic device having a slot structure, and the memory card 201A is an example of a first electronic device. The electronic device 101A is one which has a function of reading and writing data from and to the memory card 201A. However, the electronic device 101A may be a card reader and writer provided in a device body and may be one which is used in combination with the main body of an electronic device such as a digital recording and reproducing device as a card reader/writer, a terrestrial television receiver, a mobile phone, a game machine, or a computer. Moreover, the electronic device 101A may be a so-called conversion adapter which is used when the slot structure of a card reader and writer is not compatible with the connector structure of the memory card 201A. The memory card 201A is a removable semiconductor recording medium mainly including a flash memory and reads and writes data from and to the electronic device 101A. The memory card 201A may have an optional shape that is not standardized and may have a standard shape. There are various standards, as is known. Regardless of whether the memory card 201A is a non-standard product or a standard product, higher interface speed is desired as the capacity of the memory card increases.

A slot structure 4A (attachment structure) between the electronic device 101A and the memory card 201A is a structure for allowing the memory card 201A to be attached to and removed from the electronic device 101A. The slot structure 4A has the function of a means for connecting the wireless signal transmission path 9 and a means for fixing the electronic device 101A and the memory card 201A. In general, the slot structure 4A and the memory card 201A have a concavo-convex structure as a position defining portion for defining the attachment state of the memory card 201A by an attachment structure. However, the concavo-convex structure is not essential in the present embodiment (details will be described later).

In the first example, only signals which require high speed and high capacity are subject to communication using the millimeter band, and the other signals which do not require high speed and high capacity and which such as power, can be considered to be direct current are not converted into millimeter-wave signals. Original transmission subject electrical signals before conversion into millimeter-wave will be collectively referred to as a baseband signal. The signals (including power) which are not converted into millimeter-wave signals are electrically connected by a mechanical contact using the terminals of both the electronic device 101A and the memory card 201A similarly to the comparative example described later. Original transmission subject electrical signals before conversion into millimeter-waves will be collectively referred to as a baseband signal. However, the other signals which do not require high speed and high capacity as well as the signals which require high speed and high capacity may also be transmitted via millimeter waves.

Data signals such as movie video or computer images, for example, are data which require high speed and high capacity and which are converted into millimeter-wave signals. Such data are converted into millimeter-band signals of which the carrier frequency is 30 to 300 gigahertz [GHz] and transmitted at high speed. Examples of the electronic device 101A functioning as the main side include a digital recording and reproducing device, a terrestrial television receiver, a portable telephone, a game machine, a computer, a communication device, and the like.

[Main-Side Electronic Device]

The first communication device 100A of the electronic device 101A has a configuration in which the semiconductor chip 103 adapted for millimeter-band transmission and a transmission path coupling unit 108 are mounted on a substrate 102. The semiconductor chip 103 is an LSI (large scale integrated circuit) in which a LSI functional unit 104 and a signal generation unit 107 (millimeter-wave signal generation unit) are integrated. Rather than mounting the semiconductor chip 103 directly on the substrate 102, a semiconductor package in which the semiconductor chip 103 is mounted on an interposer substrate, and the semiconductor chip 103 is molded by a resin (for example, an epoxy resin) may be mounted on the substrate 102. That is, the interposer substrate forms a substrate for chip mounting, and the semiconductor chip 103 is disposed on the interposer substrate. As the interposer substrate, a sheet member which has a relative dielectric constant in a certain range (about 2 to 10) and which is formed by combining, for example, a thermally toughened resin and a copper foil may be used.

The semiconductor chip 103 is connected to the transmission path coupling unit 108. The transmission path coupling unit 108 is an example of a transmitting unit that converts an electrical signal into a wireless signal and transmits the wireless signal to the wireless signal transmission path 9. For example, an antenna structure that includes an antenna coupling unit, an antenna terminal, a micro-strip line, an antenna, and the like is used as the transmission path coupling unit 108. The transmission path coupling unit 108 may also be incorporated into the semiconductor chip 103 by using a technique of directly forming an antenna on a chip. The portion in which the transmission path coupling unit 108 and the wireless signal transmission path 9 couple with each other is a portion where signals are transmitted.

The LSI functional unit 104 includes an application functional unit 105 and a memory card control unit 106 and performs major application control of the first communication device 100A. For example, the application functional unit 105 includes a circuit that processes images or audio data to be transmitted to a counterpart device and also includes a circuit that processes images or audio data received from a counterpart device when bidirectional communication is performed. The memory card control unit 106 includes a control circuit that performs, for example, control of transmission signal level and logical control such as control of data read/write with respect to the memory card 201A in response to requests from the external functional units thereof (the application functional unit 105 in this example) or the internal functional units thereof.

The signal generation unit 107 (electrical signal conversion unit) includes a transmitting-side signal generation unit 110 that converts signals from the LSI functional unit 104 into millimeter-wave signals and controls transmission of signals through the wireless signal transmission path 9. The transmitting-side signal generation unit 110 and the transmission path coupling unit 108 form a transmission system (transmitting unit: transmitting-side communication unit).

The transmitting-side signal generation unit 110 includes a multiplexing processing unit 113, a parallel-serial converter 114, a modulation unit 115, a frequency converter 116, and an amplification unit 117 in order to process an input signal to generate a millimeter-wave signal. The amplification unit 117 is an example of an amplitude adjustment unit that adjusts and outputs the magnitude of the input signal. The modulation unit 115 and the frequency converter 116 may be integrated into a so-called direct conversion system.

When there are a plurality of (N1) signals which are to be communicated using the millimeter band among the signals from the LSI functional unit 104, the multiplexing processing unit 113 integrates the plurality of signals into a signal of one system by performing multiplexing processing such as time division multiplexing, frequency division multiplexing, and code division multiplexing. For example, a plurality of signals requiring high speed and high capacity are used as signals which are to be transmitted via millimeter waves and are integrated into a signal of one system.

The parallel-serial converter 114 converts parallel signals into serial data signals and supplies the serial data signals to the modulation unit 115. The modulation unit 115 modulates the transmission subject signal and supplies the modulated transmission subject signal to the frequency converter 116. When the present embodiment is not applied, the parallel-serial converter 114 is provided when a parallel interface which uses a plurality of parallel transmission signals is used and may not be provided when a serial interface is used.

Basically, the modulation unit 115 may only need to modulate at least one of amplitude, frequency, and phase with the transmission subject signal, and a modulation method which uses an arbitrary combination thereof may be adopted. Examples of an analog modulation method include amplitude modulation (AM) and vector modulation. Examples of vector modulation include frequency modulation (FM) and phase modulation (PM). Examples of a digital modulation method include amplitude shift keying (ASK), frequency shift keying (FSK), phase shift keying (PSK), and amplitude phase shift keying (APSK). Quadrature amplitude modulation (QAM) is a typical example of amplitude phase shift keying.

The frequency converter 116 frequency-converts the transmission subject signal modulated by the modulation unit 115 to generate an electrical signal of the millimeter wave and supplies the electrical signal to the amplification unit 117. The millimeter-wave electrical signal means an electric signal having a frequency in the range of approximately 30 to 300 GHz. The word "approximately" is used because the electrical signal only needs to have such a frequency as to provide the effect of millimeter wave communication, and the lower limit is not limited to 30 GHz, and the upper limit is not limited to 300 GHz.

The frequency converter 116 can employ various circuit configurations. However, for example, the frequency converter 116 only needs to employ a configuration including a frequency mixing circuit (mixer circuit) and a local oscillation circuit. The local oscillation circuit generates a carrier wave (a carrier signal or a reference carrier wave) used for modulation. The frequency mixing circuit multiplies (modulates) the millimeter-band carrier wave generated by the local oscillation circuit with the signal from the parallel-serial converter 114 to generate a millimeter-wave transmission signal and supplies the transmission signal to the amplification unit 117.

The amplification unit 117 amplifies the millimeter-wave electric signal after the frequency conversion and then supplies the amplified millimeter-wave electric signal to the transmission path coupling unit 108. The amplification unit 117 is connected to the bidirectional transmission path coupling unit 108 through an antenna terminal (not shown).

The transmission path coupling unit 108 transmits the millimeter-wave signal generated by the transmitting-side signal generation unit 110 to the wireless signal transmission path 9. The transmission path coupling unit 108 is formed by an antenna coupling unit. The antenna coupling unit constitutes the transmission path coupling unit 108 (an example of a signal coupling unit) or a part thereof. The antenna coupling unit in a narrow sense refers to a portion that couples an electronic circuit within a semiconductor chip with an antenna disposed within or outside the chip, and in a broad sense, refers to a portion that couples signals between the semiconductor chips to the wireless signal transmission path 9. For example, the antenna coupling unit includes at least an antenna structure. The antenna structure refers to a structure of a portion coupled with the wireless signal transmission path 9 and only needs to convert a millimeter-wave electrical signal into electromagnetic waves (radio waves) and couples the radio waves to the wireless signal transmission path 9, and the antenna structure does not mean only an antenna itself.

For example, the antenna coupling unit includes at least an antenna structure. When transmission and reception is performed by time division multiplexing, an antenna switching unit (antenna duplexer) is provided in the transmission path coupling unit 108. The antenna structure refers to a structure of a coupling unit on the memory card 201A sharing the wireless signal transmission path 9 and only needs to couple a millimeter-wave electrical signal to the wireless signal transmission path 9, and the antenna structure does not mean only an antenna itself. For example, the antenna structure includes an antenna terminal, a micro-strip line, and an antenna. When the antenna switching unit is formed within the same chip, the antenna terminal and the micro-strip line excluding the antenna switching unit form the transmission path coupling unit 108. The antenna has a length based on the wavelength λ (for example about 600 μm) of a millimeter-wave signal, and is coupled to the wireless signal transmission path 9. As the antenna, a probe antenna (dipole or the like), a loop antenna, or a small aperture coupling element (slot antenna or the like) in addition to a patch antenna are used.

When the antenna on the electronic device 101A side and the antenna on the memory card 201A side are arranged so as to face each other in a state where the memory card 201A is included in the electronic device 101A, the antennas may be non-directional antennas. When the antennas are arranged so as to be displaced from each other in a planar, directional antennas are used as the antennas, or it is desirable to use a device such as changing the traveling direction of the millimeter-wave signal from the thickness direction of the substrate to a planar direction using a reflecting member or providing a dielectric transmission path for making a millimeter-wave signal travel in the planar direction, for example. The antenna on the transmitting side radiates electromagnetic waves based on the millimeter-wave signal to the wireless signal transmission path 9. The antenna on the receiving side receives the electromagnetic waves based on the millimeter-wave signal from the wireless signal transmission path 9. The micro-strip line establishes a connection between the antenna terminal and the antenna. The micro-strip line transmits a millimeter-wave signal on the transmitting side from the antenna terminal to the antenna, and transmits a millimeter-wave signal on the receiving side from the antenna to the antenna terminal.

The antenna switching unit is used when the antenna is shared for transmission and reception. For example, when a millimeter-wave signal is transmitted to the side of the second communication device 200A which is a counterpart device, the antenna switching unit connects the antenna to the transmitting-side signal generation unit 110. When receiving a millimeter-wave signal from the side of the second communication device 200A which is a counterpart device, the antenna switching unit connects the antenna not shown in the figure to a receiving-side signal generation unit. The antenna switching unit is preferably disposed on the substrate 102 separately from the semiconductor chip 103, but the present disclosure is not limited thereto. The antenna switching unit may be disposed within the semiconductor chip 103. The antenna switching unit may not be provided when a transmitting antenna and a receiving antenna are provided separately from each other.

The wireless signal transmission path 9 may be configured as a free space transmission path so that millimeter-wave signals propagate the internal space of a housing, for example. Moreover, the wireless signal transmission path 9 is preferably formed by a waveguide, a transmission line, a dielectric line, or a waveguide structure within a dielectric material or the like, and has a structure that confines millimeter-band electromagnetic waves in the transmission path and has a property of efficiently transmitting the millimeter-band electromagnetic waves. For example, the wireless signal transmission path 9 may be a dielectric transmission path 9A including a dielectric material having a relative dielectric constant in a certain range and a dielectric loss tangent in a certain range. For example, a dielectric material is filled in the entire housing whereby the dielectric transmission path 9A rather than a free space transmission path is disposed between the transmission path coupling unit 108 and the transmission path coupling unit 208. Moreover, the dielectric transmission path 9A may be formed by connecting the antenna of the transmission path coupling unit 108 and the antenna of the transmission path coupling unit 208 using a dielectric line which is a linear member formed of a dielectric material and having a certain line diameter. As the wireless signal transmission path 9 that confines millimeter-wave signals in a transmission path, a hollow waveguide in which the transmission path is surrounded by a shielding material, and the inside is hollow may be used in addition to the dielectric transmission path 9A.

The "certain ranges" of the relative dielectric constant and the dielectric loss tangent of the dielectric material may only need to be a range such that the effects of the present embodiment can be obtained, and the certain ranges may only need to be ranges of predetermined values. That is, the dielectric material may be one capable of transmitting millimeter-wave signals having characteristics such that the effects of the present embodiment can be obtained. The relative dielectric constant and the dielectric loss tangent of the dielectric material are not definitely determined by the dielectric material itself since they are also related to the length of the transmission path and the frequency of millimeter waves. However, as an example, the relative dielectric constant and the dielectric loss tangent of the dielectric material are as follows. For high-speed transmission of millimeter-wave signals within the dielectric transmission path, it is desirable that the relative dielectric constant of the dielectric material be about 2 to 10 (preferably 3 to 6) and that the dielectric loss tangent of the dielectric material be about 0.00001 to 0.01 (preferably 0.00001 to 0.001). For example, as dielectric materials satisfying such conditions, dielectric materials formed of an acrylic resin base, a urethane resin base, an epoxy resin base, a silicone base, a polyimide base, and a cyanoacrylate resin base can be used. Such ranges of the relative dielectric constant and the dielectric loss tangent of the dielectric material are the same in the present embodiment unless otherwise specified. Moreover, the wireless signal transmission path 9 formed so as to confine millimeter-wave signals in the transmission path is not limited to the dielectric transmission path but may be a hollow waveguide in which the transmission path is surrounded by a shielding material and the inside of the transmission path is hollow.

[Memory Card]

The second communication device 200A of the memory card 201A has a configuration in which the semiconductor chip 203 adapted for millimeter-band reception and a transmission path coupling unit 208 are mounted on a substrate 202. The semiconductor chip 203 is an LSI in which an LSI functional unit 204 and a signal generation unit 207 (electrical signal conversion unit or baseband signal generation unit) are integrated.

The semiconductor chip 203 is connected to the transmission path coupling unit 208 having the same structure as the transmission path coupling unit 108. The transmission path coupling unit 208 is an example of a receiving unit that converts the wireless signal transmitted through the wireless signal transmission path 9 into an electrical signal. The transmission path coupling unit 208 has the same structure as the transmission path coupling unit 108. The transmission path coupling unit 208 receives the millimeter-wave wireless signal from the wireless signal transmission path 9, converts the same into an electrical signal, and outputs the electrical signal to the receiving-side signal generation unit 220. The portion in which the transmission path coupling unit 208 and the wireless signal transmission path 9 couple with each other is a portion where signals are received.

The signal generation unit 207 includes the receiving-side signal generation unit 220 that controls reception of signals through the wireless signal transmission path 9. The receiving-side signal generation unit 220 and the transmission path coupling unit 208 form a reception system (receiving unit: receiving-side communication unit). The signal generation unit 207 converts millimeter-wave signals representing logic control data on the memory card control unit 106 side received through the wireless signal transmission path 9 into original logic control data (baseband signal) and supplies the logic control data to the LSI functional unit 204.

The semiconductor chip 203 is connected to the transmission path coupling unit 208 having the same structure as the transmission path coupling unit 108. The transmission path coupling unit 208 is an example of a receiving unit that converts the wireless signal transmitted through the wireless signal transmission path 9 into an electrical signal. The transmission path coupling unit 208 has the same structure as the transmission path coupling unit 108. The transmission path coupling unit 208 receives the millimeter-wave wireless signal from the wireless signal transmission path 9, converts the same into an electrical signal, and outputs the electrical signal to the receiving-side signal generation unit 220. The portion in which the transmission path coupling unit 208 and the wireless signal transmission path 9 couple with each other is a portion where signals are received.

The receiving-side signal generation unit 220 includes an amplification unit 224, a frequency converter 225, a demodulation unit 226, a serial-parallel converter 227, and a unification processing unit 228 in order to process the millimeter-wave electrical signals received by the transmission path coupling unit 208 to generate an output signal. The amplification unit 224 is an example of an amplitude adjustment unit that adjusts and outputs the magnitude of the input signal. The frequency converter 225 and the demodulation unit 226 may be integrated into a so-called direct conversion system.

The frequency converter 225 and the demodulation unit 226 can employ various circuit configurations. However, the frequency converter 225 and the demodulation unit 226 can use a square-law detecting circuit providing a detection output proportional to the square of amplitude of a received millimeter-wave signal (envelope), for example. When multiple channels are realized by a frequency division multiplexing method, the system using the square-law detecting circuit has the following difficulties. First, in realizing multiple channels by this method, a band-pass filter for frequency selection on the receiving side needs to be disposed in a stage preceding the square-law detecting circuit, but it is not easy to realize a steep band-pass filter in small size. In addition, the square-law detecting circuit is disadvantageous in terms of sensitivity, and is affected by a frequency variation component of a carrier wave in realizing multiple channels by the frequency division multiplexing system. Thus, strict specifications are required also for stability of the carrier wave on the transmitting side, and the modulation system is limited to a system such that effects of frequency variations can be ignored (for example OOK: On-Off Keying) or the like.

In addition, the oscillating circuit has the following difficulties. When an ordinary method as used in outdoor radio communication is to be used on the transmitting side and the receiving side in transmitting data by the millimeter wave, stability is required of the carrier wave, and a highly stable millimeter wave vibrator whose frequency stability is on the order of ppm (parts per million) is required. When a millimeter wave vibrator of high stability is to be implemented on a silicon integrated circuit (CMOS: Complementary Metal Oxide Semiconductor), since a silicon substrate used in ordinary CMOS has a low insulation quality, a high-Q tank circuit cannot be formed easily, and the millimeter wave vibrator of high stability is not implemented easily. For example, when an inductance is formed on a CMOS chip, the Q is about 30 to 40. Thus, in general, to realize a vibrator of high stability as required in radio communication, there is no choice but to adopt a method of forming a high-Q tank circuit by a crystal vibrator or the like outside the CMOS at a low frequency, multiplying the oscillation output, and thereby raising the oscillation output to the millimeter band. However, it is not desirable to provide such an external tank to all chips in order to realize a function of replacing signal transmission by wirings for LVDS (Low Voltage Differential Signaling) or the like with signal transmission by the millimeter wave.

As a measure against such problems, the frequency converter 225 and the demodulation unit 226 preferably employ an injection locking method. When the injection locking method is employed, a reference carrier wave, which corresponds to a carrier signal used for modulation and is used as a reference for injection locking on the receiving side, is sent out in conjunction with a signal modulated into the millimeter band from the transmitting side. The reference carrier signal is typically a carrier signal itself used for modulation, but is not limited thereto. The reference carrier signal may be a signal of another frequency (for example a harmonic signal) which signal is synchronized with a carrier signal used for modulation, for example. A local vibrator is provided on the receiver side. A transmitted reference carrier wave component is injection-locked into the local vibrator. A transmitted transmission subject signal is reconstructed using the output signal of the local vibrator. For example, the received signal is input to the local vibrator for synchronization with the reference carrier wave. The reference carrier wave and the received signal are input to a mixing circuit to generate a multiplication signal. A high-frequency component of the multiplication signal is removed by a low-pass filter, whereby the waveform of an input signal (baseband signal) transmitted from the transmitting side is obtained.

By thus using injection locking, the local vibrator on the receiving side may have a low Q, and required specifications for stability of the reference carrier wave on the transmitting side can be relaxed. Thus, a receiving function can be realized simply even with a higher carrier frequency. The local vibrator on the receiving side reproduces a signal synchronized with the reference carrier wave on the transmitting side, and supplies the signal to the mixing circuit. Then synchronous detection is performed. Thus, it is not necessary to provide a band-pass filter (frequency selecting filter) in a stage preceding the mixing circuit. In addition, on the receiver side, the receiving side local vibrator can be formed by providing a tank circuit on a semiconductor chip without a tank circuit being used outside the semiconductor chip of a CMOS configuration. A transmitted millimeter wave modulated signal is demodulated using an output signal obtained by supplying a reference carrier signal component transmitted from the transmitting side to the receiving side local vibrator and thereby injection-locking the reference carrier signal component, so that a transmitted input signal can be reconstructed.

The transmission path coupling unit 208 is connected to the receiving-side signal generation unit 220. The receiving-side amplification unit 224 is connected to the transmission path coupling unit 208 so as to amplify the millimeter-wave electrical signals received by an antenna and supply the same to the frequency converter 225. The frequency converter 225 frequency-converts the amplified millimeter-wave electrical signals and supplies the frequency-converted signals to the demodulation unit 226. The demodulation unit 226 demodulates the frequency-converted signals to acquire a baseband signal and supplies the baseband signal to the serial-parallel converter 227.

The serial-parallel converter 227 converts the serial received signals into parallel output data and supplies the parallel output data to the unification processing unit 228. When the present embodiment is not applied, similarly to the parallel-serial converter 114, the serial-parallel converter 227 is provided when a parallel interface which uses a plurality of parallel transmission signals is used. When signal transmission between the first communication device 100A and the second communication device 200A is originally realized in a serial format, the parallel-serial converter 114 and the serial-parallel converter 227 may not be provided.

When signal transmission between the first communication device 100A and the second communication device 200A is originally realized in a parallel format, the number of signals as objects for millimeter wave conversion is reduced by subjecting an input signal to parallel-serial conversion and transmitting the result to the semiconductor chip 203 side, and subjecting a received signal from the semiconductor chip 203 side to serial-parallel conversion.

The unification processing unit 228 corresponds to the multiplexing processing unit 113. The unification processing unit 228 separates the signal integrated in one system into a plurality of signals_@ (@ is 1 to N). For example, the unification processing unit 228 separates the plurality of data signals integrated in the signal of one system into each separate data signal, and then supplies each separate data signal to the LSI functional unit 204.

The LSI functional unit 204 performs major application control of the second communication device 200A and pairs up with the LSI functional unit 104 of the first communication device 100A to perform reverse processing. In this example, the LSI functional unit 204 includes a circuit that processes various kinds of signals (image data or audio data) received from a counterpart device and a control circuit that performs, for example, control of the reception gain and logical control such as data read/write control with respect to requests from the external or internal functional units thereof. The LSI functional unit 204 is different from the LSI functional unit 104 in that the application functional unit 105 is replaced with a memory functional unit 205 and the memory card control unit 106 is replaced with a memory control unit 206. The memory functional unit 205 is a nonvolatile storage medium provided by a flash memory or a hard disk, for example. The memory control unit 206 performs data read and write control on the memory functional unit 205 in response to logical control data from the electronic device 101A side.

The LSI functional unit 104 and the signal generation unit 107 may not be integrated with each other. For example, in the figure, in the first communication device 100A, a connection IF unit 109 (IF: interface) may be provided between the LSI functional unit 104 and the signal generation unit 107 so that the substrate 102 is divided into two parts at that portion (see the broken line in the figure). Moreover, a substrate on the LSI functional unit 104 side, the signal generation unit 107, and a substrate on the transmission path coupling unit 108 side may be connected by the connection IF unit 109. On the second communication device 200A side, the LSI functional unit 204 may be divided into the signal generation unit 207 and the transmission path coupling unit 208 side. That is, in the second communication device 200, a connection IF unit 209 may be provided between the LSI functional unit 204 and the signal generation unit 207 so that the substrate 202 is divided into two parts at that portion (see the broken line in the figure). Moreover, a substrate on the LSI functional unit 204 side, the signal generation unit 207, and a substrate on the transmission path coupling unit 208 side may be connected by the connection IF unit 209. A wire harness, for example, may be used as the connection IF units 109 and 209. However, when the LSI functional unit 204 and the signal generation unit 207 are separated from each other, since problems may occur due to signal transmission through electric wirings, they are preferably integrated with each other.

Although not shown in the drawing, the first communication device 100A or the second communication device 200A may include a setting value processing unit that inputs setting values for the predetermined signal processing to the respective functional units (in particular, those functioning as a signal processing unit) of the first communication device 100A or the second communication device 200A. The setting value processing unit includes a setting value determination unit, a setting value storage unit, and an operation control unit, for example. The setting value determining unit determines setting values (variables and parameters) for designating the operations (that is, the overall operation of the first communication device 100A or the second communication device 200A) of the respective functional units of the semiconductor chip 103 or the semiconductor chip 203. The process of determining the setting values is performed at the time of shipping a product at a factory, for example. The setting value storage unit stores the setting values determined by the setting value determination unit. The operation control unit operates the respective functional units (in this example, the modulation unit 115, the frequency converter 116, the amplification unit 117, and the like) of the semiconductor chip 103 or the respective functional units (in this example, the amplification unit 224, the frequency converter 225, the demodulation unit 226, and the like) of the semiconductor chip 203 based on the setting values read from the setting value storage unit.

Although the setting value processing unit may be disposed on the substrate 102 on which the semiconductor chip 103 is mounted or the substrate 202 on which the semiconductor chip 203 is mounted, and may be mounted on a substrate different from the substrate 102 or the substrate 202. In addition, although the setting value processing unit may be provided outside the semiconductor chip 103 or 203, the setting value processing unit may be included in the semiconductor chip 103 or 203. In this case, the setting value processing unit is mounted on the same substrate as the substrate 102 or 202 on which the respective functional units (the modulation unit 115, the frequency converter 116, and the amplification unit 117 for the semiconductor chip 103, and the amplification unit 224, the frequency converter 225, and the demodulation unit 226 for the semiconductor chip 203) serving as the control subjects are mounted.

[Dealing with Bidirectional Communication]

Since the signal generation unit 107 and the transmission path coupling unit 108, or the signal generation unit 207 and the transmission path coupling unit 208 are configured to transmit data bidirectionally, they can deal with bidirectional communication. For example, the signal generation units 107 and 207 are provided with a receiving-side signal generation unit and a transmitting-side signal generation unit, respectively. Although the transmission path coupling units 108 and 208 may be provided separately on the transmitting side and the receiving side, the transmission path coupling units 108 and 208 may be shared for both transmission and reception.

Moreover, "bidirectional communication" in this embodiment is single-core bidirectional transmission where the wireless signal transmission path 9 which is a millimeter-wave transmission channel is one system (one core). In order to realize this, a half-duplex method based on time division multiplexing (TDD: Time Division Duplex), frequency division multiplexing (FDD: Frequency Division Duplex), and the like may be used. In the case of time division multiplexing, since separation of transmission and reception is performed on a time division basis, "synchronism of bidirectional communication (single-core simultaneous bidirectional transmission)" in which signal transmission from the electronic device 101A to the memory card 201A and signal transmission from the memory card 201A to the electronic device 101A are performed simultaneously is not achieved, but single-core simultaneous bidirectional transmission is achieved by frequency division multiplexing or code division multiplexing. Since frequency division multiplexing uses different frequencies for transmission and reception, the transmission bandwidth of the wireless signal transmission path 9 needs to be widened.

In the case of time division multiplexing or code division multiplexing, the multiplexing processing unit 113 may be provided in a preceding stage of the parallel-serial converter 114 so as to supply the integrated signal of one system to the parallel-serial converter 114. In the case of time division multiplexing, a selector switch may be provided so as to finely divide time for a plurality of signals_@ (@ is 1 to N) and supply the signal to the parallel-serial converter 114. In the case of code division multiplexing, a circuit may be provided so as to superimpose codes for distinguishing the plurality of signals_@ and integrate the signals. On the other hand, in the case of frequency division multiplexing, it is necessary to generate millimeter-wave signals by converting the plurality of signals_@ into frequencies in the range of respective different frequency bands F_@. Thus, for example, it is desirable to provide the parallel-serial converter 114, the modulation unit 115, the frequency converter 116, and the amplification unit 117 for each of the plurality of signals_@, and provide an addition processing unit as the multiplexing processing unit 113 in the subsequent stage of each amplification unit 117. Then, the millimeter-wave electric signals in frequency bands F_1+ . . . +F_N after frequency multiplexing processing may be supplied to the transmission path coupling unit 108. As is understood from this, the transmission bandwidth needs to be widened in the case of frequency division multiplexing that integrates signals of a plurality of systems into one system by frequency division multiplexing. The transmission bandwidth needs to be further widened in the case of using both the method of integrating signals of a plurality of systems into one system by frequency division multiplexing and a full-duplex method which uses different frequencies for transmission and reception.

Moreover, when the signals are integrated into one system by frequency division multiplexing, the millimeter-wave electric signals in frequency bands F_1+ . . . +F_N after frequency multiplexing processing need to be received and processed in the separate frequency bands F_@. Thus, it is desirable to provide amplification units 224, frequency converters 225, demodulation units 226, and serial-parallel converters 227 separately for the plurality of signals_@, and provide a frequency separating unit as unification processing unit 228 in the preceding stage of each amplification unit 224. Then, the millimeter-wave electric signal in each frequency band F_@ after separation may be supplied to the system of the corresponding frequency band F_@. When the semiconductor chip 103 is formed in this way, the number of signals to be converted into millimeter waves is reduced by subjecting an input signal to parallel-serial conversion and transmitting the result to the semiconductor chip 203 side, and subjecting signals received on the semiconductor chip 203 side to serial-parallel conversion.

[Connection and Operation]

A method of frequency-converting an input signal and performing signal transmission is commonly used in broadcasting and wireless communication. In these applications, relatively complex transmitters and receivers and the like capable of dealing with problems of how far communication can be attained (problem of S/N with respect to thermal noise), how to cope with reflection and multiple paths, and how to suppress disturbance and interference with other channels, for example, are used. In contrast, the signal generation units 107 and 207 used in the present embodiment are used in the millimeter band of a higher frequency band than usable frequencies of complex transmitters and receivers and the like commonly used in broadcasting and wireless communication. Because of short wavelength λ, frequency reuse is easily made, and signal generation units suitable for performing communication between many adjacent devices are used.

As shown in FIG. 1, the slot structure 4A contributes to the signal generation unit 107 and the transmission path coupling unit 108 on the electronic device 101A side, the signal generation unit 207 and the transmission path coupling unit 208 on the memory card 201A side, and the wireless signal transmission path 9 (dielectric transmission path 9A). The dielectric transmission path 9A is provided between the transmission path coupling unit 108 and the transmission path coupling unit 208.

In the present embodiment, unlike a signal interface using electric wirings according to the related art, it is possible to flexibly deal with high speed and high capacity by performing signal transmission using the millimeter band as described above. For example, in the first embodiment, only signals requiring high speed and high capacity are subject to communication using the millimeter band, and the electronic device 101A and the memory card 201A have, in a part thereof, an interface (connection by terminals or connectors) using electric wirings of the related art for low-speed and low-volume signals and for power supply. Since clock signals and a plurality of data signals are subject to signal transmission using the millimeter waves, terminals thereof can be removed.

The signal generation unit 107 is an example of a signal processing unit that performs predetermined signal processing. In this example, the signal generation unit 107 generates millimeter-wave signals by processing input signals input from the memory card control unit 106. The signal generation unit 107 is connected to the transmission path coupling unit 108 by a transmission line such as a micro-strip line, a strip line, a coplanar line, or a slot line, for example. The generated millimeter-wave signals are supplied to the wireless signal transmission path 9 through the transmission path coupling unit 108 as electromagnetic waves (radio waves or wireless signals).

The transmission path coupling unit 108 has an antenna structure. The transmission path coupling unit 108 has a function of converting the transmitted millimeter-wave electric signals into electromagnetic waves and transmitting the electromagnetic waves. The transmission path coupling unit 108 is coupled to the wireless signal transmission path 9. The electromagnetic waves converted by the transmission path coupling unit 108 are supplied to one end of the wireless signal transmission path 9. The transmission path coupling unit 208 on the second communication device 200A side is coupled to the other end of the wireless signal transmission path 9. By providing the wireless signal transmission path 9 between the transmission path coupling unit 108 on the first communication device 100A side and the transmission path coupling unit 208 on the second communication device 200A side, the electromagnetic waves mainly in the millimeter band propagate through the wireless signal transmission path 9.

The transmission path coupling unit 208 on the second communication device 200A side is coupled to the wireless signal transmission path 9. The transmission path coupling unit 208 receives the electromagnetic waves transmitted to the other end of the wireless signal transmission path 9, converts the electromagnetic waves into millimeter-wave signals, and then supplies the millimeter-wave signals to the signal generation unit 207 (baseband signal generation unit). The signal generation unit 207 is an example of a signal processing unit that performs predetermined signal processing. In this example, the signal generation unit 207 processes the converted millimeter-wave signals to generate an output signal (baseband signal) and supplies the output signal to the memory functional unit 205.

While a case of signal transmission from the first communication device 100A to the second communication device 200A has been described, by configuring the first and second communication devices 100A and 200A so as to be capable of dealing with bidirectional communication, data read from the memory functional unit 205 of the memory card 201A can be transmitted to the electronic device 101A.

Communication Processing System

Second Example

Figure 2:
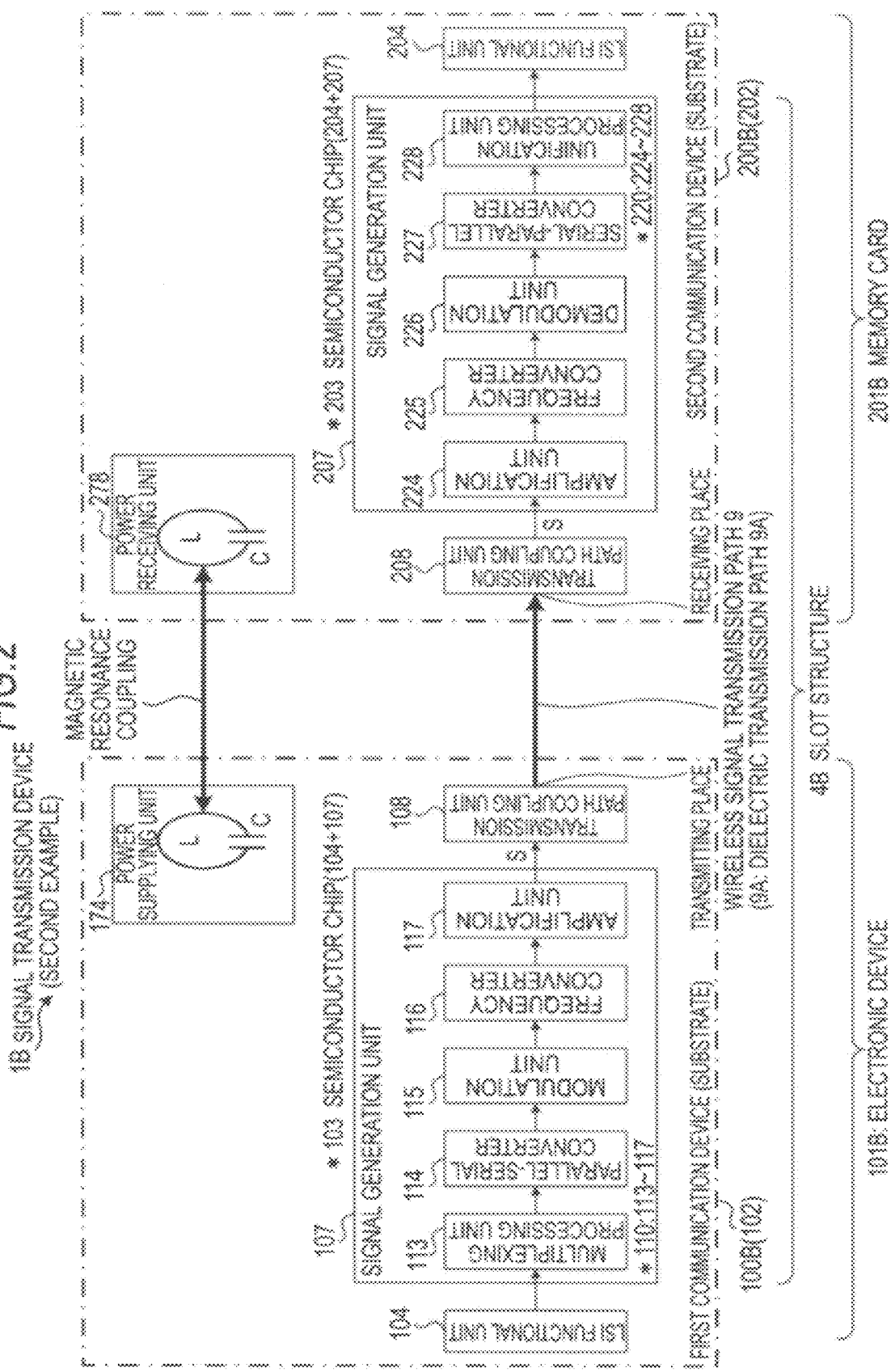
FIG. 2 is a diagram illustrating a signal transmission device of a second example.

FIG. 2 is a diagram illustrating a signal transmission device of the second example, and in particular, illustrates the functional configuration of a signal interface of the signal transmission device of the second example.

A signal transmission device 1B of the second embodiment is based on the signal transmission device 1A (the connection IF units 109 and 209 are not illustrated) of the first embodiment, and power which require power transmission is also transmitted by wireless. That is, a configuration of supplying power used by the second communication device 200B side from the first communication device 100B by wireless is added.

The first communication device 100B includes a power supplying unit 174 which is an example of a power transmitting terminal that supplies power used by the second communication device 200B by wireless. The configuration of the power supplying unit 174 will be described later. The second communication device 200B includes a power receiving unit 278 (power receiving device) which is an example of a power receiving terminal that receives power transmitted by wireless from the first communication device 100B side. The power transmitting-side power supplying unit 174 and the power receiving-side power receiving unit 278 will be collectively referred to as a power circuit. The power supplying unit 174 and the power receiving unit 278 form a power transmitting unit (that is, noncontact power transmission device) that transmits power by wireless between the first communication device 100 and the second communication device 200. Although the configuration of the power receiving unit 278 will be described later, in any case, the power receiving unit 278 is configured to generate power voltage used on the second communication device 200B side and supply the power voltage to the semiconductor chip 203 or the like. From the functional configuration, the second example is different from the first example in that power is also transmitted by wireless, and description of the other configurations will not be provided.

Various methods of transmitting power from a power supply device (also referred to as a power feeding device or a power transmitting terminal) to a power receiving device (also referred to as a power receiving device or a power receiving terminal) in a wireless (noncontact) manner have been proposed. The method of transmitting power in a noncontact manner is referred to as "noncontact feeding" "wireless feeding," "wireless power transmission," and the like. In principle, the noncontact power transmission uses electromagnetic energy and is mainly classified into a radiation type (radio wave receiving type and radio wave harvesting type) and a non-radiation type. The radiation type is further classified into a microwave type and a laser type, and the non-radiation type is further classified into an electromagnetic induction type and a resonance type (also referred to as an electromagnetic resonance type). The use of any of the methods can completely eliminate the need for an interface which uses electric wirings or terminals, and a cableless device configuration can be obtained. All signals including power can be transmitted by wireless from the first communication device 100B to the second communication device 200B.

For example, the radio wave receiving type uses the energy of radio waves, and converts an alternating-current waveform obtained by receiving radio waves into a direct-current voltage using a rectifier circuit. The radio wave receiving type has an advantage in that it is possible to transmit power irrespective of the frequency band (for example, millimeter waves may be used). Though not shown in the figure, the power supplying unit (transmission side) for supplying power by wireless is provided with a transmitting circuit for transmitting radio waves in a certain frequency band. The power receiving unit (receiving side) for receiving the power from the power supplying unit by wireless is provided with a rectifier circuit for rectifying the received radio waves. Though depending on transmission power, the received voltage is low, and a rectifier diode with as low a forward voltage as possible (for example a Schottky diode) is desirably used for the rectifier circuit. Moreover, a resonant circuit may be formed in a stage preceding the rectifier circuit to increase the voltage and then perform rectification. In the radio wave receiving type in ordinary outdoor use, much of the transmission power is spread as radio waves, and thus power transmission efficiency decreases. However, this problem can be solved by combining a configuration capable of limiting a range of transmission (for example a wireless signal transmission path having a confining structure).

The electromagnetic induction type uses electromagnetic coupling of coils and induced electromotive force. Though not shown in the figure, the power supplying unit (a power transmitting side or a primary side) for supplying power by wireless is provided with a primary coil, and the primary coil is driven at a relatively high frequency. The power receiving unit (a power receiving side or a secondary side) for receiving the power from the power supplying unit by wireless is provided with a secondary coil at such a position as to face the primary coil, and is also provided with a rectifier diode, capacitors for resonance and smoothing, and the like. For example, the rectifier diode and the smoothing capacitor form a rectifier circuit. When the primary coil is driven at a high frequency, an induced electromotive force is generated in the secondary coil electromagnetically coupled to the primary coil. The rectifier circuit generates a direct-current voltage on the basis of the induced electromotive force. At this time, power reception efficiency is enhanced by using a resonance effect. When the electromagnetic induction type is adopted, the power supplying unit and the power receiving unit are brought into proximity to each other, other members (metal in particular) are prevented from being interposed between the power supplying unit and the power receiving unit (specifically between the primary coil and the secondary coil), and electromagnetic shielding is provided for the coils. The former is to prevent heating of the metal (according to principles of electromagnetic induction heating), and the latter is to take a measure against electromagnetic interference with other electronic circuits. The electromagnetic induction type can transmit high power, but needs to bring the transmitter and the receiver into proximity to each other (for example a distance of 1 cm or less), as described above.

The resonance type is a method of transmitting power using coupling based on resonance (oscillation) of an electric field or a magnetic field between a resonator (resonance element) provided in the power supply device for supplying power and a resonator (resonance element) provided in the power receiving device for receiving power supplied from the power supply device. That is, the resonance type applies the same principle as a phenomenon in which two vibrators (pendulums or tuning forks) resonate, and uses a resonance phenomenon in a near field in one of an electric field and a magnetic field rather than electromagnetic waves. The resonance type uses a phenomenon in which when one (corresponding to the power supplying unit) of the two vibrators having the same natural frequency is oscillated, and only a small vibration is transmitted to the other vibrator (corresponding to the power receiving unit), the other vibrator starts vibrating greatly due to the resonance phenomenon. The method which uses resonance of an electric field will be referred to as an electric field resonance type, and the method which uses resonance of a magnetic field will be referred to as a magnetic field resonance type. In recent years, "resonance-type methods" using resonance of an electric field or a magnetic field which is advantages in efficiency, transmission distance, positional error, angular error, and the like are gathering attention. Among these methods, a method called a magnetic field resonance type or a magnetic resonance type which uses resonance of a magnetic field which has a small influence (small dielectric loss) of energy absorption in a living body is gathering attention.

Though not shown in the figure, in the case of a method using a resonance phenomenon in an electric field, a dielectric material is disposed in both of the power supplying unit (power transmitting side) for supplying power by wireless and the power receiving unit (power receiving side) for receiving the power from the power supplying unit by wireless so that an electric field resonance phenomenon occurs between the power supplying unit and the power receiving unit. It is important to use a dielectric material having a dielectric constant of a few tens to over one hundred (much higher than an ordinary one) and having as small a dielectric loss as possible as antennas, and excite a specific vibration mode in the antennas. For example, when a disk antenna is used, coupling is strongest when the oscillation mode around the disk is m=2 or 3.

In the present embodiment, although any of the electromagnetic induction type, the radio wave receiving type, and the resonance type can be used as a method of realizing wireless power transmission, a configuration of using a magnetic field resonance type is illustrated in FIG. 2. Basically, any of the electromagnetic induction type, the radio wave receiving type, and the resonance type can be used, the signal transmission device 1 of the second example uses the resonance type which uses a resonance phenomenon in a magnetic field as shown in the figure considering the characteristics of respective methods. For example, the power supply efficiency of the electromagnetic induction type is maximized when the central axis of the primary coil and the central axis of the secondary coil are identical to each other, and is decreased when there is an axial displacement. In other words, accuracy of alignment of the primary coil and the secondary coil greatly affects power transmission efficiency. Though depending on the type of electronic device, in a type in which a variation in the relative position between the power transmitting side and the power receiving side can occur, the adoption of the electromagnetic induction type involves difficulties. In the radio wave receiving type and the electric field resonance type, EMI (interference) needs to be taken into consideration. In that respect, the magnetic field resonance type is free from these problems.

As shown in FIG. 2, in the case of a method which uses a resonance phenomenon in a magnetic field, an LC resonator is disposed in both of the power supplying unit 174 (power transmitting side) for supplying power by wireless and the power receiving unit 278 (power receiving side) for receiving the power from the power supplying unit 174 by wireless so that a magnetic field resonance phenomenon occurs between the power supplying unit 174 and the power receiving unit 278. For example, a part of a loop-type antenna is formed into the shape of a capacitor, which is combined with the inductance of the loop itself to form an LC resonator. The Q-value (strength of resonance) can be increased, and a rate at which power is absorbed by other than the antenna for resonance is low. Thus, the method using the resonance phenomenon in a magnetic field is similar to the electromagnetic induction type in that a magnetic field is used, but is a totally different system in that transmission of a few kW is possible in a state where the power supplying unit 174 and the power receiving unit 278 are more distant from each other than in the electromagnetic induction type.

<Radio-Wave Transmission Structure: Basic>

Figure 6A:
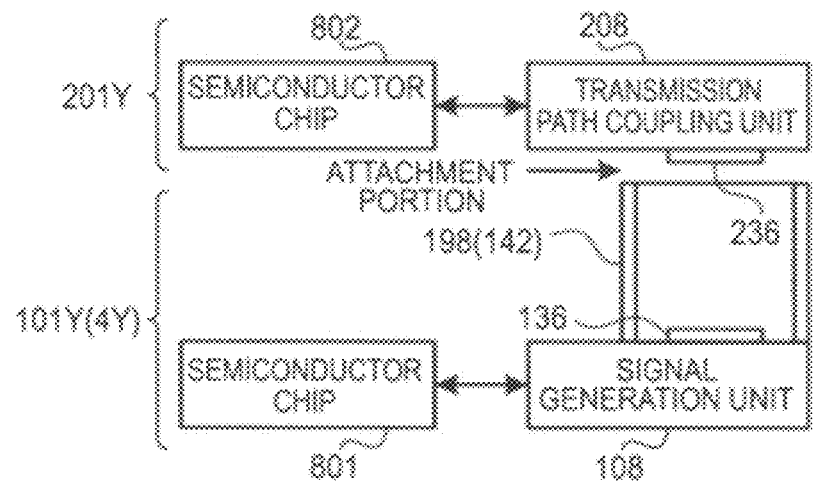
FIGS. 6A to 6B are diagrams illustrating the second comparative example of the radio-wave transmission structure according to the present embodiment.
Figure 6B:
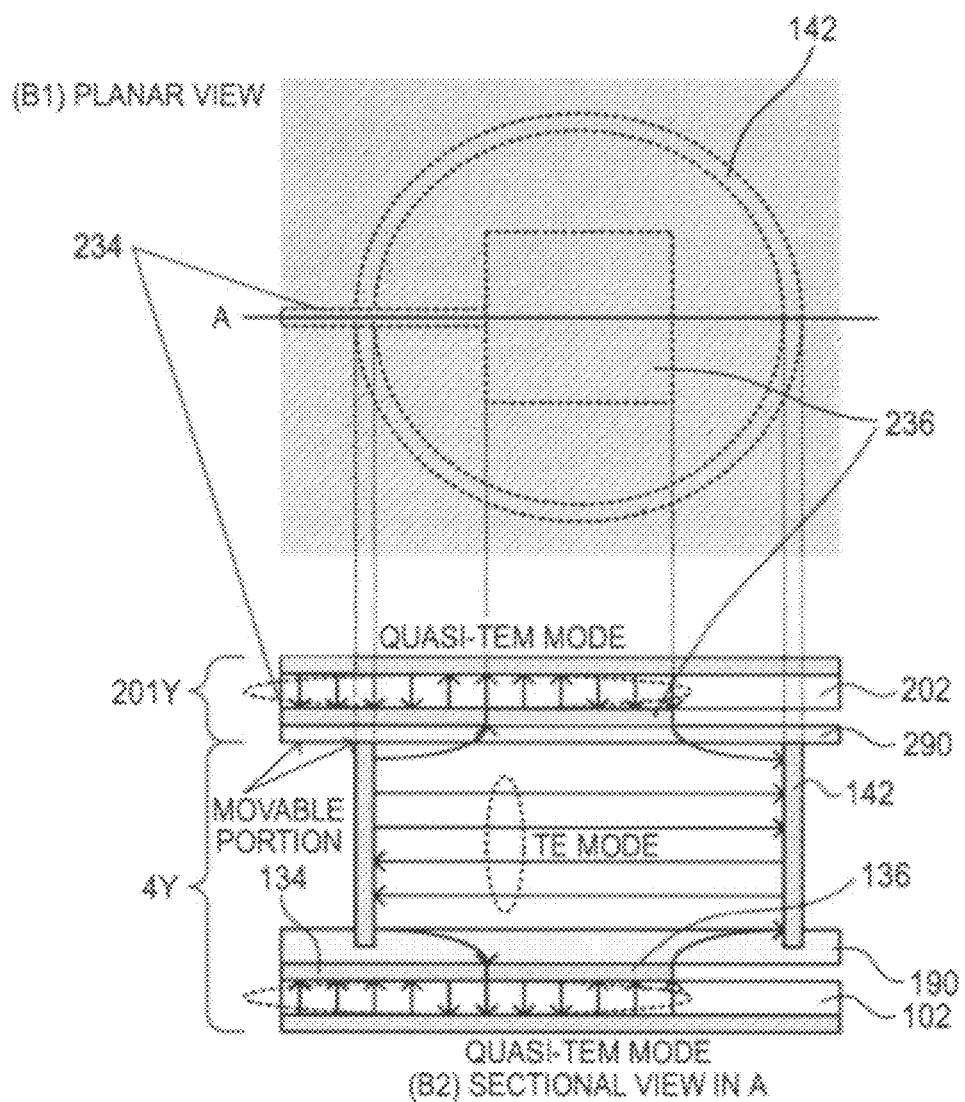
Figure 7A:
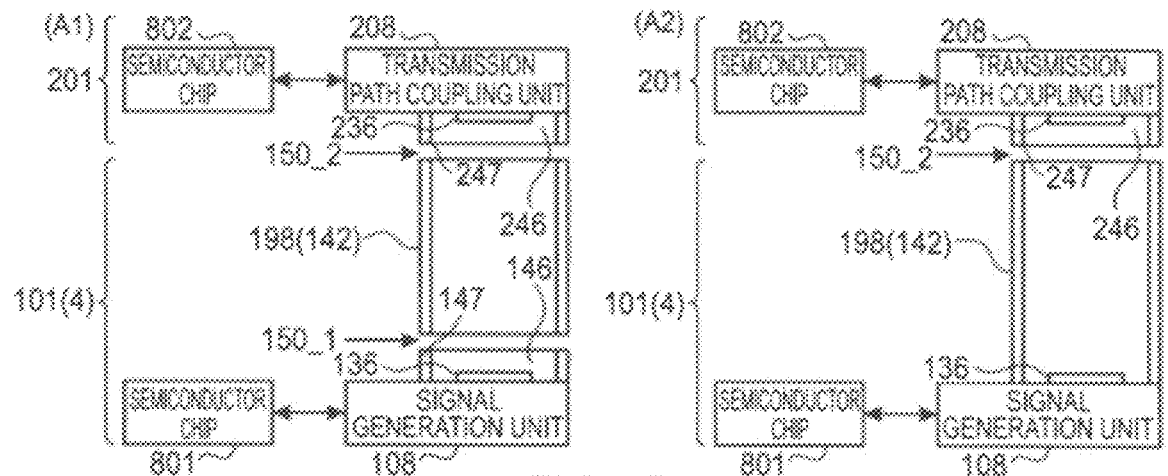
FIGS. 7A and 7B are diagrams illustrating a basic configuration of the radio-wave transmission structure according to the present embodiment.
Figure 7B:
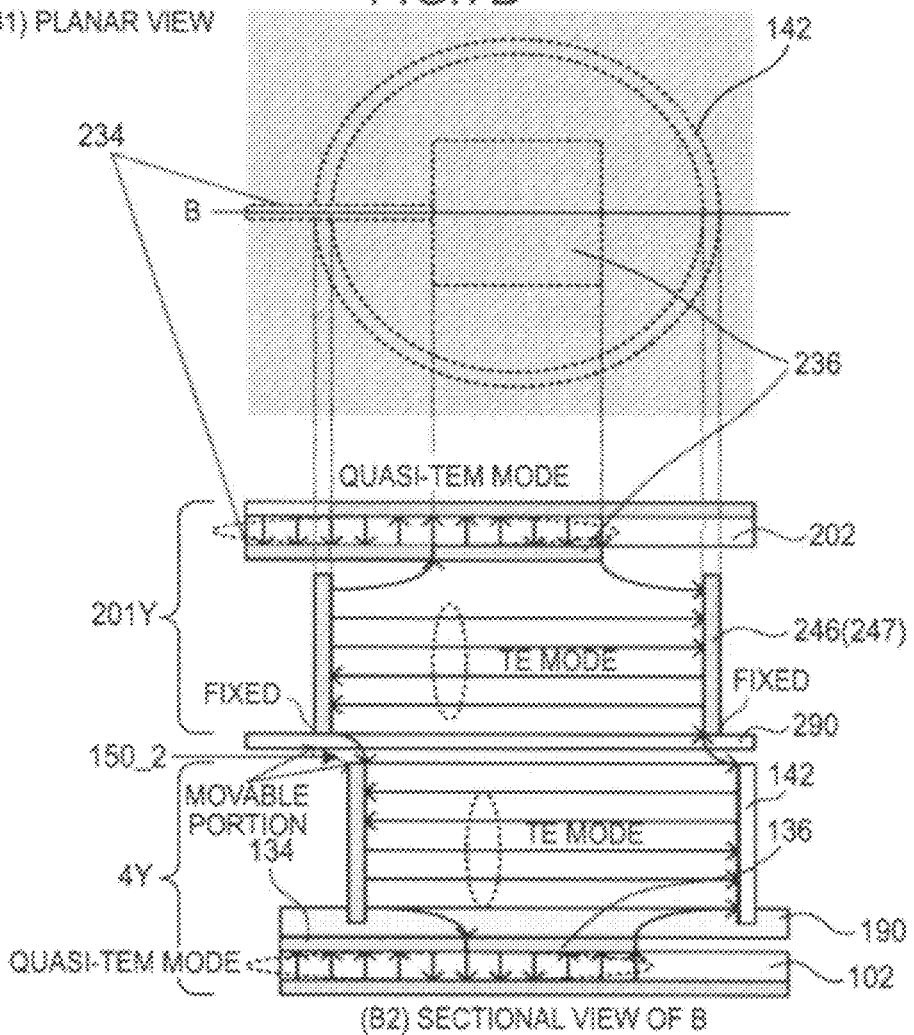

FIGS. 3 to 7B are diagrams illustrating a structure (radio-wave transmission structure) of a signal transmission device for transmitting radio waves in an attachment portion between an electronic device having a slot structure and a memory card. FIGS. 3 to 4C are diagrams illustrating a first comparative example of the radio-wave transmission structure according to the present embodiment. In particular, FIG. 3 is a diagram illustrating a functional configuration of a signal interface of the signal transmission device of the first comparative example. FIGS. 4A to 4C are diagrams illustrating an electronic device of the first comparative example to which the first comparative example of the radio-wave transmission structure of the present embodiment is applied. FIGS. 5A to 5C are diagrams illustrating an electronic device of the second comparative example to which the second comparative example of the radio-wave transmission structure of the present embodiment is applied. FIGS. 6A and 6B are diagrams illustrating the second comparative example of the radio-wave transmission structure of the present embodiment. FIGS. 7A and 7B are diagrams illustrating a basic configuration of the radio-wave transmission structure of the present embodiment.

In any of the drawings, an application example in which signals are transmitted between electronic devices when one electronic device is attached to the other electronic device is illustrated. For example, a card-type information processing device generally represented by a so-called IC card or a so-called memory card in which a central processing unit (CPU) and a nonvolatile storage device (for example, a flash memory) are included is configured to be attached (removably attached) to a body-side electronic device. The card-type information processing device which is an example of one (first) electronic device will also be referred to as a "card-type device." The other (second) electronic device on the main side will be simply referred to as an "electronic device." The card-type device and the main-side electronic device form an entire electronic device.

First Comparative Example

As shown in FIG. 3, a signal transmission system 1X mounted on the electronic device according to the first comparative example is configured such that an electronic device 101X and a memory card 201X are coupled to each other through an electrical interface 9X to perform signal transmission. The electronic device 101X has a semiconductor chip 103X capable of transmitting signals through electric wirings. The memory card 201X also has a semiconductor chip 203X capable of transmitting signals through electric wirings. The wireless signal transmission path 9 of the signal transmission device 1 according to the present embodiment is replaced with the electrical interface 9X.

An exemplary structure (planar and cross-sectional perspective view) of a memory card 201X is illustrated in FIG. 4A. An exemplary structure (planar and cross-sectional perspective view) of an electronic device 101X is illustrated in FIG. 4B. An exemplary structure (cross-sectional perspective view) when the memory card 201X is inserted into a slot structure 4X (in particular, an opening 192) of the electronic device 101X is illustrated in FIG. 4C.

The memory card 201X reads and writes data from and to the electronic device 101X. There are various specifications for the memory card. Higher interface speed is desired with increases in capacity. A certain standard product, for example, has achieved a physical transmission rate of 480 Mbps by parallel transmission of 8 terminals*60 MHz. When the memory card 201X is used, the electronic device 101X generally has the slot structure 4X in order to connect the memory card 201X to the electrical interface 9X. The slot structure 4X also has the function of a means for fixing the memory card 201X.

In order to perform signal transmission through the electric wirings, the electronic device 101X has an electrical signal conversion unit 107X in place of the signal generation unit 107 and the transmission path coupling unit 108, and the memory card 201X has an electrical signal conversion unit 207X in place of the signal generation unit 207 and the transmission path coupling unit 208. The electronic device 101X has a semiconductor chip 801 which is disposed on a surface of the substrate 102 close to the opening 192. The semiconductor chip 801 is configured to be capable of performing bidirectional communication by incorporating functions equivalent to the LSI functional unit 104 and the electrical signal conversion unit 107Z. The memory card 201X has a semiconductor chip 802 which is disposed on one surface of the substrate 202. The semiconductor chip 802 is configured to be capable of performing bidirectional communication by incorporating functions equivalent to the LSI functional unit 204 and the electrical signal conversion unit 207Z.

The electrical signal conversion unit 107X in the electronic device 101X controls electric signal transmission through the electrical interface 9X with respect to logical control data of the memory card control unit 106. On the other hand, the electrical signal conversion unit 207Z in the memory card 201X is accessed through the electrical interface 9X and obtains the logical control data transmitted from the memory card control unit 106. The slot structure 4X between the electronic device 101X and the memory card 201X is a structure for attaching and detaching the memory card 201X to and from the electronic device 101X. The slot structure 4X has the function of a means for connecting the electrical interface 9X and the function of a means for fixing the electronic device 101X and the memory card 201X.

As shown in FIG. 4B, the slot structure 4X has an elastic member 199 (for example, a spring mechanism) in a part of a housing 190, and is formed such that the memory card 201X can be inserted into and removed from the housing 190 on the side of the electronic device 101X from the opening 192 and fixed to the housing 190. The electronic device 101X and the memory card 201X have a concavo-convex structure as an attachment structure. Where the concave structure and the convex structure will be formed is optional. In this example, as shown in FIG. 4B, a convex structure 198X (protrusion) which forms an alignment structure is formed on the housing 190 of the electronic device 101X, and as shown in FIG. 4A, a concave structure 298X (depression) which forms an alignment structure is formed on the housing 290 of the memory card 201X. That is, as shown in FIG. 4C, the convex structure 198X is disposed in a portion of the housing 190 corresponding to the position of the concave structure 298X when the memory card 201X is inserted into the housing 190.

As shown in FIG. 4A, on one side of the substrate 202, connection terminals 280 (signal pins) for connecting to the electronic device 101X as an external device at a determined position of the housing 290 are disposed at the determined position of the housing 290. The connection terminals 280 are connected to the electrical signal conversion unit 207Z through a wiring pattern and a conductive via. A connecting portion 180 (connector) to be connected to the connection terminal 280 is formed in the electronic device 101X so as to correspond to the connection terminal 280 of the memory card 201X. When the memory card 201X is inserted into the housing 190 of the electronic device 101X, the connector pins of the connecting portion 180 and the connection terminals 280 are brought into mechanical contact with each other to establish an electrical connection. In this way, the memory card 201X is connected to the electronic device 101X, and power supply and transmission of input and output signals, for example, are realized.

The signal transmission system 1Z according to the first comparative example employing the electrical interface 9X has the problems i) to iv) mentioned in "Comparison between signal transmission through electric wirings and wireless transmission" section. When the terminals of the memory card 201X are made bare, there is a problem of electrostatic breakdown.

In contrast, by replacing the electrical signal conversion units 107X and 207Z according to the first comparative example with the signal generation units 107 and 207 and the transmission path coupling units 108 and 208, the signal transmission device 1 according to the present embodiment performs signal transmission via radio waves (for example, millimeter waves) rather than electric wirings. The logical control data transmitted from the memory card control unit 106 to the memory control unit 206 are converted into millimeter-wave signals, and the millimeter-wave signals are transmitted via radio waves between the transmission path coupling units 108 and 208 through the dielectric transmission path 9A. Due to wireless transmission, there is no need to be concerned about wiring geometry or connector positions, there are not many restrictions in layout. Since the wirings and terminals can be omitted for those signals that are transmitted with a millimeter-wave signal, the EMC and EMI problems are solved and the problem of electrostatic breakdown is also solved. In general, since there are no other functional units which use frequencies in the millimeter band in the electronic device 101A or the memory card 201A, countermeasures against the EMC and EMI problems are easily realized. The wireless transmission takes place in a state where the memory card 201A is attached to the slot structure 4A, and signals are transmitted between fixed positions or in a known positional relationship. As a result, the advantages 1) to 3) mentioned in "Comparison between signal transmission through electric wirings and wireless transmission" section are obtained. In particular, when a configuration that confines millimeter-wave signals in the dielectric transmission path 9A is adopted, it is possible to suppress radiation and interference of the radio waves and to effectively improve transmission efficiency. Due to millimeter wave communication, the advantages a) to d) mentioned in "Comparison between signal transmission through electric wirings and wireless transmission" section are obtained. For example, electromagnetic waves propagating through a metal waveguide (for example, having a rectangular or circular cross-sectional shape) serving as the dielectric transmission path 9A are TE or TM waves. In this case, since millimeter-wave signals propagate through the dielectric transmission path 9A using a specific mode (for example, a TE or TM mode), it is possible to perform millimeter-wave signal transmission with suppressed attenuation and radiation. An advantage of suppressing external radiation of millimeter waves to facilitate the EMC countermeasures is also obtained.

Moreover, a method of changing electric wirings to radio and performing transmission by a UWB (Ultra-wideband) has been proposed. For example, JP-A-2001-195553 describes the application of a wireless interface to a memory card. Standards such for example, as IEEE 802.11a/b/g using a 2.4-GHz band and a 5-GHz band are applied to communication. However, this standard is different from the signal transmission device 1 of the present embodiment in that a wireless interface in the 2.4-GHz band or the 5-GHz band is applied to a memory card, data access is performed from an electronic device through an electrical interface, and data access is performed from another electronic device through the wireless interface. JP-A-2007-299338 discloses an improvement of the mechanism of JP-A-2001-195553 to form a single or a plurality of antenna patterns corresponding to a plurality of frequency bands of various standards on the surface of a card. JP-A-2007-299338 also discloses a memory card configured to allow only wireless access by eliminating an electrical interface, that is, the configuration of a memory card having only a wireless interface. However, JP-A-2007-299338 makes no description of substitution for electrical interfaces of the related art, and is different from the signal transmission device 1 of the present embodiment. In addition, communication complying with standards such as IEEE 802.11a/b/g which uses the UWB as in JP-A-2001-195553 and JP-A-2007-299338 uses a low carrier frequency and is not ideal for high-speed communication, for example, for transmission of video signals, and therefore, incurs problems associated with an antenna size or the like. Furthermore, since the transmission frequency is close to the frequency used for processing other baseband signals, interference is likely to occur between the wireless signal and the baseband signal. There are problems that the space division multiplexing is difficult to perform.

Second Comparative Example

Structure

An electronic device of the second comparative example shown in FIGS. 5A to 5C is an application example when a plurality of electronic devices are integrated, and signals are transmitted by wireless between electronic devices. In particular, it is an application to signal transmission between electronic devices when one electronic device is attached to the other electronic device. In the following description, a case of transmitting high-speed and high-volume data by wireless using the millimeter band will be described.

An exemplary structure (planar and cross-sectional perspective view) of a memory card 201Y is illustrated in FIG. 5A. An exemplary structure (planar and cross-sectional perspective view) of an electronic device 101Y is illustrated in FIG. 5B. An exemplary structure (cross-sectional perspective view) when the memory card 201Y is inserted into a slot structure 4Y (in particular, an opening 192) of the electronic device 101Y is illustrated in FIG. 5C.

Similarly to the first comparative example, the slot structure 4Y between the electronic device 101Y and the memory card 201Y is a structure for attaching and detaching the memory card 201Y to and from the electronic device 101Y. The slot structure 4Y has the function of a means for fixing the electronic device 101Y and the memory card 201Y. The slot structure 4Y is formed such that the memory card 201Y (the housing 290) can be inserted into and removed from the housing 190 of the electronic device 101Y from the opening 192 and fixed to the housing 190.

A receiving-side connector 180 is disposed at a position of the slot structure 4Y contacting the terminals of the memory card 201Y. No connector terminals (connector pins) are necessary for signals replaced by wireless transmission. Moreover, on the side of the electronic device 101Y (slot structure 4Y), connector terminals may be provided for the signals replaced by millimeter-wave transmission. In this case, when a general memory card 201 (to which the second comparative example is not applied) is inserted into the slot structure 4Y, signal transmission can be performed through electric wirings as in the related art.

As shown in FIG. 5A, a cylindrical concave structure 298Y (depression) is formed on the housing 290 of the memory card 201Y, and as shown in FIG. 5B, a cylindrical convex structure 198Y (protrusion) is formed on the housing 190 of the electronic device 101Y.

The memory card 201Y has a semiconductor chip 802 which is disposed on one surface of the substrate 202. The semiconductor chip 802 is configured to be capable of performing bidirectional communication by incorporating functions equivalent to the semiconductor chip 103 functioning as a transmission chip and the semiconductor chip 203 functioning as a reception chip. The semiconductor chip 802 is provided with a transceiving terminal 232 for coupling to the wireless signal transmission path 9 (the dielectric transmission path 9A). A high-frequency signal transmission path 234 (for example, a micro-strip line through which high-frequency signals in the millimeter band are transmitted) formed of a substrate pattern connected to the transceiving terminal 232 and an antenna 236 (patch antenna in the figure) are formed on one surface of the substrate 202. Although not shown in the figure, a backplane (ground pattern) is formed on a surface of the substrate 202 opposite the surface where the antenna 236 is disposed. The transceiving terminal 232, the high-frequency signal transmission path 234, and the antenna 236 form a transmission path coupling unit 208 (see "R1" in the figure).

The housing 290 is a cover for protecting the substrate 202. At least the part of the concave structure 298Y is formed by a dielectric resin including a dielectric material having a relative dielectric constant enabling transmission of millimeter-wave signals (in this example, radio waves in the millimeter band). For example, a member formed of an acrylic resin base, a urethane resin base, an epoxy resin base or the like is used as the dielectric material of the concave structure 298Y. The dielectric material of the part of at least the concave structure 298Y of the housing 290 also forms the wireless signal transmission path 9 (for example, millimeter-wave dielectric transmission path). The concave structure 298Y is formed on the same surface of the housing 290 as the antenna 236. The concave structure 298Y fixes the memory card 201Y to the slot structure 4Y and performs alignment for coupling of transmission of millimeter waves (transmission of radio waves in the millimeter band) to the dielectric transmission path 9A of the slot structure 4Y.

On one side of the substrate 202, connection terminals 280 (signal pins) for connecting to the electronic device 101Y at a determined position of the housing 290 are disposed at the determined position of the housing 290. The memory card 201Y has a terminal structure such that the existing terminals for signals (high-speed and high-volume data) which can be transmitted via millimeter waves are removed as indicated by broken lines in the figure, and the existing terminals for the other signals for low-speed and low volume signals and for power supply are provided in a part thereof.

As shown in FIG. 5B, the electronic device 101Y includes a semiconductor chip 801 which is disposed on one surface (the opening 192 side) of the substrate 102. The semiconductor chip 801 is configured to be capable of performing bidirectional communication by incorporating functions equivalent to the semiconductor chip 103 functioning as a transmission chip and the semiconductor chip 203 functioning as a reception chip. The semiconductor chip 801 is provided with a transceiving terminal 132 for coupling to the wireless signal transmission path 9 (the dielectric transmission path 9A). A high-frequency signal transmission path 134 (for example, a micro-strip line through which high-frequency signals in the millimeter band are transmitted) formed of a substrate pattern connected to the transceiving terminal 132 and an antenna 136 (patch antenna in the figure) are formed on one surface of the substrate 102. Although not shown in the figure, a backplane (ground pattern) is formed on a surface of the substrate 102 opposite the surface where the antenna 136 is disposed. The transceiving terminal 132, the high-frequency signal transmission path 134, and the antenna 136 form a transmission path coupling unit 108. The housing 190 has the slot structure 4Y in which the opening 192 is formed so that the memory card 201Y is inserted into and removed from the opening 192. The convex structure 198Y having a millimeter wave confining structure (waveguide structure) is formed in a portion of the housing 190 corresponding to the position of the concave structure 298Y when the memory card 201Y is inserted into the opening 192 so that the dielectric transmission path 9A is formed.

The patch antenna does not have a sharp directionality in a normal direction. Thus, if the overlapping parts of the antennas 136 and 236 occupy a large area, a small displacement does not affect reception sensitivity. In millimeter wave communication, since millimeter waves have short wavelengths of a few mm, the antennas have a small size on the order of a few mm square and can be easily installed in a small space such as the inside of a small memory card 201. When the wavelength in a substrate is λg, the length of one side of the patch antenna is expressed as λg/2. For example, when a millimeter-wave signal of 60 GHz is used in the substrates 102 and 202 having a relative dielectric constant of 3.5, λg is about 2.7 mm, and one side of the patch antenna is about 1.4 mm.

Moreover, even smaller antennas such as an inverted-F type, for example, are desired when the antennas 136 and 236 are formed within the semiconductor chips 801 and 802. Moreover, the inverted-F antenna is nondirectional. In other words, the inverted-F antenna has directionality in not only the thickness (normal) direction of a substrate but also a planar direction. Therefore, transmission efficiency may be improved by adopting a device such as providing a reflector to the transmission path coupling unit 108 or 208 for coupling to the wireless signal transmission path 9 (dielectric transmission path 9A).

The convex structure 198Y is formed in a portion of the housing 190 corresponding to the position of the concave structure 298Y when the memory card 201Y is inserted into the opening 192 so that the dielectric transmission path 9A having a waveguide structure is formed. In this example, the convex structure 198Y (dielectric transmission path 9A) is configured by forming a dielectric waveguide 142 within a tubular conductor 144, and is fixedly disposed such that the center of the dielectric waveguide 142 is identical to the antenna 136 of the transmission path coupling unit 108. The dielectric waveguide 142 is provided in the concavo-convex attachment structure as a structure for strengthening coupling between the antennas 136 and 236. Moreover, it is not essential that the dielectric waveguide 142 (dielectric transmission path 9A) be provided. The wireless signal transmission path 9 may be formed by the dielectric material of the housings 190 and 290 as it is.

Parameters such as the diameter, length, and material of the dielectric waveguide 142 are determined so as to be able to transmit electromagnetic waves (in this example, radio waves in the millimeter band) efficiently. It is desirable to use, as the material of the dielectric waveguide 142, a dielectric material having a relative dielectric constant of about 2 to 10 (preferably 3 to 6) and a dielectric loss tangent of about 0.00001 to 0.01 (preferably 0.00001 to 0.001) such as a dielectric material formed of an acrylic resin base, a urethane resin base, an epoxy resin base, a silicone base, a polyimide base, or a cyanoacrylate resin base, as described above. By confining millimeter-wave signals in the dielectric transmission path 9A, it is possible to suppress radiation and interference of the radio waves and to effectively improve transmission efficiency. The conductor 144 may not be provided in some cases by properly selecting the material. The diameter of the conductor 144 is selected so as to correspond to the diameter of the concave structure 298Y of the memory card 201Y. The conductor 144 also has an effect of a shielding material for suppressing external radiation of millimeter waves transmitted within the dielectric waveguide 142.

As shown in FIG. 5C, the housing 190 of the slot structure 4Y has a mechanical structure such that the convex structure 198Y (the dielectric transmission path 9A) and the concave structure 298Y make concave-convex contact when the memory card 201Y is inserted from the opening 192. When the concave and convex structures engage with each other, the antenna 136 faces the antenna 236, and the dielectric transmission path 9A serving as the wireless signal transmission path 9 is disposed between the antennas.

With the above configuration, the memory card 201Y and the slot structure 4Y are fixed to each other. The alignment of the dielectric transmission path 9A for coupling of millimeter wave transmission is achieved so that millimeter-wave signals can be transmitted efficiently between the antennas 136 and 236. That is, the transmission path coupling unit 108 (antenna coupling unit in particular) is disposed in the part of the convex structure 198Y in the electronic device 101Y, and the transmission path coupling unit 208 (antenna coupling unit in particular) is disposed in the part of the concave structure 298Y in the memory card 201Y. The transmission path coupling units 108 and 208 are arranged such that the millimeter wave transmission characteristics of the transmission path coupling units 108 and 208 are enhanced when the concave structure and the convex structure engage with each other. With such a configuration, the fixing of the memory card 201Y and the alignment for millimeter-wave signal transmission can be performed simultaneously when the memory card 201Y is attached to the slot structure 4Y. Although the housing 290 of the memory card 201Y is disposed between the dielectric transmission path 9A and the antenna 236, since the portion of the concave structure 298Y is formed of a dielectric material, there is no great influence on the millimeter wave transmission. The same is true for a case where the dielectric waveguide 142 is not provided in the part of the convex structure 198Y but the dielectric material of the housing 190 is used as it is. In this case, the dielectric materials of the respective housings 190 and 290 form the wireless signal transmission path 9 (dielectric transmission path 9A) between the antennas 136 and 236.

When attaching the memory card 201Y to the slot structure 4Y, the fixing and alignment of the memory card 201Y are performed simultaneously. Even when there is a small slip in the engagement between the concave structure and the convex structure, the structures may have a size such that the antennas 136 and 236 do not come outside the shielding material (wall: conductor 144). The planar shape of the concave-convex structure is not necessary circular as in the figure, but is optional such as triangular or rectangular.

The radio-wave transmission structure of the second comparative example has a configuration in which the dielectric transmission path 9A having the dielectric waveguide 142 is disposed between the transmission path coupling units 108 and 208 (in particular between the antennas 136 and 236) when the memory card 201Y is attached to the slot structure 4Y. The efficiency of high-speed signal transmission can be improved by confining millimeter-wave signals in the dielectric transmission path 9A. As another method, the wireless signal transmission path 9 (dielectric transmission path 9A) may be formed such that the antennas 136 and 236 face each other at a position other than the part of the attachment structure (the convex structure 198 and the concave structure 298) of the slot structure 4A for attaching the card. However, in this case, there is the effect of positional displacement. In contrast, the effect of positional displacement can be suppressed by providing the wireless signal transmission path 9 in the attachment structure of the slot structure 4A for attaching the card.

Second Comparative Example

Electric Field Transition

FIGS. 6A and 6B illustrate the details of a radio-wave transmission structure according to the second comparative example applied to the electronic device of the second comparative example. FIG. 6A is a simplified block diagram of the radio-wave transmission structure of the second comparative example, and FIG. 6B is a diagram illustrating the mode (electric field transition) of propagating radio waves in the radio-wave transmission structure of the second comparative example.

As shown in FIG. 6A, briefly describing the part of the slot structure 4Y, the electronic device of the second comparative example has a configuration in which the transmission path coupling unit 108 connected to the semiconductor chip 801 is provided on the electronic device 101Y side, and the convex structure 198 is provided in which the dielectric waveguide 142 is integrated with the transmission path coupling unit 108. Moreover, the transmission path coupling unit 208 connected to the semiconductor chip 802 is provided on the memory card 201Y side. The antenna 136 is disposed at a portion of the transmission path coupling unit 108 facing the dielectric waveguide 142. The antenna 236 is disposed at a portion of the transmission path coupling unit 208 facing the dielectric waveguide 142. The facing portion serves as an attachment portion of the slot structure 4 (an engagement portion when attaching or detaching the memory card 201Y to and from the opening 192 of the slot structure 4Y shown in FIGS. 5A to 5C).

The radio-wave transmission structure of the second comparative example has a structure in which the memory card 201Y is attached or detached to and from the opening 192, and the antenna 236 and the dielectric waveguide 142 are electromagnetically coupled at the attachment portion. Since a mode conversion occurs at the attachment portion, transmission characteristics change greatly in relation to positional errors or a housing gap. Although countermeasures are not needed if a decrease in communication quality due to a change in transmission characteristics is within an allowable range, otherwise, countermeasures are required.

For example, FIG. 6B illustrates the transition of electric field when coupling is realized using a patch antenna as the antenna 236 and a circular waveguide as the dielectric waveguide 142. High-frequency signals are transmitted in a quasi-TEM mode in a micro-strip line serving as the high-frequency signal transmission path 234 of the memory card 201. On the other hand, in the circular waveguide (dielectric waveguide 142), electromagnetic waves (radio waves) radiated from the antenna 236 (patch antenna) of the transmission path coupling unit 208 are transmitted in the TE mode. Thus, in the portion between the transmission path coupling unit 208 (the antenna 236 thereof) and the circular waveguide (the dielectric waveguide 142), the direction of electric field changes from the quasi-TEM mode to the TE mode, and the transmission mode becomes unstable. In such a "unstable mode", when the relative position between the antenna 236 (patch antenna) and the circular waveguide (the dielectric waveguide 142) is shifted due to the movable portions of the memory card 201Y side and the slot structure 4Y side and a gap of the housing 290 of the memory card 201Y, the coupling properties are degraded, and reflection and transmission characteristics are deteriorated. For example, in the case of wireless transmission in the millimeter band, since the transmission characteristics change at a small positional error of about 0.1 mm, a strict mechanical accuracy is required. To deal with this, although the positional accuracy may be improved with the attachment structure, for example (in this example, the positional error is suppressed to be smaller than 0.1 mm), the housing or waveguide structure may require complicated processing.

In the micro-strip line as the high-frequency signal transmission path 134 of the electronic device 101, high-frequency signals are transmitted in the quasi-TEM mode. On the other hand, in the circular waveguide (dielectric waveguide 142), electromagnetic waves (radio waves) radiated from the antenna 136 (patch antenna) of the transmission path coupling unit 108 are transmitted in the TE mode. Thus, in the portion between the transmission path coupling unit 108 (the antenna 136 thereof) and the circular waveguide (the dielectric waveguide 142), the direction of electric field changes from the quasi-TEM mode to the TE mode, and the transmission mode becomes unstable. Since the circular waveguide (the dielectric waveguide 142) and the transmission path coupling unit 108 (the antenna 136 thereof) are substantially integrated with each other, the positional error may be considered to be attributable to manufacturing variations. Since the facing portions of the circular waveguide (the dielectric waveguide 142) and the transmission path coupling unit 108 (the antenna 136 thereof) are substantially fixed, the "unstable mode" occurs in the fixing portion. Although the "unstable mode" is present in the gap between the dielectric waveguide 142 and the antenna 136, since the gap portion is fixed, the relative position between the circular waveguide (the dielectric waveguide 142) and the transmission path coupling unit 108 (the antenna 136 thereof) will not be shifted. Unlike the memory card 201 side, the coupling properties will not be degraded, and the reflection and transmission characteristics will not be deteriorated.

[Countermeasures to Problems of Second Comparative Example]

Thus, it is desired to provide a transmission structure in which the transmission characteristics do not change or deteriorate greatly due to positional errors and a housing gap without complicating the attachment structure. To realize such a radio-wave transmission structure, a method of performing wireless transmission through the cross-section of a waveguide may be employed. In the relay portion (waveguide bonding portion) of a waveguide cross-section, the transmission mode is the same, and the transition of electromagnetic waves is easy to occur. Thus, deterioration of transmission characteristics due to positional errors and a gap can be decreased.

For example, a part of a waveguide may be taken into the circuit substrate side of an electronic device so that waveguides face each other. When taking a part of a waveguide into the circuit substrate side of an electronic device, a conductor that forms the periphery of the waveguide may be bonded and fixed onto the circuit substrate, for example. Alternatively, a conductor pattern that forms the waveguide may be formed on the circuit substrate itself so that the waveguide and the transmission path coupling unit (the antenna thereof) are integrally formed on the circuit substrate.

In such a transmission structure, when electronic devices are attached to each other, the cross-sections of waveguides come in close contact to form a waveguide bonding portion, whereby wireless transmission is realized. In this way, a structure in which radio waves are transmitted in a noncontact manner through the cross-sections of waveguides is achieved. Thus, a method of coupling radio waves in the same transmission mode can be adopted in the facing portion (electromagnetic field coupling unit) of the attachment structure. By integrating the transmission path coupling unit and the waveguide in a noncontact attachment portion, transmission can be coupled at the cross-sections of waveguides. Since the transmission mode does not change before and after the bonding, even when a gap or a shift occurs in the movable portions, the transition of electromagnetic field can occur easily, and radio waves can be transmitted easily. Such an idea is not limited to a waveguide having a circular cross-sectional shape but may be equally applied to a waveguide having a rectangular shape or other shape. In any shape, the waveguide may only need to provide a cut-off frequency at which radio waves (in this example, millimeter waves) are allowed to pass.

Since a part of the waveguide taken into the circuit substrate side of the electronic device and the transmission path coupling unit (the antenna thereof) are substantially integrated with each other, the positional error may be considered to be attributable to manufacturing variations. Since the facing portions of the part of the waveguide and the transmission path coupling unit (the antenna thereof) are substantially fixed, the "unstable mode" occurs in the fixing portion. Thus, the occurrence of coupling in the "unstable mode" in the movable portion is eliminated. On the other hand, since the coupling in the facing portions of the waveguides occurs in the same mode, the occurrence of coupling in the "unstable mode" in the movable portion is eliminated. That is, since the transmission mode (in this example, the TE mode) does not change before and after the bonding, even when a gap or a shift occurs in the movable portions, the transition of electric field can occur easily, and radio waves can be transmitted easily. Such an idea is not limited to a waveguide having a circular cross-sectional shape but may be equally applied to a waveguide having a rectangular shape or other shape. In any shape, the waveguide may only need to provide a cut-off frequency at which radio waves (in this example, millimeter waves) are allowed to pass.

Present Embodiment

Electric Field Transition

FIGS. 7A and 7B illustrate the details of the radio-wave transmission structure of the present embodiment having such a transmission structure. A1 and A2 of FIG. 7A is a simplified block diagram of the radio-wave transmission structure of the present embodiment, and FIG. 7B is a diagram illustrating the mode (electric field transition) of propagating radio waves in the radio-wave transmission structure of the present embodiment.

A radio-wave transmission structure of the first example shown in A1 of FIG. 7A has a configuration in which a part of both waveguides is taken into the circuit substrate side of an electronic device so that waveguides face each other. Briefly describing the part of the slot structure 4, the transmission path coupling unit 108 connected to the semiconductor chip 801 is provided on the electronic device 101 side, and the waveguide 146 (the conductor 147 that forms the periphery of the waveguide 146) is integrated with the transmission path coupling unit 108. Similarly to the dielectric waveguide 142, the inside of the conductor 147 of the waveguide 146 may be filled with a dielectric material. The antenna 136 is disposed in a portion of the transmission path coupling unit 108 facing the waveguide 146. On the other hand, the transmission path coupling unit 208 connected to the semiconductor chip 802 is provided on the memory card 201 side, and the waveguide 246 (the conductor 247 that forms the periphery of the waveguide 246) is integrated with the transmission path coupling unit 208. Similarly to the dielectric waveguide 142, the inside of the conductor 247 of the waveguide 246 may be filled with a dielectric material. The antenna 236 is disposed in a portion of the transmission path coupling unit 208 facing the waveguide 246. The waveguide 146 faces a side of the dielectric waveguide 142 close to the electronic device 101, the waveguide 246 faces a side of the dielectric waveguide 142 close to the memory card 201 so that the respective facing portions (electromagnetic field coupling units 150_1 and 150_2) serve as the attachment portions between electronic devices. That is, the first example illustrates a radio-wave transmission structure in which the attachment portions are disposed at both ends of the dielectric waveguide 142.

A radio-wave transmission structure of the second example shown in A2 of FIG. 7A has a configuration in which a part of only waveguide (in this example, the waveguide of the memory card 201 side) is taken into the circuit substrate side of an electronic device so that waveguides face each other. That is, the second example is based on the first example, and a structure in which waveguides face each other is disposed only on the side of the dielectric waveguide 142 close to the memory card 201. The structure of the electronic device 101 side is the same as that of the second comparative example. The radio-wave transmission structure of the present embodiment shown in A1 of FIG. 7A is applied to the side of the dielectric waveguide 142 close to the memory card 201, and the radio-wave transmission structure of the second comparative example shown in FIG. 6A is applied to the side of the dielectric waveguide 142 close to the electronic device 101. Since these structures are described above, detailed description thereof will not be provided.

FIG. 7B illustrates the transition of electric field when coupling is realized using a patch antenna as the antenna 236 and a circular waveguide as the dielectric waveguide 142 in the second example shown in A2 of FIG. 7A. The waveguide 246 is taken into the substrate 202 side of the memory card 201 as substantially a part of the dielectric waveguide 142. In the shown example, the conductor 247 that forms the periphery of the waveguide 246 is bonded and fixed to the housing 290. Similarly to the dielectric waveguide 142, the inside of the conductor 247 may be filled with a dielectric material having a relative dielectric constant of about 2 to 10 (preferably 3 to 6) and a dielectric loss tangent of about 0.00001 to 0.01 (preferably 0.00001 to 0.001) such as a dielectric material formed of an acrylic resin base, a urethane resin base, an epoxy resin base, a silicone base, a polyimide base, or a cyanoacrylate resin base.

High-frequency signals are transmitted in a quasi-TEM mode in a micro-strip line serving as the high-frequency signal transmission path 234 of the memory card 201. In the waveguide 246, electromagnetic waves (radio waves) radiated from the antenna 236 (patch antenna) of the transmission path coupling unit 208 are transmitted in the TE mode. Thus, in the portion between the transmission path coupling unit 208 (the antenna 236 thereof) and the waveguide 246, the direction of electric field changes from the quasi-TEM mode to the TE mode, and the transmission mode becomes unstable. In this example, the housing 290 and the substrate 202 are fixed so that a predetermined positional relationship is maintained. Therefore, since the waveguide 246 and the transmission path coupling unit 208 (the antenna 236 thereof) are substantially integrated with each other, the positional error may be considered to be attributable to attachment errors during manufacturing. Since the facing portions of the waveguide 246 and the transmission path coupling unit 208 (the antenna 236 thereof) are substantially fixed to each other, the "unstable mode" occurs in the fixing portion. Although the "unstable mode" is present in the gap between the waveguide 246 and the antenna 236, since the gap portion is fixed, the relative position between the waveguide 246 and the transmission path coupling unit 208 (the antenna 236 thereof) will not be shifted. Similarly to the electronic device 101 side, the coupling properties will not be degraded, and the reflection and transmission characteristics will not be deteriorated.

In the electromagnetic field coupling unit 150 where the dielectric waveguide 142 faces the waveguide 246, a structure in which radio waves are transmitted in a noncontact manner through the cross-sections of the respective waveguides is achieved, and radio waves are coupled in the same transmission mode. Since the electromagnetic field coupling unit 150 transmits radio waves of the same transmission mode, even when the electromagnetic field coupling unit 150 becomes a movable portion, and a gap or a shift occurs, the transition of electric field can occur easily, and radio waves can be transmitted easily.

Specific Application Example

Specific application examples will be described below.

First Exemplary Embodiment

FIGS. 8A to 8C are diagrams illustrating an electronic device of the first exemplary embodiment to which the radio-wave transmission structure (A2 of FIG. 7A) of the second example of the present embodiment is applied. An exemplary structure (planar and sectional perspective view) of a memory card 201C is illustrated in FIG. 8A. An exemplary structure (planar and sectional perspective view) of an electronic device 101C is illustrated in FIG. 8B. An exemplary structure (sectional perspective view) when the memory card 201C is inserted into a slot structure 4C (in particular, an opening 192) of the electronic device 101C is illustrated in FIG. 8C.

Similarly to the second comparative example, the electronic device (the entire body thereof) of the first exemplary embodiment has a configuration in which the slot structure 4C between the electronic device 101C and the memory card 201C is a structure for attaching and detaching the memory card 201C to and from the electronic device 101C, and the slot structure 4C has the function of a means for fixing the electronic device 101C and the memory card 201C. The slot structure 4C is formed such that the memory card 201C (the housing 290 thereof) can be inserted into and removed from the housing 190 of the electronic device 101C from the opening 192 and fixed to the housing 190. In the following description, only the difference from the second comparative example will be described.

The electronic device (the whole body thereof) of the first exemplary embodiment has a configuration in which a part of a waveguide is provided on the memory card 201C side, that is, a configuration in which a conductor forming the waveguide 146 is formed on a surface of the substrate 202 of the memory card 201 close to the dielectric waveguide 142. On the memory card 201C side, the ring-shaped conductor 247 (conductor ring) having the same diameter as the dielectric waveguide 142 is bonded and fixed to the lower surface of the antenna 236 (patch antenna) of the transmission path coupling unit 208. The antenna 236 is a patch antenna of which the pattern is formed on the substrate 202, and the conductor 247 that forms the waveguide 246 is disposed in the gap between the housing 290 and the substrate 202. The waveguide 246 and the transmission path coupling unit 208 (the antenna 236 thereof) are integrated with each other, and radio waves are coupled through the cross-sections of the waveguide 246 and the dielectric waveguide 142. In this case, by disposing the waveguide 246 in the gap between the substrate 202 and the housing 290, the cross-sections in the longitudinal direction of the two waveguides face each other so that a coupling unit that couples radio waves with each other can be disposed while preventing dust or the like from entering into the housing.

In such a structure, it is not necessary to provide an attachment structure (the concave structure 298) in the housing 290. Similarly to a general slot structure, a concavo-convex structure may be provided in the memory card 201C as a position defining portion that defines the attachment state of the memory card 201A by the attachment structure as indicated by a broken line in the figure. Even when the attachment structure (the concave structure 298) is not provided in the housing 290, the convex structure 198 may be provided in the electronic device 101C side and form the dielectric waveguide 142 in that portion taking compatibility with a general-purpose memory card 201 into consideration, which however is not essential to the present disclosure. Similarly to the second exemplary embodiment described later, on the electronic device 101C side, the attachment structure (the convex structure 198) may not be provided in the housing 190 by not taking compatibility with the general-purpose memory card 201 into consideration.

According to the radio-wave transmission structure of the first exemplary embodiment, the dielectric transmission path 9A including the dielectric waveguide 142 and the waveguide 246 is disposed between the antenna 136 and the antenna 236 when the memory card 201C is attached to the slot structure 4C. Since the positional relationship between the antenna 136 and the waveguide 146 and between the antenna 236 and the waveguide 246 is fixed, the relative position thereof may not be shifted, the coupling properties will not be degraded, and the reflection and transmission characteristics will not be deteriorated. The electromagnetic field coupling unit 150 which is a movable portion is formed in the relay part (waveguide bonding portion) of the waveguide cross-section between the dielectric waveguide 142 and the waveguide 246. However, in the electromagnetic field coupling unit 150, since the transmission mode is the same, the transition of electromagnetic waves is easy to occur, it is possible to decrease deterioration of transmission characteristics due to positional errors and a gap and reliably eliminate the influence of positional errors.

Second Exemplary Embodiment

FIGS. 9A to 10 are diagrams illustrating an electronic device of the second exemplary embodiment to which the radio-wave transmission structure (A2 of FIG. 7A) of the second example of the present embodiment is applied. An exemplary structure (planar and sectional perspective view) of a memory card 201D is illustrated in FIG. 9A. An exemplary structure (planar and sectional perspective view) of an electronic device 101D is illustrated in FIG. 9B. An exemplary structure (sectional perspective view) when the memory card 201D is inserted into a slot structure 4D (in particular, an opening 192) of the electronic device 101D is illustrated in FIG. 9C. The details of the structure (sectional perspective view) of the transmission path coupling unit 208 applied to the memory card 201D and the transmission path coupling unit 108 applied to the electronic device 101D are illustrated in FIG. 10. In the following description, only the difference from the first exemplary embodiment will be described.

The electronic device (the whole body thereof) of the second exemplary embodiment has a configuration in which the pattern of a conductor that forms a waveguide is formed on a circuit substrate itself, whereby the waveguide and the transmission path coupling unit (the antenna thereof) are integrally formed on the circuit substrate. The waveguide in the substrate is integrated with a transmission coupling structure on the substrate. The conductor that forms the waveguide 146 is integrally formed in the substrate 202 of the memory card 201 so as to extend in the thickness direction thereof. As shown in FIG. 10, on the memory card 201D side, a multi-layered printed substrate serving as the substrate 202 is used. A high-frequency signal transmission path 234 (for example, a micro-strip line) is formed on a first layer L1 (a surface opposite to a second surface L2), and a conductor 247_1 (ring pattern) having the same diameter as the dielectric waveguide 142 that forms the waveguide 246 is formed so as to surround a portion of the second layer L2 facing the antenna 236. Moreover, a reflector 249 is formed inside the conductor 247_1 to broaden a communication band. The pattern of the antenna 236 (patch antenna) is formed on the second layer L2 (a surface close to the first layer L1), and a conductor 247_2 (ring pattern) having the same diameter as the dielectric waveguide 142 that forms the waveguide 246 is formed so as to surround the antenna 236. The ground (GND) conductor of the high-frequency signal transmission path 234 (for example, a micro-strip line) is formed on the outer side of the conductor 247_2 (ring pattern). The antenna 236 is electromagnetically coupled with an end of the high-frequency signal transmission path 234 on the first layer L1. A conductor 247_3 (ring pattern) having the same diameter as the dielectric waveguide 142 that forms the waveguide 246 is formed on a third layer L3 (a surface close to the second layer L2) so as to surround a portion of the second layer L2 facing the antenna 236. A conductor 247_4 (ring pattern) having the same diameter as the dielectric waveguide 142 that forms the waveguide 246 is formed on a fourth layer L4 (a surface close to the third layer L3) so as to surround a portion of the second layer L2 facing the antenna 236. A conductor 247 (ring pattern) having the same diameter as the dielectric waveguide 142 is formed on the first to fourth layers L1 to L4, and the first to fourth layers L1 to L4 are connected by a penetration via 248. In this way, the waveguide 246 is formed. The waveguide 246 is integrated with the transmission path coupling unit 208 (the antenna 236 thereof), and radio waves are coupled through the cross-sections of the waveguide 246 and the dielectric waveguide 142. In this way, a structure in which on the transmission path coupling unit 208 side, the coupling structure with the waveguide 246 is formed on the substrate 202, and which is excellent in providing a wider band and mass productivity is realized.

In such a structure, it is not necessary to provide an attachment structure (the concave structure 298) in the housing 290. On the electronic device 101D side, the attachment structure (the convex structure 198) is not provided in the housing 190 without taking compatibility with the general-purpose memory card 201 into consideration. Instead of this, the pattern of the conductor 147 that forms the waveguide 146 is formed on the circuit substrate itself so as to form the dielectric waveguide 142 (specifically, instead of the dielectric waveguide 142), whereby the waveguide 146 and the transmission path coupling unit 134 (the antenna 136 thereof) are integrally formed on the circuit substrate. The arrangement patterns on the respective layers are the same as those of the memory card 201, and respective constituent elements are denoted by reference numerals in the 100s. In this way, a structure in which on the electronic device 101D side, the coupling structure with the waveguide 146 that forms the dielectric waveguide 142 is formed on the substrate 102, and which is excellent in providing a wider band and mass productivity is realized.

The fourth layers L4 of the memory card 201D side and the slot structure 4D side are disposed so as to face each other, and radio waves (in this example, millimeter waves) are transmitted between the layers through the housings 190 and 290. Both the electronic device 101D and the memory card 201D do not require an attachment structure, and the device configuration can be simplified and made thin. The same operational effects as those of the first exemplary embodiment are obtained with the radio-wave transmission structure of the second exemplary embodiment.

Modified Examples of First and Second Exemplary Embodiments

Although a four-layered substrate is used in the first and second exemplary embodiments, the number of layers is not limited to "4" as long as a waveguide can be formed in a circuit substrate so as to extend in the thickness direction thereof. The respective data such as number of layers, thickness of layers, and material are appropriately chosen so that a coupling loss is as low as possible at the frequency of radio waves being transmitted. In some cases, the waveguide 246 or the dielectric waveguide 142 may be formed on both surfaces of a single-layered substrate without using a multi-layered substrate.

In the first exemplary embodiment, although the inside of the conductor 144 or 247 that forms the outer conductor of the dielectric waveguide 142 or the waveguide 246 is filled with a dielectric material, a hollow waveguide which is surrounded by a conductor (the conductor 144 or 247) serving as a shielding material and of which the inside is hollow without being filled with a dielectric material may be used. In the hollow waveguide having such a structure, since millimeter waves are confined in the hollow waveguide by the wall, it is possible to transmit millimeter waves efficiently with a small transmission loss, suppress external radiation of millimeter waves, and facilitate the EMC countermeasures.

In the first and second exemplary embodiments, although a pair of antennas (the pair of antennas 136 and 236) is provided for one system made up of the dielectric waveguide 142 and the waveguide 246, a plurality of antenna pairs may be provided. Moreover, by providing one antenna 136 and a plurality of antennas 236, multicasting may be realized so that the plurality of antennas 236 simultaneously receive millimeter waves radiated from one antenna 136, and selective reception may be realized by using different carrier frequencies on the receiving side. Conversely, by providing one antenna 236 and a plurality of antennas 136, millimeter waves may be selectively transmitted from any one of the antennas 136. In any case, the semiconductor chip 103 or 203 is provided so as to correspond to each of the antennas 136 and 236.

In the first and second exemplary embodiments, although one system made up of the antenna 136, the dielectric waveguide 142, the waveguide 246, and the antenna 236 is provided, a plurality of these systems may be provided to employ space division multiplexing. Since the waveguide structures are independent, it is possible to prevent interference of millimeter waves and to perform transmission of millimeter waves independently using a carrier signal of the same frequency for transmission and reception. That is, since the use of space division multiplexing enables the same frequency band to be utilized at the same time, it is possible to increase a communication speed and to ensure synchronism of bidirectional communication in which signal transmission is performed at the same time. By configuring a plurality of systems of millimeter-wave signal transmission paths, it is possible to realize full-duplex transmission and to improve efficiency of data transmission and reception.

Moreover, the antennas 236 in the memory card 201 may be disposed so as to face the respective surfaces of the substrate 202, and the slot structure 4 may be modified so as to correspond to this modification so that separate substrates 102 are disposed on both inner surfaces of the opening 192, and the antennas 136 are disposed on the respective substrates. In this case, since the application of space division multiplexing enables the same frequency band to be utilized at the same time, it is possible to increase a communication speed and to ensure synchronism of bidirectional communication in which signal transmission is performed at the same time. By configuring a plurality of systems of wireless signal transmission paths 9, it is possible to realize full-duplex transmission and to improve efficiency of data transmission and reception. This modified example is an ideal method when it is difficult to secure a space for arranging a plurality of antennas on the same surface of a substrate due to a layout limitation.

Third Exemplary Embodiment

FIGS. 11A to 11C are diagrams illustrating an electronic device of the third exemplary embodiment to which the radio-wave transmission structure (A2 of FIG. 7A) of the second example of the present embodiment is applied. An exemplary structure (planar and sectional perspective view) of a memory card 201E is illustrated in FIG. 11A. An exemplary structure (planar and sectional perspective view) of an electronic device 101E is illustrated in FIG. 11B. An exemplary structure (sectional perspective view) when the memory card 201E is inserted into a slot structure 4 (in particular, an opening 192) of the electronic device 101E is illustrated in FIG. 11C.

The electronic device 101E and the memory card 201E form the entire body of the electronic device.

The third exemplary embodiment employs the signal interface shown in FIG. 2, and power which requires power transmission is also transmitted by wireless. That is, a configuration of supplying power used by the second communication device 200B side from the first communication device 100B by wireless is added. In the figure, a modified example of the first exemplary embodiment is illustrated. In the following description, only the difference from the first exemplary embodiment will be described.

On one side of each substrate 202, connection terminals 280 for connecting to the electronic device 101E at a determined position of the housing 290 are disposed at the determined position of the housing 290. The existing terminals for signals for low-speed and low volume signals are provided in a part of the memory card 201E. Terminals for power supply and signal transmission via millimeter waves, which are replaced for noncontact transmission are removed as indicated by broken lines in the figure.

In order to deal with noncontact power transmission, a power feeding source unit is incorporated into the semiconductor chip 801, and a power receiving source unit and a reference signal generation unit are incorporated into the semiconductor chip 802. A power transmitting element 413 formed of a conductor pattern coil is disposed on the substrate 102 on which the semiconductor chip 801 is mounted, and a power receiving element 423 formed of a conductor pattern coil is disposed on the substrate 202 on which the semiconductor chip 802 is mounted.

No DC power source is disposed on the substrate 202, but power is transmitted from the power transmitting element 413 of the substrate 102 to the power receiving element 423 of the substrate 202 using noncontact power transmission. In this case, preferably, a single carrier is used for noncontact power transmission, and a frequency different from the frequency of the signal carrier for noncontact power transmission is used for data transmission. In this way, a wide bandwidth is secured, and interference such as noise occurring in the data transmission resulting from the noncontact power transmission is prevented. Although the housing 290 or the substrate 202 is disposed between the antennas 136 and 236 or between the power receiving element 413 and the power transmitting element 423, since these elements are formed of a dielectric material, there is no great influence on the noncontact power transmission and the wireless transmission in the millimeter band.

Fourth Exemplary Embodiment

Figure 12A:
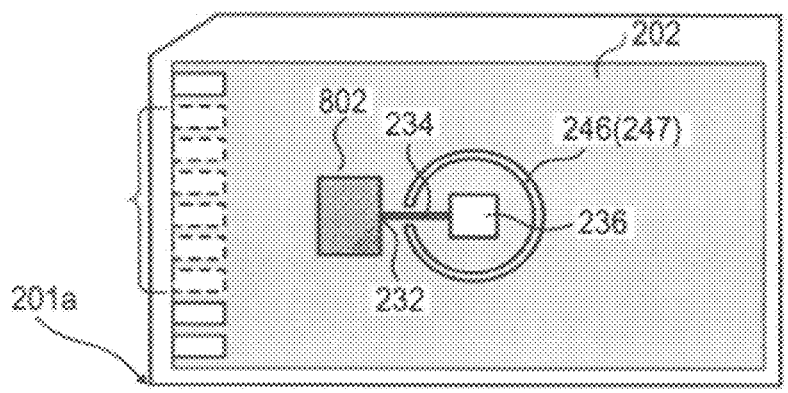
FIGS. 12A to 12C are diagrams illustrating an electronic device according to a fourth exemplary embodiment.
Figure 12B:
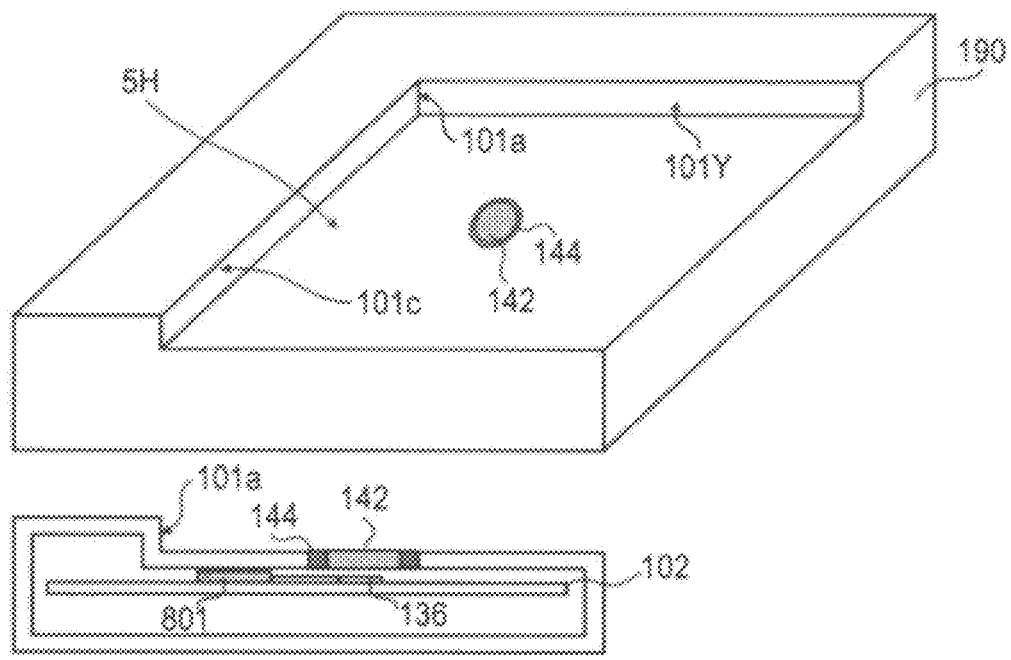
Figure 12C:
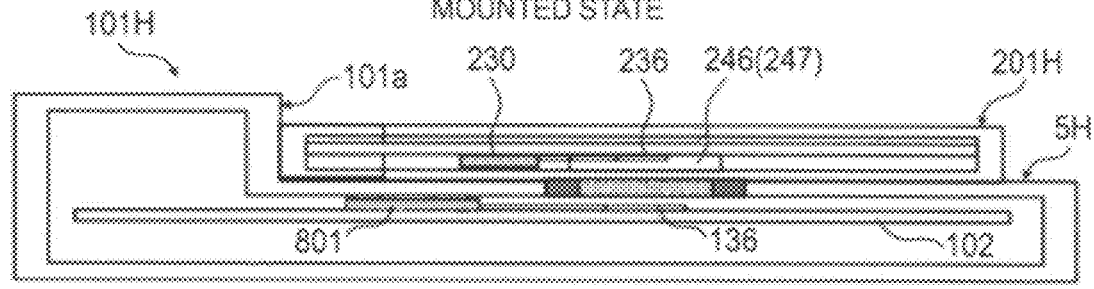

FIGS. 12A to 12C are diagrams illustrating an electronic device of the fourth exemplary embodiment to which the radio-wave transmission structure (A2 of FIG. 7A) of the second example of the present embodiment is applied, and illustrates a modified example of the attachment structure. An electronic device 101H is configured such that a part of the housing 190 thereof functions as a planar base (referred to as amount 5H) for mounting a card thereon. The mount 5H is an example of an attachment structure to which the memory card 201H is attached. A state in which a memory card 201H is mounted at a defined position is the same as the "attachment" state stated in the respective examples described above. That is, also in such a state, the memory card 201H is attached to the attachment structure of the electronic device 101H.

The semiconductor chip 801 is included in the housing 190 under the mount 5H, and the antenna 136 is formed at a certain position. A dielectric waveguide 142 that is formed as a dielectric transmission path 9A whose internal transmission path is formed of a dielectric material and of which the outer portion is surrounded by a conductor 144 is provided in a portion of the housing 190 facing the antenna 136. Moreover, the dielectric waveguide 142 (dielectric transmission path 9A) may not be provided, but the wireless signal transmission path 9 may be formed by the dielectric material of the housing 190 as it is. These configurations are the same as those of the second example described above.

A wall surface defining a position where the memory card 201H is placed is formed on the housing 190 so as to define the mounting position of the memory card 201H. Two side edges 101b and 101c forming a corner 101a are erected to form a wall surface in the mounting position in the housing 190 so as to define one corner 201a of the memory card 201H, for example. In principle, it is assumed that the memory card 201H bumps against the wall surface (side edges 101b and 101c) when the memory card 201H is placed on the mount 5H (which will be referred to as a wall bumping structure).

Although not shown in the figure, similarly to the third exemplary embodiment, in order to deal with noncontact power transmission, a power feeding source unit is incorporated into the semiconductor chip 801, and a power receiving source unit and a reference signal generation unit are incorporated into the semiconductor chip 802. A power transmitting element formed of a conductor pattern coil is disposed on the substrate 102 on which the semiconductor chip 801 is mounted, and a power receiving element formed of a conductor pattern coil is disposed on the substrate 202 on which the semiconductor chip 802 is mounted.

With such a configuration, it is possible to perform alignment for millimeter-wave signal transmission of the memory card 201H when mounting (attaching) the memory card 201H on the mount 5H. Although the housings 190 and 290 or the substrate 202 is disposed between the antennas 136 and 236 or between the power receiving element 413 and the power transmitting element 423, since these elements are formed of a dielectric material, there is no great influence on the noncontact power transmission and the wireless transmission in the millimeter band.

The fourth exemplary embodiment employs a configuration in which the dielectric transmission path 9A is disposed between the transmission path coupling units 108 and 208 (antennas 136 and 236 in particular) when the memory card 201H is attached to the defined position of the mount 5H. The efficiency of high-speed signal transmission can be improved by confining millimeter-wave signals in the dielectric transmission path 9A.

When the electronic device 101H is placed so as to bump into the corner 101a of the mount 5H, since the antenna 136 faces the antenna 236, it is possible to reliably eliminate the influence of misalignment by the wall bumping structure rather than the attachment structure.

Although not shown in the figure, a plurality of antennas 136 may be juxtaposed to each other in a planar form under the mount 5H, and a millimeter-wave signal for checking purpose may be sent out from the antenna 236 of the memory card 201H prior to actual signal transmission to select an antenna 136 having a highest reception sensitivity. This makes a system configuration somewhat complicated, but makes it unnecessary to care about the mounting position (attachment position) where the memory card 201H is mounted on the mount 5H more than the case of using the memory card 201H which uses the waveguide 246.

Fifth Exemplary Embodiment

Figure 13A:
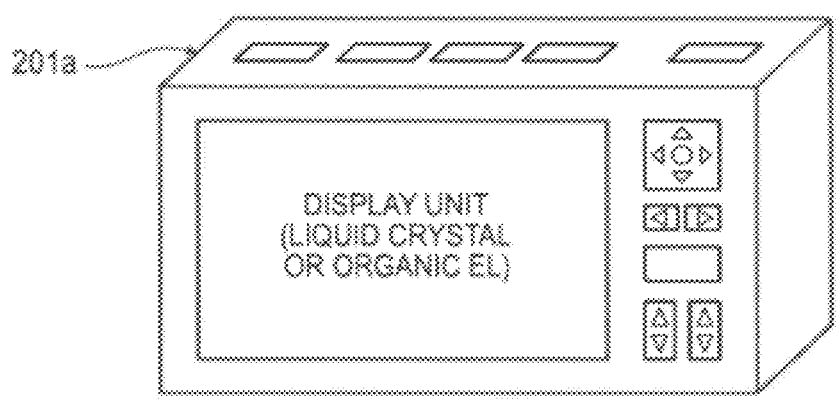
FIGS. 13A to 13C are diagrams illustrating an electronic device according to a fifth exemplary embodiment.
Figure 13B:
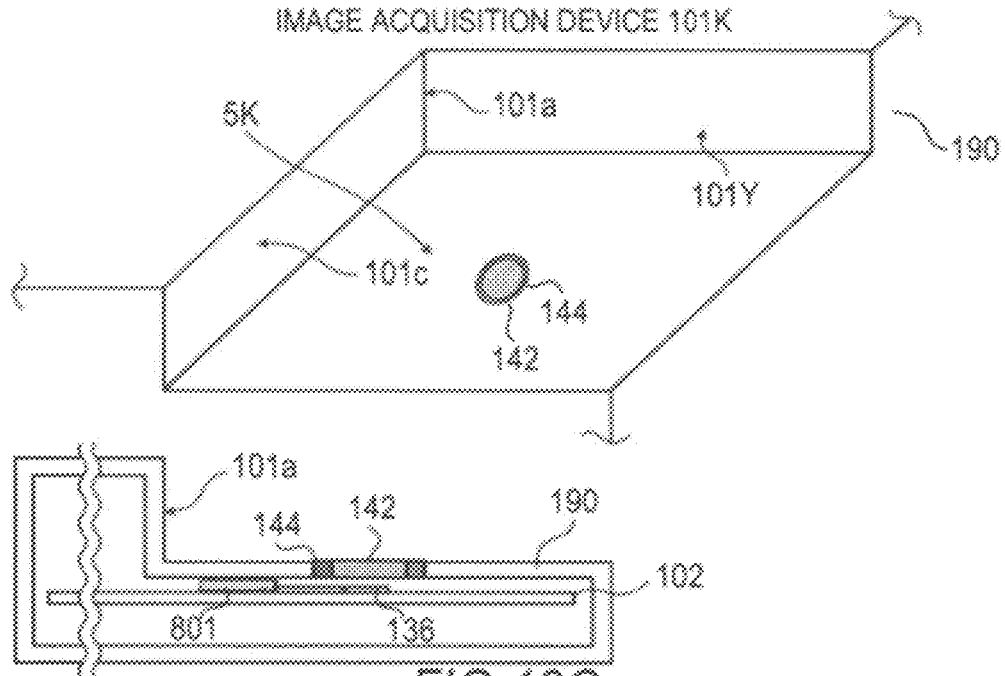
Figure 13C:
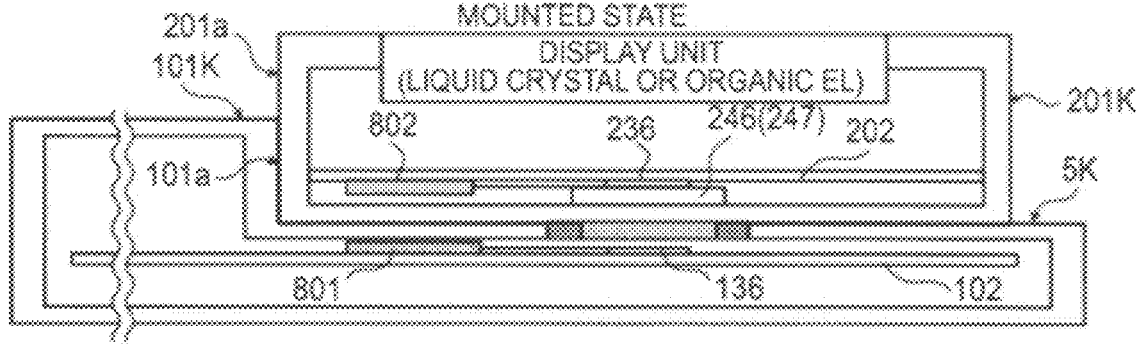

FIGS. 13A to 13C are diagrams illustrating an electronic device of the fifth exemplary embodiment to which the radio-wave transmission structure (A2 of FIG. 7A) of the second example of the present embodiment is applied. The signal transmission device 1 includes a portable image reproduction device 201K as an example of a first electronic device and also includes an image acquisition device 101K as an example of a second (main-side) electronic device on which the image reproduction device 201K is mounted. The image acquisition apparatus 101K and the image reproduction apparatus 201K form the entire body of an electronic device. In the image acquisition device 101K, a mount 5K on which the image reproduction device 201K is mounted is formed in a part of the housing 190 thereof. The slot structure 4 may be formed instead of the mount 5K. Similarly to the above-described respective exemplary embodiments, signals are transmitted by wireless between both electronic devices when one electronic device is mounted on the other electronic device. In the following description, only the difference from the fourth exemplary embodiment will be described.

The image acquisition device 101K has an approximately rectangular (box) shape and thus cannot be said to be a card type. As an example of the image acquisition device 101K, a digital recording and reproducing device and a terrestrial television receiver may be used as long as it acquires movie data, for example. As an application function, the image reproduction device 201K includes a storage device that stores movie data transmitted from the image acquisition device 101K and a functional unit that reads the movie data from the storage device to reproduce movie on a display unit (for example, a liquid crystal display device or an organic EL display device). Comparing the structures, it can be said that the memory card 201B is substituted with the image reproduction device 201K, and the electronic device 101E is substituted with the image acquisition device 101K.

Inside the housing 190 under the mount 5K, similarly to the second example (FIGS. 11A to 11C), the antenna 136 is formed at a position where the semiconductor chip 801 is included. The dielectric transmission path 9A formed of a dielectric material is formed in a portion of the housing 190 facing the antenna 136 as the wireless signal transmission path 9. Inside the housing 290 of the image reproduction device 201K mounted on the mount 5K, the substrate 202 is included, and the semiconductor chip 802 is formed on one surface of the substrate 202, and the antenna 236 connected to the semiconductor chip 802 is formed on the one surface of the substrate 202. The wireless signal transmission path 9 (the dielectric transmission path 9A) formed of a dielectric material is formed in a portion of the housing 290 facing the antenna 236.

Although not shown in the figure, similarly to the third exemplary embodiment, in order to deal with noncontact power transmission, a power feeding source unit is incorporated into the semiconductor chip 801, and a power receiving source unit and a reference signal generation unit are incorporated into the semiconductor chip 802. A power transmitting element formed of a conductor pattern coil is disposed on the substrate 102 on which the semiconductor chip 801 is mounted, and a power receiving element formed of a conductor pattern coil is disposed on the substrate 202 on which the semiconductor chip 802 is mounted.

The fifth exemplary embodiment employs a wall bumping structure rather than an engaging structure. When the image acquisition device 101K is placed so as to bump into the corner 101a of the mount 5K, since the antenna 136 faces the antenna 236, it is possible to reliably eliminate the influence of misalignment. With such a configuration, it is possible to perform alignment for wireless signal transmission of the image reproduction device 201K when mounting (attaching) the image reproduction device 201K on the mount 5K.

Although the housings 190 and 290 or the substrate 202 is disposed between the antennas 136 and 236 or between the power receiving element 413 and the power transmitting element 423, since these elements are formed of a dielectric material, there is no great influence on the noncontact power transmission and the wireless transmission in the millimeter band.

Although the technique disclosed in the present specification has been described by way of embodiments, the technical scope of the present disclosure is not limited to the range disclosed in the embodiments described above. Various modifications or improvements can be made to the embodiments without departing from the spirit of the present disclosure, and such modifications or improvements are also included in the technical scope of the present disclosure. Moreover, the embodiments described above do not restrict the technique according to the appended claims, and not all of the combinations of features described in the embodiments are said to be indispensable to the technical solving means proposed in the present disclosure. Various steps of techniques are included in the embodiments described above, and various modified techniques can be extracted by an appropriate combination of a plurality of constituent elements disclosed in the embodiments. The embodiments described above are not limited to being applied solely but may be applied in optional combinations within a possible range. Several constituent elements may be removed from the whole constituent elements illustrated in the embodiments, and as long as the effects to be achieved by the present disclosure are achieved, the configuration in which several constituent elements are removed can be extracted as the technique proposed by the present disclosure.

Figure 14:
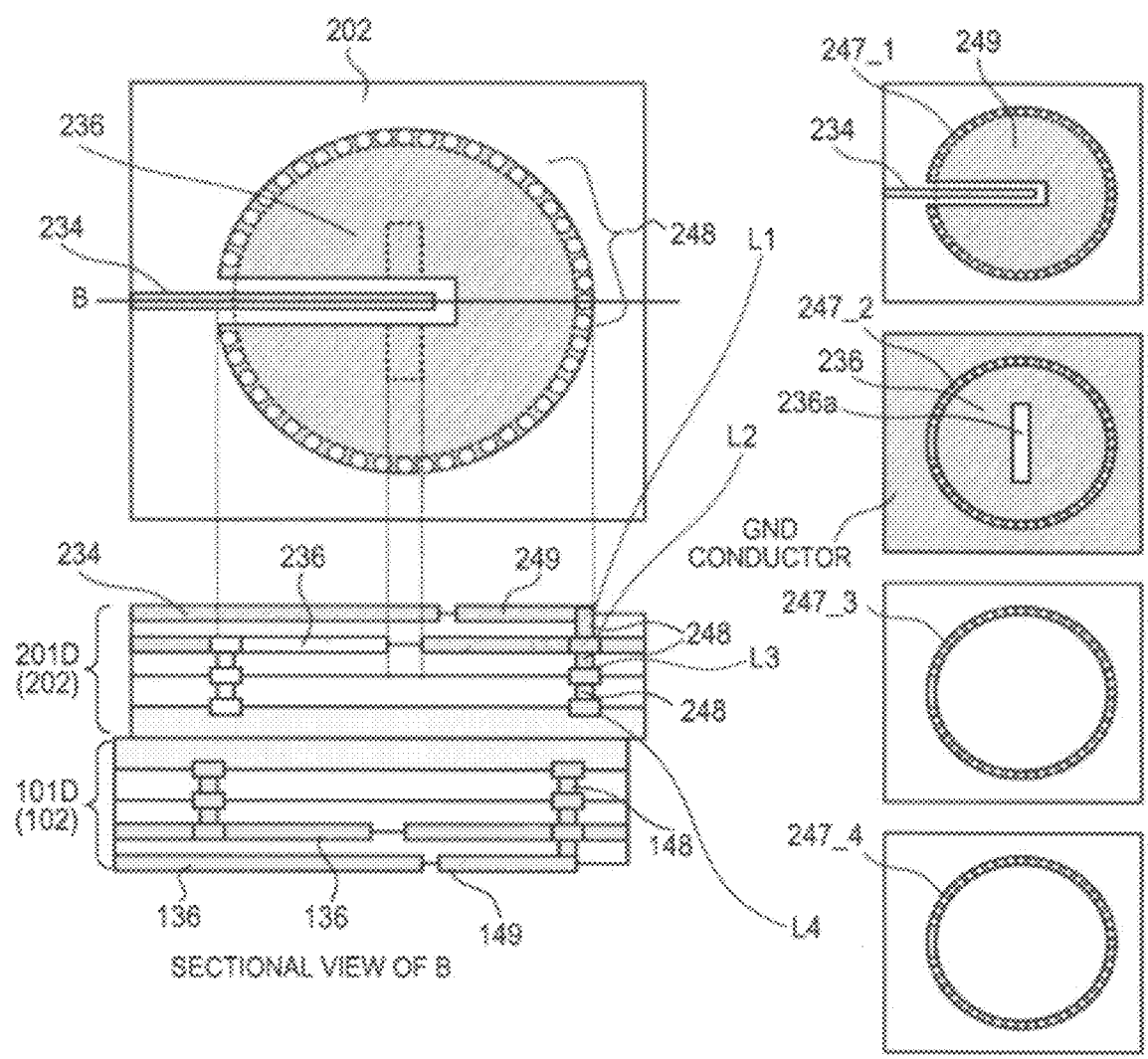
FIG. 14 is a diagram illustrating a first modified example of the radio-wave transmission structure.

For example, the antenna that couples radio waves from the micro-strip line MSL to the waveguide using the TE mode is not limited to a patch antenna, but a slot antenna, for example, may be used. In both the patch antenna and the slot antenna, electric field stands up in the cross-sectional direction of the waveguide. FIG. 14 is a diagram (a modified example of FIG. 10) illustrating a first modified example of a radio-wave transmission structure when a slot antenna is used. As compared to FIG. 10, the second layer L2 is changed greatly such that an opening 236a (slot hole) is formed in a conductor pattern 236 that forms a ground (GND) conductor of the high-frequency signal transmission path 234 (for example, a micro-strip line), whereby a slot antenna is realized.

Figure 15:
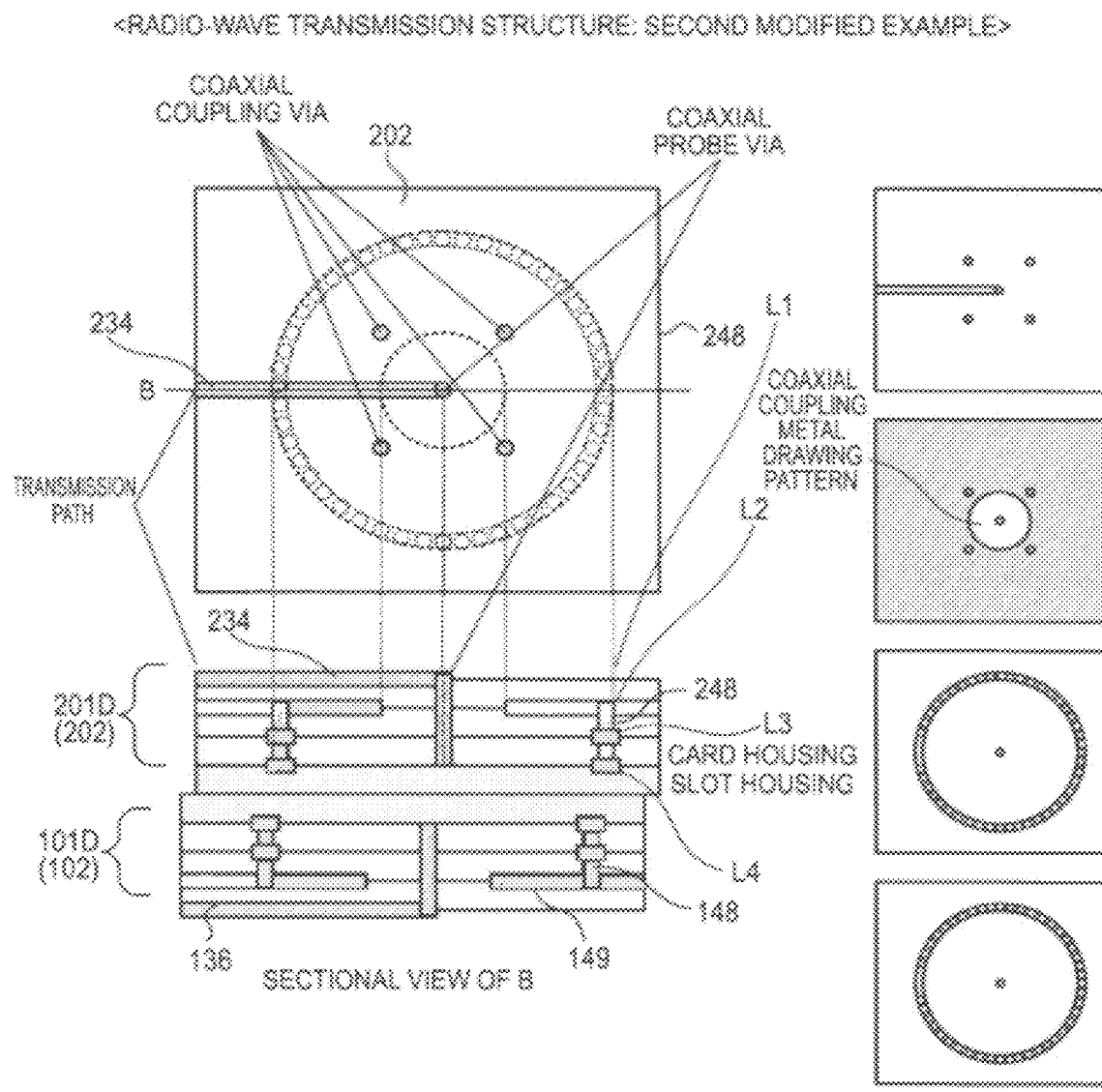
FIG. 15 is a diagram illustrating a second modified example of the radio-wave transmission structure.

Moreover, radio waves may be transmitted in the TM mode within the waveguide without being limited to the TE mode. FIG. 15 is a diagram (a modified example of FIG. 10) illustrating a second modified example of a radio-wave transmission structure when radio waves are transmitted in the TM mode within a waveguide. That is, radio waves are coupled from the micro-strip line MSL to the waveguide in the TM mode. The printed circuit substrate is formed based on the description on page 10 and FIG. 5-23 of "Chapter 5: Transmission line applications, [online], [searched on Dec. 24, 2010], on the Internet <URL: http://www.asahi-net.or.jp/~bz9s-wtb/doc/denjiha/tiw1c5tmp.pdf>. A coaxial probe is formed using penetration holes (via: L1 to L4) so as to extend from an end of the micro-strip line MSL, and a coaxial structure is formed with coaxial coupling vias (L1 to L2) and a coaxial metal drawing pattern (L2). Moreover, a waveguide is formed in the vias of the penetration holes L3 and L4. The coaxial probe generates magnetic field along the circumference of the waveguide in the penetration holes L3 and L4, and electromagnetic field is coupled in the TM mode (TM11) in relation to the waveguide.

The present disclosure contains subject matter related to that disclosed in Japanese Priority Patent Application JP 2011-005632 filed in the Japan Patent Office on Jan. 14, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A signal transmission device comprising:
a transmitting device that transmits a transmission subject signal as a wireless signal;
a first waveguide through which the transmission subject signal passes, the first waveguide being fixed to the transmitting device, and the transmission subject signal being outputted at a first edge of the first waveguide;
a receiving device that receives the wireless signal of the transmission subject signal transmitted from the transmitting device;
a second waveguide through which the transmission subject signal passes, the second waveguide being fixed to the receiving device, and the transmission subject signal being inputted at a second edge of the second waveguide; and
a third waveguide through which the transmission subject signal passes, the transmission subject signal being inputted at a third edge of the third waveguide and outputted at a fourth edge of the third waveguide, wherein
the transmission subject signal is transmitted between the transmitting device and the receiving device in a state where the first edge of the first waveguide faces the third edge of the third waveguide, and the fourth edge of the third waveguide faces the second edge of the second waveguide,
the third edge of the third waveguide does not extend beyond the first edge of the first waveguide in a first direction so that the first waveguide and the third waveguide do not overlap with each other in a second direction perpendicular to the first direction, and
the fourth edge of the third waveguide does not extend beyond the second edge of the second waveguide in the first direction so that the second waveguide and the third waveguide do not overlap with each other in the second direction.

2. The signal transmission device according to claim 1, wherein one of the first and second waveguides includes an antenna which is disposed on a side thereof opposite to a side associated with the other waveguide, and which is electromagnetically coupled with a high-frequency signal transmission path through which high-frequency signals are transmitted, and
wherein at least the antenna is integrated with the one waveguide.

3. The signal transmission device according to claim 2, wherein the antenna and the one waveguide are formed in the same circuit substrate.

4. The signal transmission device according to claim 3, wherein a conductor that forms the one waveguide is fixed to a surface of the circuit substrate close to the other waveguide of the first and second waveguides.

5. The signal transmission device according to claim 3, wherein the one waveguide is formed in the circuit substrate so as to extend in the thickness direction thereof.

6. The signal transmission device according to claim 2, wherein the high-frequency signal transmission path, the antenna, and the one waveguide are integrated with each other.

7. The signal transmission device according to claim 6, wherein the high-frequency signal transmission path, the antenna, and the one waveguide are formed in the same circuit substrate.

8. The signal transmission device according to claim 1, further comprising an alignment structure that performs alignment of the first waveguide, the second waveguide, and the third waveguide such that the first edge of the first waveguide faces the third edge of the third waveguide, and the fourth edge of the third waveguide faces the second edge of the second waveguide.

9. The signal transmission device according to claim 8, wherein the alignment structure has a structure that causes radio waves to be transmitted while confining the radio waves in a transmission path.

10. The signal transmission device according to claim 9, wherein a dielectric material having a property capable of transmitting the radio waves is filled in the alignment structure.

11. The signal transmission device according to claim 8, wherein the alignment structure has a structure that defines an attachment state between the first waveguide, the second waveguide, and the third waveguide.

12. The signal transmission device according to claim 1, wherein a dielectric material having a property capable of transmitting radio waves is filled in at least one of the first waveguide, the second waveguide, and the third waveguide.

13. The signal transmission device according to claim 1, wherein the first direction is a direction connecting the transmitting device and the receiving device.

14. A signal transmission method in which signal transmission of a transmission subject signal as a wireless signal is performed between a transmitting device and a receiving device, the method comprising:
providing a first waveguide in the first electronic device, the transmission subject signal passing through the first waveguide, the first waveguide being fixed to the transmitting device, and the transmission subject signal being outputted at a first edge of the first waveguide;
providing a second waveguide in the second electronic device, the transmission subject signal passing through the second waveguide, the second waveguide being fixed to the receiving device, and the transmission subject signal being inputted at a second edge of the second waveguide;
providing a third waveguide, the transmission subject signal passing through the third waveguide, the transmission subject signal being inputted at a third edge of the third waveguide and outputted at a fourth edge of the third waveguide, and
transmitting the transmission subject signal between the first and second electronic devices in a state where the first edge of the first waveguide faces the third edge of the third waveguide, and the fourth edge of the third waveguide faces the second edge of the second waveguide, wherein
the third edge of the third waveguide does not extend beyond the first edge of the first waveguide in a first direction so that the first waveguide and the third waveguide do not overlap with each other in a second direction perpendicular to the first direction, and the fourth edge of the third waveguide does not extend beyond the second edge of the second waveguide in the first direction so that the second waveguide and the third waveguide do not overlap with each other in the second direction.

* * * * *